(12) United States Patent
Lee et al.

(10) Patent No.: US 12,451,422 B2
(45) Date of Patent: Oct. 21, 2025

(54) SEMICONDUCTOR DEVICE

(71) Applicant: Samsung Electronics Co., Ltd., Suwon-si (KR)

(72) Inventors: Eui Bok Lee, Suwon-si (KR); Rak Hwan Kim, Suwon-si (KR); Jong Min Baek, Suwon-si (KR); Moon Kyun Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 375 days.

(21) Appl. No.: 18/217,012

(22) Filed: Jun. 30, 2023

(65) Prior Publication Data

US 2024/0120274 A1     Apr. 11, 2024

(30) Foreign Application Priority Data

Oct. 11, 2022   (KR) .................. 10-2022-0129846
Jan. 6, 2023    (KR) .................. 10-2023-0002140

(51) Int. Cl.
| | |
|---|---|
| *H01L 23/522* | (2006.01) |
| *H01L 23/528* | (2006.01) |
| *H10D 84/01* | (2025.01) |
| *H10D 84/03* | (2025.01) |
| *H10D 84/83* | (2025.01) |

(52) U.S. Cl.
CPC ...... *H01L 23/5226* (2013.01); *H01L 23/5283* (2013.01); *H10D 84/0149* (2025.01); *H10D 84/038* (2025.01); *H10D 84/83* (2025.01)

(58) Field of Classification Search
CPC ............ H01L 23/5226; H01L 23/5283; H10D 84/038; H10D 84/83; H10D 84/0149
USPC ....................................................... 257/401
See application file for complete search history.

(56) References Cited

U.S. PATENT DOCUMENTS

| | | | |
|---|---|---|---|
| 10,586,765 B2 | 3/2020 | Smith et al. | |
| 10,770,479 B2 | 9/2020 | Smith et al. | |
| 10,872,859 B2 | 12/2020 | Kim et al. | |
| 11,094,594 B2 | 8/2021 | Tsao | |
| 11,322,401 B2 | 5/2022 | Smith et al. | |
| 11,393,910 B2 * | 7/2022 | Hung .................. | H10D 30/024 |
| 2021/0358902 A1 | 11/2021 | Kang et al. | |
| 2021/0375861 A1 | 12/2021 | Chung et al. | |
| 2022/0020666 A1 | 1/2022 | Dal et al. | |

(Continued)

*Primary Examiner* — Tu-Tu V Ho
(74) *Attorney, Agent, or Firm* — Muir Patent Law, PLLC

(57) ABSTRACT

A semiconductor device a first fin-shaped pattern provided at a first surface of a substrate and extending in a second direction, a first source/drain pattern disposed on the first fin-shaped pattern and connected thereto, a first source/drain contact disposed on the first source/drain pattern and connected thereto, a buried conductive pattern extending through the substrate and connected to the first source/drain contact, a contact connection via disposed between the first source/drain contact and the buried conductive pattern. The contact connection via is directly connected to the first source/drain contact and a back wiring line disposed on a second surface of the substrate and connected to the buried conductive pattern. A width of the contact connection via increases as the contact connection via extends away from the second surface. A width of the first source/drain contact decreases as the first source/drain contact extends away from the second surface of the substrate.

20 Claims, 40 Drawing Sheets

(56) References Cited

U.S. PATENT DOCUMENTS

2022/0059571 A1    2/2022    Baek et al.
2022/0157722 A1    5/2022    Bouche et al.

\* cited by examiner

SEMICONDUCTOR DEVICE

CROSS-REFERENCE TO RELATED APPLICATION

This application claims priority from Korean Patent Application No. 10-2022-0129846 filed on Oct. 11, 2022 and No. 10-2023-0002140 filed on Jan. 6, 2023 in the Korean Intellectual Property Office, and all the benefits accruing therefrom under 35 U.S.C. 119, the contents of each of which in its entirety are herein incorporated by reference.

BACKGROUND

Technical Field

The present disclosure relates to a semiconductor device.

Description of Related Art

As one of scaling technologies for increasing density of semiconductor devices, a multi gate transistor in which a multi-channel active pattern (or a silicon body) having a fin or nanowire shape is formed on a substrate and a gate is formed on a surface of the multi-channel active pattern has been proposed.

Since such a multi gate transistor utilizes a three-dimensional channel, scaling is easily performed. In addition, the current control capability may be improved without increasing a gate length of the multi gate transistor. Furthermore, a SCE (short channel effect) in which potential of a channel region is influenced by a drain voltage may be effectively suppressed.

SUMMARY

Aspects of the present disclosure provide a semiconductor device capable of improving element performance and reliability.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor device comprising a substrate including a first surface and a second surface opposite to each other in a vertical direction that is perpendicular to the first surface, a first fin-shaped pattern provided at the first surface of the substrate and extending in a first horizontal direction that is parallel to the first surface, a first source/drain pattern disposed on the first fin-shaped pattern and connected to the first fin-shaped pattern, a first source/drain contact disposed on the first source/drain pattern and connected to the first source/drain pattern, a buried conductive pattern extending through the substrate and connected to the first source/drain contact, a contact connection via disposed between the first source/drain contact and the buried conductive pattern, wherein the contact connection via is directly connected to the first source/drain contact and a back wiring line disposed on the second surface of the substrate and connected to the buried conductive pattern, wherein a width in a second horizontal direction of the contact connection via increases as the contact connection via extends away from the second surface of the substrate, wherein the second horizontal direction is parallel to the first surface and different from the first horizontal direction, wherein a width in the second horizontal direction of the first source/drain contact decreases as the first source/drain contact extends away from the second surface of the substrate.

According to an aspect of the present disclosure, there is provided a semiconductor device comprising a substrate including a first surface and a second surface opposite to each other in a vertical direction that is perpendicular to the first surface, a first fin-shaped pattern provided at the first surface of the substrate and extending in a first horizontal direction that is parallel to the first surface, a second fin-shaped pattern provided at the first surface of the substrate and adjacent to the first fin-shaped pattern in a second horizontal direction that is parallel to the first surface and different from the first horizontal direction, a first source/drain pattern disposed on the first fin-shaped pattern and connected to the first fin-shaped pattern, a second source/drain pattern disposed on the second fin-shaped pattern and connected to the second fin-shaped pattern, a first source/drain contact disposed on the first source/drain pattern and connected to the first source/drain pattern, a second source/drain contact disposed on the second source/drain pattern and connected to the second source/drain pattern, wherein the first source/drain contact and the second source/drain contact are spaced apart from each other in the second horizontal direction, a buried conductive pattern extending through the substrate and connected to the first source/drain contact, a contact connection via disposed between the first source/drain contact and the buried conductive pattern and directly connected to the first source/drain contact, and a back wiring line disposed on the second surface of the substrate and connected to the buried conductive pattern, wherein each of the first source/drain contact and the second source/drain contact includes a first sidewall and a second sidewall opposite to each other in the second horizontal direction, wherein the first sidewall of the second source/drain contact faces the first sidewall of the first source/drain contact, and wherein a distance between the first sidewall of the first source/drain contact and the first sidewall of the second source/drain contact increases as each of the first source/drain contact and the second source/drain contact extends away from the second surface of the substrate.

According to an aspect of the present disclosure, there is provided a semiconductor device comprising a substrate including a first surface and a second surface opposite to each other in a vertical direction that is perpendicular to the first surface, a fin-shaped pattern provided at the first surface of the substrate and extending in a first horizontal direction that is parallel to the first surface, a plurality of sheet active patterns disposed on the fin-shaped pattern, a gate structure disposed on the fin-shaped pattern, and extending in a second horizontal direction that is parallel to the first surface and different from the first horizontal direction, wherein the gate structure includes a gate electrode and a gate capping pattern, wherein the gate electrode surrounds each of the sheet active patterns, a source/drain pattern disposed on the fin-shaped pattern, and connected to the fin-shaped pattern and the sheet patterns, a source/drain contact disposed on the source/drain pattern and connected to the source/drain pattern, a front wiring line disposed on the first surface of the substrate, a gate contact disposed on the gate electrode and connecting the front wiring line and the gate electrode with each other, a buried conductive pattern extending through the substrate and connected to the source/drain contact, a contact connection via disposed between the source/drain contact and the buried conductive pattern and directly connected to the source/drain contact, and a back wiring line disposed on the second surface of the substrate and connected to the buried conductive pattern, wherein a width in the second horizontal direction of the contact connection via increases as the contact connection via extends away from the second surface of the substrate, wherein a width in the second horizontal direction of the source/drain contact decreases as the source/drain contact extends away from the second surface of the substrate, wherein a height from the second surface of the substrate to an upper surface of the gate contact is larger than a height from the second surface of the substrate to an upper surface of the gate capping pattern.

BRIEF DESCRIPTION OF DRAWINGS

The above and other aspects and features of the present disclosure will become more apparent by describing in detail illustrative embodiments thereof with reference to the attached drawings, in which.

DETAILED DESCRIPTION OF THE EMBODIMENTS

In the present specification, although terms such as first and second are used to describe various elements or components, it goes without saying that these elements or components are not limited by these terms. These terms are only used to distinguish a single element or component from other elements or components. Therefore, it goes without saying that a first element or component referred to below may be a second element or component within the technical idea of the present disclosure.

As shown, a semiconductor device according to some embodiments of the present disclosure includes, but is not limited to, a fin-type transistor (FinFET) including a channel region of a fin-type pattern shape, and a transistor including a nano-wire or a nano-sheet by way of example.

A semiconductor device according to some embodiments may include a tunneling transistor (tunneling FET), a three-dimensional (3D) transistor, or a vertical transistor (Vertical FET). In another example, a semiconductor device according to some embodiments may include a planar transistor. In addition, the technical concept of the present disclosure may be applied to a transistor (a 2D material-based FET) based on a two-dimensional material, and a heterostructure thereof. Further, a semiconductor device according to some embodiments may include a bipolar junction transistor, a lateral double diffusion transistor (LDMOS), or the like.

Referring to FIG. 1 to FIG. 5, a semiconductor device according to some embodiments is described.

Figure 1:
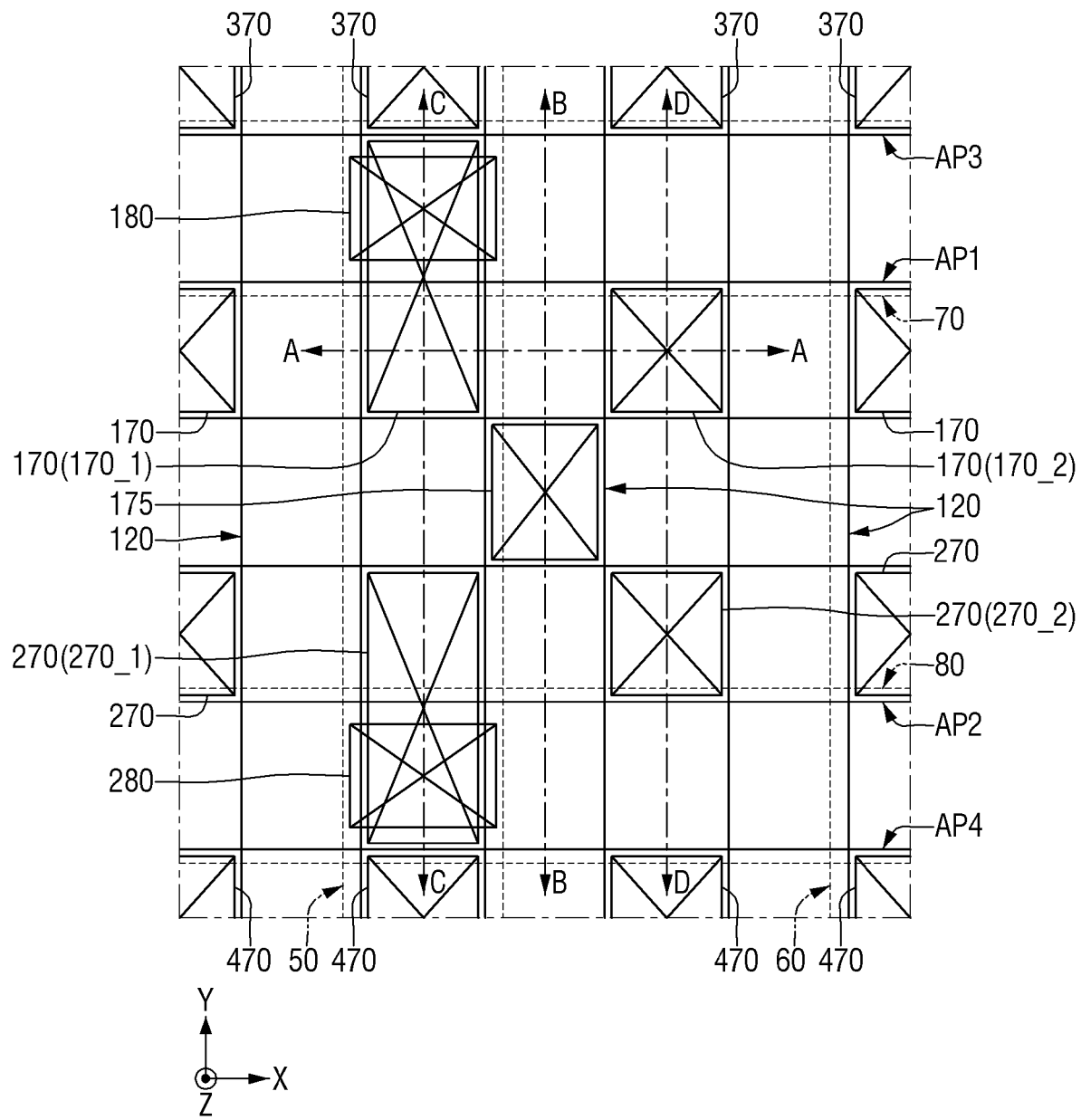
FIG. 1 is a layout diagram for illustrating a semiconductor device according to some embodiments.

FIG. 1 is a layout diagram for illustrating a semiconductor device according to some embodiments. FIG. 2 to FIG. 5 are respectively cross-sectional views cut along lines A-A, B-B, C-C and D-D in FIG. 1.

For convenience of illustration, FIG. 1 does not show a front wiring line 198 and a front wiring via 196. Although not shown, a cross-sectional view cut in a first direction X along second to fourth active patterns AP2, AP3, and AP4 may be similar to FIG. 2.

Referring to FIG. 1 to FIG. 5, the semiconductor device according to some embodiments may include a first substrate 100, a first active pattern AP1, a second active pattern AP2, a third active pattern AP3, a fourth active pattern AP4, a first back wiring line 50, a second back wiring line 60, a first buried conductive pattern 70, a second buried conductive pattern 80, a plurality of gate electrodes 120, a first source/drain pattern 150, a second source/drain pattern 250, a third source/drain pattern 350, a fourth source/drain pattern 450, a first source/drain contact 170, a second source/drain contact 270, a third source/drain contact 370, a fourth source/drain contact 470, a first contact connection via 180, a second contact connection via 280, and a source/drain etch stop film 185.

The substrate 100 may include a first surface 100US and a second surface 100BS opposite to each other in a third direction Z. Since the gate electrode 120 and the source/drain patterns 150, 250, 350, and 450 may be disposed on the first surface 100US of the substrate, the first surface 100US of the substrate may be an upper surface of the substrate 100. The second surface 100BS of the substrate as opposed to the first surface 100US of the substrate may be a bottom surface of the substrate 100.

The substrate 100 may be made of a semiconductor material or may include a semiconductor material. The substrate 100 may be a silicon substrate or an SOI (silicon-on-insulator) substrate. Alternatively, the substrate 100 may include or may be formed of, for example, silicon germanium, SGOI (silicon germanium on insulator), indium antimonide, a lead telluride compound, indium arsenic, indium phosphide, gallium arsenide, or gallium antimonide. However, the present disclosure is not limited thereto.

Each of the active patterns AP1, AP2, AP3, and AP4 may be disposed on the substrate 100. For example, each of the active patterns AP1, AP2, AP3, AP4 may be disposed on the first surface 100US of the substrate. Each of the active patterns AP1, AP2, AP3, and AP4 may extend in an elongated manner in the first direction X or may extend lengthwise in the first direction X.

The first active pattern AP1 may be spaced apart from the second active pattern AP2 and the third active pattern AP3 in a second direction Y. The second active pattern AP2 may be spaced apart from the fourth active pattern AP4 in the second direction Y. For example, the first active pattern AP1 and the second active pattern AP2 may be adjacent to each other in the second direction Y.

In one example, one of the first active pattern AP1 and the second active pattern AP2 may be an area where a p-type transistor may be formed, and the other thereof may be an area where an n-type transistor may be formed. In this case, the first active pattern AP1 and the third active pattern AP3 may be areas in which transistors of the same conductivity type are formed. The second active pattern AP2 and the fourth active pattern AP4 may be areas in which transistors of the same conductivity type are formed.

In another example, the first active pattern AP1 and the second active pattern AP2 may be areas in which p-type transistors are formed. In this case, the third active pattern AP3 and the fourth active pattern AP4 may be areas in which n-type transistors are formed.

In still another example, the first active pattern AP1 and the second active pattern AP2 may be areas in which n-type transistors are formed. The third active pattern AP3 and the fourth active pattern AP4 may be areas in which p-type transistors are formed.

Each of the active patterns AP1, AP2, AP3, and AP4 may be a multi-channel active pattern. For example, the first active pattern AP1 may include a first lower pattern BP1 and a plurality of first sheet patterns NS1 (i.e., a plurality of first sheet active patterns). The second active pattern AP2 may include a second lower pattern BP2 and a plurality of second sheet patterns NS2 (i.e., a plurality of second sheet active patterns). The third active pattern AP3 may include a third lower pattern BP3 and a plurality of third sheet patterns NS3 (i.e., a plurality of third sheet active patterns). The fourth active pattern AP4 may include a fourth lower pattern BP4 and a plurality of fourth sheet patterns NS4 (i.e., a plurality of fourth sheet active patterns). In a semiconductor device according to some embodiments, each of the active patterns AP1, AP2, AP3, and AP4 may be an active pattern including a nanosheet or nanowire.

Each of the lower patterns BP1, BP2, BP3, and BP4 may protrude from the substrate 100. For example, each of the lower patterns BP1, BP2, BP3, and BP4 may protrude from the first surface 100US of the substrate. Each of the lower patterns BP1, BP2, BP3, and BP4 may be a fin-shaped pattern.

Each of the lower patterns BP1, BP2, BP3, and BP4 may extend in an elongated manner in the first direction X or may extend lengthwise in the first direction X. The first lower pattern BP1 may be spaced apart from the second lower pattern BP2 and the third lower pattern BP3 in the second direction Y. The second lower pattern BP2 may be spaced apart from the fourth lower pattern BP4 in the second direction Y.

The lower patterns BP1, BP2, BP3, and BP4 may be isolated from each other via a fin trench FT extending in the first direction X. For example, the first surface 100US of the substrate may be a bottom surface of the fin trench FT. Each of the lower patterns BP1, BP2, BP3, and BP4 includes a sidewall extending in the first direction X. The sidewall of each of the lower patterns BP1, BP2, BP3, and BP4 may be defined by the fin trench FT.

The plurality of first sheet patterns NS1 may be disposed on the first lower pattern BP1. The plurality of first sheet patterns NS1 may be spaced apart from an upper surface BP1_US of the first lower pattern BP1 in the third direction Z. The plurality of first sheet patterns NS1 may be disposed on the first surface 100US of the substrate.

The plurality of second sheet patterns NS2 may be disposed on the second lower pattern BP2. The plurality of second sheet patterns NS2 may be spaced apart from the second lower pattern BP2 in the third direction Z. The plurality of third sheet patterns NS3 may be disposed on the third lower pattern BP3. The plurality of third sheet patterns NS3 may be spaced apart from the third lower pattern BP3 in the third direction Z. The plurality of fourth sheet patterns NS4 may be disposed on the fourth lower pattern BP4. The plurality of fourth sheet patterns NS4 may be spaced apart from the fourth lower pattern BP4 in the third direction Z. The second to fourth sheet patterns NS2, NS3, NS4 may be disposed on the first surface 100US of the substrate 100.

In this regard, the first direction X (i.e., the first horizontal direction) may intersect the second direction Y (i.e., the second horizontal direction) and the third direction Z (i.e., the vertical direction). Further, the second direction Y may intersect with the third direction Z. The third direction Z may be a thickness direction of the first substrate 100. The first and second directions X and Y may be parallel to the first surface 100US of the substrate. The third direction Z may be perpendicular to the first surface 100US of the substrate.

Each of the sheet patterns NS1, NS2, NS3, and NS4 may include an upper surface and a bottom surface opposite to each other in the third direction Z. The bottom surface of each of the sheet patterns NS1, NS2, NS3, and NS4 may face the substrate 100. Although three sheet patterns NS1, NS2, NS3, and NS4 are illustrated as being disposed in the third direction Z, the examples are only for convenience of explanation and are not limited thereto.

The first sheet patterns NS1 may include the uppermost sheet pattern farthest from the substrate 100. For example, the upper surface of the active patterns AP1, AP2, AP3, and AP4 may be the upper surface of the uppermost sheet pattern among the sheet patterns NS1, NS2, NS3, and NS4.

Each of the lower patterns BP1, BP2, BP3, and BP4 may be formed by etching a portion of the substrate 100. In an embodiment, each of the lower patterns BP1, BP2, BP3, and BP4 may include or may be an epitaxial layer grown from the substrate 100. Each of the lower patterns BP1, BP2, BP3, and BP4 may include or may be formed of silicon or germanium as an elemental semiconductor material. Also, each of the lower patterns BP1, BP2, BP3, and BP4 may include or may be formed of a compound semiconductor, for example, a group IV-IV compound semiconductor or a group III-V compound semiconductor.

The group IV-IV compound semiconductor may be, for example, a binary compound or a ternary compound including at least two or more of carbon (C), silicon (Si), germanium (Ge), and tin (Sn), and a compound obtained by doping these elements with a group IV element.

The group III-V compound semiconductor may be, for example, one of a binary compound, a ternary compound or a quaternary compound formed by combining at least one of aluminum (Al), gallium (Ga) and indium (In) as a group III element with one of phosphorus (P), arsenic (As) and antimony (Sb) as a group V element.

Each of the sheet patterns NS1, NS2, NS3, and NS4 may include or may be formed of one of the elemental semiconductor materials such as silicon and germanium, the group IV-IV compound semiconductor or the group III-V compound semiconductor. In an embodiment, a width in the second direction Y of the first sheet pattern NS1 may increase or decrease in proportion to a width in the second direction Y of the first lower pattern BP1. Although it is illustrated that the widths in the second direction Y of the first sheet patterns NS1 disposed on the first lower pattern BP1 are equal to each other, the present disclosure is not limited thereto.

A field insulating film 105 may be disposed on the substrate 100. For example, the field insulating film 105 may be disposed on the first surface 100US of the substrate. The field insulating film 105 may fill at least a portion of the fin trench FT isolating the lower patterns BP1, BP2, BP3, and BP4.

The field insulating film 105 may be disposed on the substrate 100 and between the lower patterns BP1, BP2, BP3, and BP4. In one example, the field insulating film 105 may cover an entirety of a sidewall of the lower patterns BP1, BP2, BP3, and BP4. Unlike the shown example, in another example, the field insulating film 105 may cover a portion of the sidewall of the lower patterns BP1, BP2, BP3, and BP4. In this case, a portion of the lower patterns BP1, BP2, BP3, and BP4 may protrude from the upper surface of the field insulation layer 105 in the third direction Z.

The field insulating film 105 does not cover the upper surface BP1_US of the first lower pattern. The field insulating film 105 does not cover an upper surface of the second to fourth lower pattern BP2, BP3, and BP4. Based on the first surface 100US of the substrate, each of the sheet patterns NS1, NS2, NS3, and NS4 is disposed higher than the upper surface of the field insulating film 105.

The field insulating film 105 may include or may be formed of, for example, an oxide film, a nitride film, an oxynitride film, or a combination film thereof. Although the field insulating film 105 is shown as a single film, the example is only for convenience of explanation and is not limited thereto.

A plurality of gate structures GS may be disposed on the first surface 100US of the substrate. Each gate structure GS may extend in the second direction Y. The gate structures GS may be spaced apart from each other in the first direction X. The gate structures GS may be adjacent to each other in the first direction X.

The gate structures GS may be disposed on each of the active patterns AP1, AP2, AP3, and AP4. For example, the gate structures GS may intersect the first active pattern AP1 and the second active pattern AP2.

The gate structure GS may intersect with the first lower pattern BP1 and the second lower pattern BP2. The gate structure GS may surround each of the first sheet patterns NS1. The gate structure GS may surround each of the second sheet patterns NS2.

The gate structure GS may intersect with the third lower pattern BP3 and the fourth lower pattern BP4. The gate structure GS may surround each of the third sheet patterns NS3. The gate structure GS may surround each of the fourth sheet patterns NS4. The gate structure GS is illustrated as extending across the first to fourth active patterns AP1, AP2, AP3, and AP4. However, the present disclosure is not limited thereto.

The gate structure GS may include, for example, a gate electrode 120, a gate insulating film 130, a gate spacer 140, and a gate capping pattern 145.

The gate structure GS may include a plurality of inner gate structures I_GS disposed between the first sheet patterns NS1 adjacent in the third direction Z and between the first lower pattern BP1 and the first sheet pattern NS1. For example, a lowermost inner gate structure of the inner gate structures I_GS may be disposed in a space between the first lower pattern BP1 and the lowermost first sheet pattern of the first sheet patterns NS1 in the third direction Z, and other inner gate structures may be disposed in spaces between two adjacent first sheet patterns of the first sheet patterns in the third direction Z. The inner gate structures I_GS may be disposed between the upper surface BP1_US of the first lower pattern and the bottom surface of the first sheet pattern NS1, and between the upper surface of the first sheet pattern NS1 and the bottom surface of the first sheet pattern NS1 facing in the third direction Z.

The number of the inner gate structures I_GS may be equal to the number of the first sheet patterns NS1. The inner gate structures I_GS contact the upper surface BP1_US of the first lower pattern, the upper surface of the first sheet pattern NS1, and the bottom surface of the first sheet pattern NS1. In a semiconductor device according to some embodiments, the inner gate structures I_GS may contact the first source/drain pattern 150 to be described later.

The inner gate structures I_GS may include the gate electrode 120 and the gate insulating film 130 disposed between adjacent first sheet patterns NS1 and between the first lower pattern BP1 and the first sheet pattern NS1. For example, the lowermost inner gate structure of the inner gate structures I_GS may be disposed in a space between the first lower pattern BP1 and the lowermost first sheet pattern of the first sheet patterns NS1 in the third direction Z, and other inner gate structures may be disposed in spaces between two adjacent first sheet patterns of the first sheet patterns NS1 in the third direction Z. Although not shown, the inner gate structures I_GS may be disposed between the second sheet patterns NS2 adjacent in the third direction Z and between the second lower pattern BP2 and the lowest second sheet pattern NS2. The inner gate structures I_GS may be disposed between the third sheet patterns NS3 adjacent in the third direction Z and between the third lower pattern BP3 and the lowest third sheet pattern NS3. The inner gate structures I_GS may be disposed between the fourth sheet patterns NS4 adjacent in the third direction Z and between the fourth lower pattern BP4 and the fourth sheet pattern NS4.

The following description will be based on the first active pattern AP1 and the gate structure GS, and the second active pattern AP2 and the gate structure GS.

The gate electrode 120 may be disposed on the first lower pattern BP1 and the second lower pattern BP2. The gate electrode 120 may intersect the first lower pattern BP1 and the second lower pattern BP2. The gate electrode 120 may surround the first sheet pattern NS1 and the second sheet pattern NS2.

Figure 2:
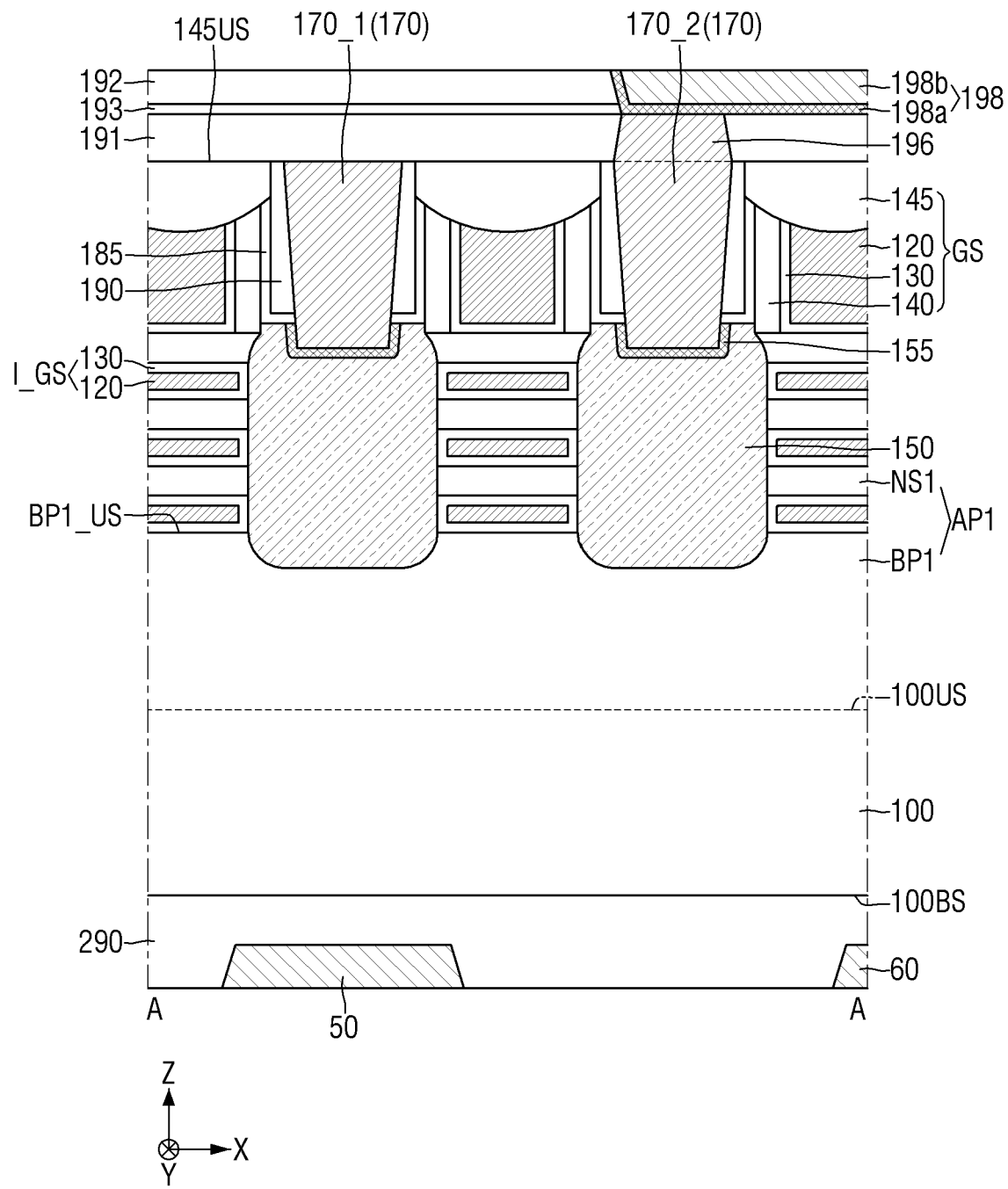
FIG. 2 to FIG. 5 are respectively cross-sectional views cut along lines A-A, B-B, C-C and D-D in FIG. 1.

In the cross-sectional view as shown in FIG. 2, an upper surface of the gate electrode 120 is illustrated to be a concavely curved surface. However, the present disclosure is not limited thereto. In an embodiment, the upper surface of the gate electrode 120 may be flat.

The gate electrode 120 may include or may be formed of but not limited to, for example, at least one of metal, metal alloy, conductive metal nitride, metal silicide, doped semiconductor material, conductive metal oxide, and conductive metal oxynitride. The gate electrode 120 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and a combination thereof. The conductive metal oxide and the conductive metal oxynitride may include or may be formed of, but not limited to, oxidized forms of the aforementioned materials.

The gate insulating film 130 may extend along the upper surface of the field insulating film 105, the upper surface BP1_US of the first lower pattern BP1, and the upper surface of the second lower pattern BP2. The gate insulating film 130 may surround the plurality of first sheet patterns NS1. The gate insulating film 130 may surround the plurality of second sheet patterns NS2. The gate insulating film 130 may be disposed around the first sheet patterns NS1 and the second sheet pattern NS2. The gate electrode 120 may be disposed on the gate insulating film 130.

The gate insulating film 130 may be disposed between the gate electrode 120 and the first sheet pattern NS1 and between the gate electrode 120 and second sheet pattern NS2. In a semiconductor device according to some embodiments, the gate insulating film 130 included in the inner gate structures I_GS may contact the first source/drain pattern 150 to be described later.

The gate insulating film 130 may include or may be formed of silicon oxide, silicon oxynitride, silicon nitride, or a high dielectric constant material having a higher dielectric constant than that of silicon oxide. The high dielectric constant (high-k dielectric) material may include, for example, at least one of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Although the gate insulating film 130 is shown as a single film, this is only for convenience of explanation and is not limited thereto. The gate insulating layer 130 may include a plurality of films. The gate insulating film 130 may include an interfacial film and a high dielectric constant insulating film disposed between the first active pattern AP1 and the gate electrode 120 and between the second active pattern AP2 and the gate electrode 120. For example, the interfacial film may not be formed along a profile of the upper surface 105US of the field insulating film.

The semiconductor device according to some embodiments may include an NC (negative capacitance) FET using a negative capacitor. For example, the gate insulating film 130 may include or may be formed of a ferroelectric material film having ferroelectric properties and a paraelectric material film having paraelectric properties.

The ferroelectric material film may have negative capacitance, and the paraelectric material film may have positive capacitance. For example, when two or more capacitors may be connected in series, and capacitance of each of the capacitors has a positive value, a total capacitance will be less than capacitance of each individual capacitor. On the contrary, when at least one of capacitances of two or more capacitors connected in series has a negative value, a total capacitance may have a positive value and be greater than an absolute value of each individual capacitance. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

When the ferroelectric material film with negative capacitance and the paraelectric material film with positive capacitance are connected in series, a total capacitance value of the ferroelectric material film and the paraelectric material film connected in series may be increased. Using the increase in the total capacitance value, a transistor including the ferroelectric material film may have a subthreshold swing (SS) lower than about 60 mV/decade at room temperature.

The ferroelectric material film may have ferroelectric properties. The ferroelectric material film may include or may be formed of, for example, at least one of hafnium oxide, hafnium zirconium oxide, barium strontium titanium oxide, barium titanium oxide, and lead zirconium titanium oxide. In this connection, in one example, hafnium zirconium oxide may refer to a material obtained by doping hafnium oxide with zirconium (Zr). In another example, hafnium zirconium oxide may be a compound of hafnium (Hf), zirconium (Zr), and oxygen (O).

The ferroelectric material film may further include doped dopants. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and tin (Sn). A type of the dopant included in the ferroelectric material film may vary depending on a type of the ferroelectric material included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and yttrium (Y).

When the dopant is aluminum (Al), the ferroelectric material film may include 3 to 8 at % (atomic %) of aluminum. Here, a ratio of the dopant may be a ratio of aluminum to the sum of hafnium and aluminum.

When the dopant is silicon (Si), the ferroelectric material film may include 2 to 10 at % of silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have the paraelectric properties. The paraelectric material film may include or may be formed of, for example, at least one of silicon oxide and a metal oxide having a high dielectric constant. The metal oxide included in the paraelectric material film may include, for example, but not limited to, at least one of hafnium oxide, zirconium oxide, and aluminum oxide.

The ferroelectric material film and the paraelectric material film may include or may be formed of the same material. The ferroelectric material film has ferroelectric properties, but the paraelectric material film may not have the ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness having the ferroelectric properties. The thickness of the ferroelectric material film may be, for example, but not limited to, 0.5 to 10 nm. Since a critical thickness that exhibits the ferroelectric properties may vary for each ferroelectric material, the thickness of the ferroelectric material film may vary depending on the ferroelectric material.

As an example, the gate insulating film 130 may include a single ferroelectric material film. As another example, the gate insulating film 130 may include a plurality of ferroelectric material films spaced apart from each other. The gate insulating film 130 may have a stacked film structure in which the plurality of ferroelectric material films and the plurality of paraelectric material films are alternately stacked on each other.

The gate spacer 140 may be disposed on a sidewall of the gate electrode 120. The gate spacer 140 may not be disposed between the first lower pattern BP1 and the lowest first sheet pattern NS1 and between the first sheet patterns NS1 adjacent to in the third direction D3.

The gate spacer 140 may include or may be formed of, for example, at least one of silicon nitride (SiN), silicon oxynitride (SiON), silicon oxide (SiO2), silicon oxycarbonitride (SiOCN), silicon boron nitride (SiBN), silicon oxyboron nitride (SiOBN), silicon oxycarbide (SiOC), and combinations thereof. Although the gate spacer 140 is shown to be a single film, this example is only for convenience of explanation and is not limited thereto.

The gate capping pattern 145 may be disposed on the gate electrode 120. An upper surface 145US of the gate capping pattern may be an upper surface of the gate structure GS. The gate capping pattern 145 may be disposed between the gate spacers 140, unlike the shown example.

The gate capping pattern 145 may include or may be formed of, for example, at least one of silicon nitride (SiN), silicon oxynitride (SiON), silicon carbonitride (SiCN), silicon oxycarbonitride (SiOCN), and a combination thereof.

The first source/drain pattern 150 may be disposed on the first active pattern AP1. The first source/drain pattern 150 may be disposed on the first lower pattern BP1. The first source/drain pattern 150 may be disposed between gate electrodes 120 adjacent to each other in the first direction X. The first source/drain pattern 150 may contact the first active pattern AP1. The first source/drain pattern 150 may contact the first sheet patterns NS1. The first source/drain pattern 150 may be connected to the first sheet patterns NS1 and the first lower pattern BP1 while being disposed on the first surface 100US of the substrate.

The second source/drain pattern 250 may be disposed on the second active pattern AP2. The second source/drain pattern 250 may be disposed on the second lower pattern BP2. The second source/drain pattern 250 may be disposed between gate electrodes 120 adjacent to each other in the first direction X. The second source/drain pattern 250 may contact the second active pattern AP2. Although not shown, the second source/drain pattern 250 may contact the second sheet patterns NS2. The second source/drain pattern 250 may be connected to the second sheet patterns NS2 and the second lower pattern BP2 while being disposed on the first surface 100US of the substrate.

The third source/drain pattern 350 may be disposed on the third active pattern AP3. The third source/drain pattern 350 may be disposed on the third lower pattern BP3. Although not shown, the third source/drain pattern 350 may contact the third sheet patterns NS3. The fourth source/drain pattern 450 may be disposed on the fourth active pattern AP4. The fourth source/drain pattern 450 may be disposed on the fourth lower pattern BP4. Although not shown, the fourth source/drain pattern 450 may contact the fourth sheet patterns NS4.

The source/drain patterns 150, 250, 350, and 450 may include a bottom surface facing the lower patterns BP1, BP2, BP3, and BP4, and a sidewall extending from the bottom surface of the source/drain patterns 150, 250, 350, and 450 in the third direction Z. The sidewall of the source/drain pattern 150, 250, 350, 450 may include, but is not limited to, a facet intersection at which inclined surfaces meet each other.

The first source/drain pattern 150 may be included in a source/drain of a transistor using the first sheet pattern NS1 as a channel area. The second source/drain pattern 250 may be included in a source/drain of a transistor using the second sheet pattern NS2 as a channel area. The third source/drain pattern 350 may be included in a source/drain of a transistor using the third sheet pattern NS3 as a channel area. The fourth source/drain pattern 450 may be included in a source/drain of a transistor using the fourth sheet pattern NS2 as a channel area.

Each of the source/drain patterns 150, 250, 350, and 450 may include or may be an epitaxial pattern. Each of the source/drain patterns 150, 250, 350, and 450 may include or may be formed of a semiconductor material.

Some of the source/drain patterns 150, 250, 350, and 450 may include or may be doped with a p-type dopant. The p-type dopant may include at least one of boron (B) and gallium (Ga). However, the present disclosure is not limited thereto. Each of the others of the source/drain patterns 150, 250, 350, and 450 may include or may be doped with an n-type dopant. The n-type dopant may include, but not limited to, at least one of phosphorus (P), arsenic (As), antimony (Sb), and bismuth (Bi).

The source/drain etch stop film 185 may extend along an outer sidewall of the gate spacer 140 and a sidewall of the source/drain patterns 150, 250, 350, and 450. The source/drain etch stop film 185 may extend along the upper surface of the field insulating film 105.

The source/drain etch stop film 185 may not extend along a sidewall of the gate capping pattern 145. Unlike the shown example, the source/drain etch stop film 185 may extend along the sidewall of the gate capping pattern 145.

The source/drain etch stop film 185 may include or may be formed of, for example, at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), and a combination thereof.

A first upper interlayer insulating film 190 may be disposed on the first surface 100US of the substrate. The first upper interlayer insulating film 190 may be disposed on the source/drain patterns 150, 250, 350, and 450.

The first upper interlayer insulating film 190 may not cover the upper surface of the gate capping pattern 145. In an embodiment, the first upper interlayer insulating film 190 and the gate capping pattern 145 may be arranged in the first direction X without overlapping each other in the third direction Z. The first upper interlayer insulating film 190 may contact the gate capping pattern 145. The first upper interlayer insulating film 190 may include or may be formed of, for example, at least one of silicon oxide, silicon nitride, silicon oxynitride, and a low dielectric constant (low-k dielectric) material. A dielectric constant of the low-k material may have a value smaller than 3.9 as the dielectric constant of silicon oxide.

The first source/drain contact 170 may extend in the third direction Z on the first surface 100US of the substrate. The first source/drain contact 170 may be disposed on the first source/drain pattern 150. The first source/drain contact 170 may be electrically connected to the first source/drain pattern 150.

Figure 4:
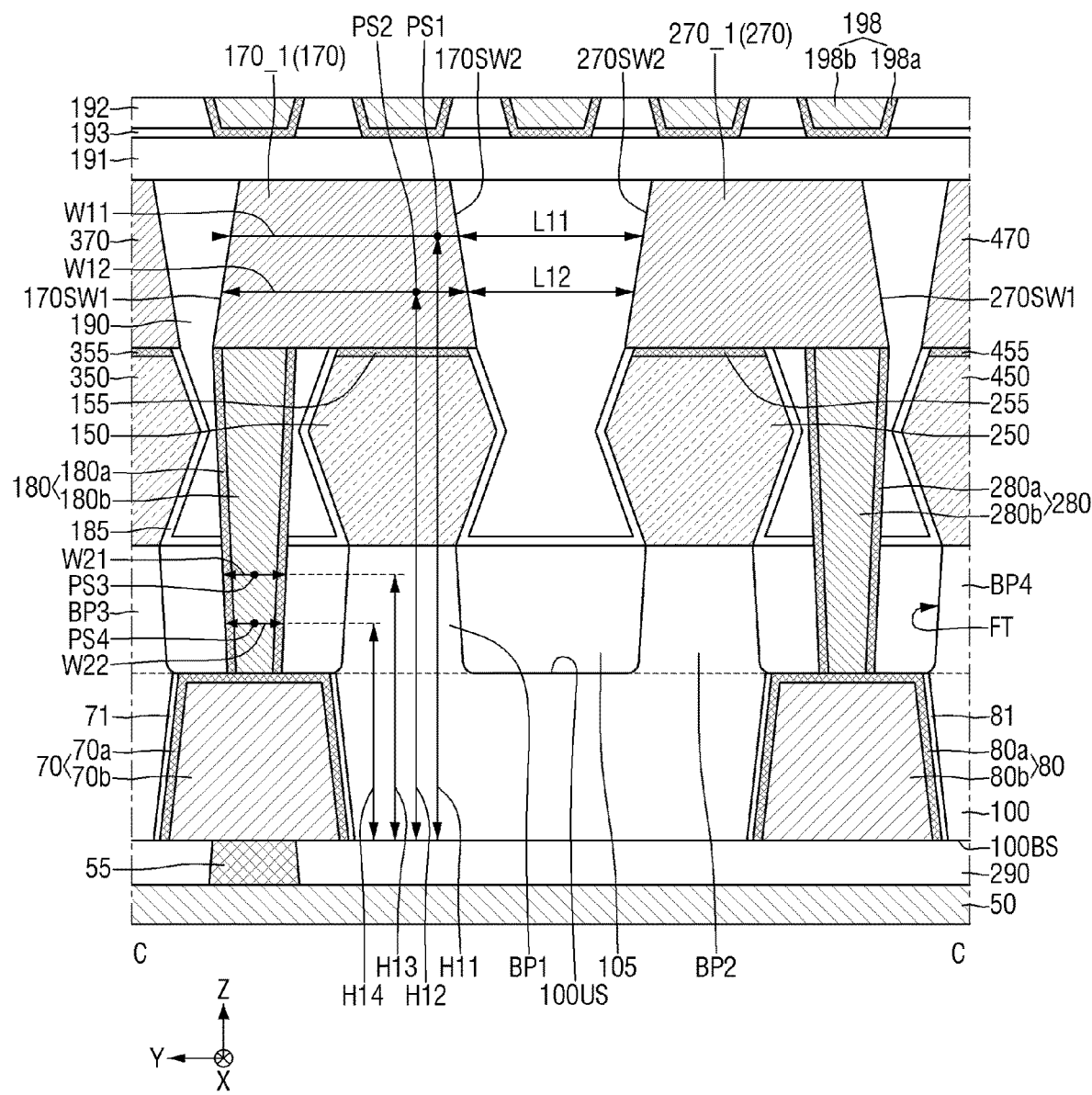
Figure 5:
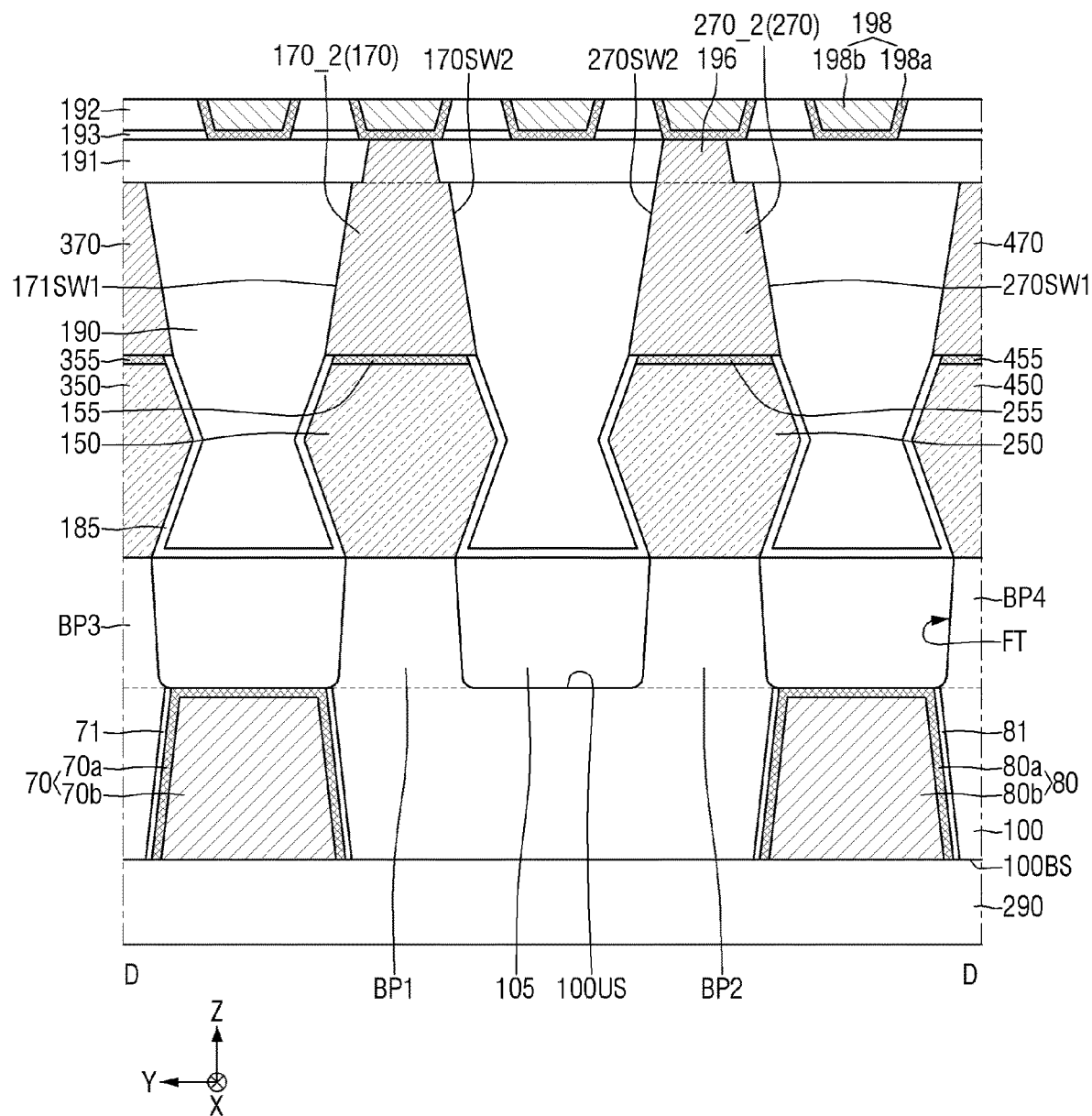

The first source/drain contact 170 may include a first back connection contact 170_1 and a first front connection contact 170_2. The first back connection contact 170_1 may be connected to the first buried conductive pattern 70 via the first contact connection via 180. The first front connection contact 170_2 does not contact the first contact connection via 180 and thus is not connected to the first contact connection via 180, as shown in FIGS. 4 and 5. In an embodiment, the first back connection contact 170_1 may overlap the first contact connection via 180 and the first source/drain pattern 150 in the third direction Z, and the first front connection contact 170_2 may overlap the first source/drain pattern 150, without overlapping the first contact connection via 180, in the third direction Z.

The second source/drain contact 270 may extend in the third direction Z on the first surface 100US of the substrate. The second source/drain contact 270 may be disposed on the second source/drain pattern 250. The second source/drain contact 270 may be electrically connected to the second source/drain pattern 250.

The second source/drain contact 270 may include a second back connection contact 270_1 and a second front connection contact 270_2. The second back connection contact 270_1 may be connected to the second buried conductive pattern 80 via the second contact connection via 280. The second front connection contact 270_2 does not contact the second contact connection via 280 and thus is not connected to the second contact connection via 280, as shown in FIGS. 4 and 5. In an embodiment, the second back connection contact 270_1 may overlap the second contact connection via 280 and the second source/drain pattern 250 in the third direction Z, and the second front connection contact 270_2 may overlap the second source/drain pattern 250, without overlapping the second contact connection via 280, in the third direction Z.

The third source/drain contact 370 may extend in the third direction Z on the first surface 100US of the substrate. The third source/drain contact 370 may be disposed on the third source/drain pattern 350. The third source/drain contact 370 may be electrically connected to the third source/drain pattern 350. A fourth source/drain contact 470 may extend in the third direction Z on the first surface 100US of the substrate. The fourth source/drain contact 470 may be disposed on the fourth source/drain pattern 450. The fourth source/drain contact 470 may be electrically connected to the fourth source/drain pattern 450. Although not shown, the third and fourth source/drain contacts 370 and 370 may include a back connection contact and a front connection contact.

For example, in FIG. 4, the first back connection contact 170_1 and the second back connection contact 270_1 may be arranged in the second direction Y. For example, the first back connection contact 170_1 may be adjacent to the second back connection contact 270_1 in the second direction Y. In FIG. 5, the first front connection contact 170_2 may be adjacent to the second front connection contact 270_2 in the second direction Y.

With respect to the upper surface of the field insulating layer 105, the height of the upper surface of the first source/drain contact 170 may be the same as that of the upper surface of the second source/drain contact 270. With respect to the upper surface of the field insulating layer 105, the height of the upper surface of the first source/drain contact 170 may be the same as that of the upper surface of the third source/drain contact 370 and the upper surface of the fourth source/drain contact 470.

Following description may be based on the first source/drain contact 170 and the second source/drain contact 270. The description of the first source/drain contact 170 and the second source/drain contact 270 may be applied to the third source/drain contact 370 and the fourth source/drain contact 470.

In FIG. 4 and FIG. 5, a width in the second direction Y of the first source/drain contact 170 may decrease as the first source/drain contact 170 extends away from the second surface 100BS of the substrate. The first source/drain contact 170 may include a first sidewall 170SW1 and a second sidewall 170SW2 opposite in the second direction Y. The first sidewall 170SW1 of the first source/drain contact and the second sidewall 170SW2 of the first source/drain contact may be an inclined surface.

The first source/drain contact 170 may include a first point PS1 and a second point PS2. A first height H11 from the second surface 100BS of the substrate to the first point PS1 may be greater than a second height H12 from the second surface 100BS of the substrate to the second point PS2. A width W11 in the second direction Y of the first source/drain contact 170 at the first point PS1 may be smaller than a width W12 in the second direction Y of the first source/drain contact 170 at the second point PS2.

In FIG. 4 and FIG. 5, a width in the second direction Y of the second source/drain contact 270 may decrease as the second source/drain contact 270 extends away from the second surface 100BS of the substrate. The second source/drain contact 270 may include a first sidewall 270SW1 and a second sidewall 270SW2 opposite in the second direction Y. The first sidewall 270SW1 of the second source/drain contact and the second sidewall 270SW2 of the second source/drain contact may have an inclined surface.

The second sidewall 270SW2 of the second source/drain contact may face the second sidewall 170SW2 of the first source/drain contact. As each of the first and second first source/drain contacts extends away from the second surface 100BS of the substrate, a distance between the second sidewall 170SW2 of the first source/drain contact and the second sidewall 270SW2 of the second source/drain contact may increase. A distance L11 in the second direction Y between the second sidewall 170SW2 of the first source/drain contact and the second sidewall 270SW2 of the second source/drain contact at a vertical level corresponding to the first height H11 may be greater than a distance L12 in the second direction Y between the second sidewall 170SW2 of the first source/drain contact and the second sidewall 270SW2 of the second source/drain contact at a vertical level corresponding to the second height H12.

In FIG. 2, a width in the first direction X of the first source/drain contact 170 may increase as the first source/drain contact 170 extends away from the second surface 100BS of the substrate. Although not shown, a width in the first direction X of each of the second to fourth source/drain contacts 270, 370, and 470 may increase as each of the second to fourth source/drain contacts 270, 370, and 470 extends away from the second surface 100BS of the substrate.

When the source/drain contacts 170, 270, 370, and 470 are formed using a subtractive scheme, the width in the second direction Y of the source/drain contacts 170, 270, 370, and 470 may decreases as the source/drain contacts 170, 270, 370, and 470 extends away from the substrate 100. When photo mask patterns for forming the source/drain contacts 170, 270, 370, and 470 are spaced apart from each other by a first spacing in the second direction Y, the source/drain contacts 170, 270, 370, and 470 that are adjacent to each other in the second direction Y may be spaced apart from each other by a second spacing smaller than the first spacing.

However, when the source/drain contacts 170, 270, 370, and 470 are formed using a damascene scheme, the width in the second direction Y of the source/drain contacts 170, 270, 370, and 470 may increases as the source/drain contacts 170, 270, 370, and 470 extends away from the substrate 100. To form the source/drain contacts 170, 270, 370, and 470 spaced apart from each other by the second spacing using the damascene scheme, the photo mask patterns for forming the source/drain contacts 170, 270, 370, and 470 should be spaced apart from each other by a third spacing. In this regard, the third spacing should be smaller than the first spacing and the second spacing.

Due to a limitation of a design rule of a photo process, the photo mask patterns spaced apart from each other by the third spacing may not be formed. Alternatively, adjacent photo mask patterns may be connected with each other by an optical proximity effect or the like. That is, the source/drain patterns that are adjacent to each other in the second direction Y may be connected with each other and thus a short circuit may be generated.

The source/drain contacts that are adjacent to each other in the second direction Y may be formed using the subtractive scheme. Thus, an integration density of the semiconductor device may be improved.

A first contact silicide film 155 may be disposed between the first source/drain contact 170 and the first source/drain pattern 150. A second contact silicide film 255 may be disposed between the second source/drain contact 270 and the second source/drain pattern 250. A third contact silicide film 355 may be disposed between the third source/drain contact 370 and the third source/drain pattern 350. A fourth contact silicide film 455 may be disposed between the fourth source/drain contact 470 and the fourth source/drain pattern 450.

A gate contact 175 may be disposed on the gate electrode 120. The gate contact 175 is connected to the gate electrode 120. The gate contact 175 may connect the front wiring line 198 and the gate electrode 175.

The gate contact 175 may penetrate the gate capping pattern 145. Based on the second surface 100BS of the substrate, a vertical level of an upper surface 175US of the gate contact may be higher than that of an upper surface 145US of the gate capping pattern. A height from the upper surface of the gate electrode 120 to the upper surface 175US of the gate contact may be greater than a height from the upper surface of the gate electrode 120 to the upper surface 145US of the gate capping pattern.

In a semiconductor device according to some embodiments, the gate contact 170 may include a lower portion 175B and an upper portion 175U. The lower portion 175B of the gate contact may be directly connected to the upper portion 175U of the gate electrode. For example, the lower portion 175B of the gate contact and the upper portion 175U of the gate electrode may be distinguished from each other, based on the upper surface 145US of the gate capping pattern. The lower portion 175B of the gate contact may be disposed in the gate capping pattern 145. The upper portion 175U of the gate contact may protrude in the third direction Z beyond the upper surface 145US of the gate capping pattern.

A width in the second direction Y of the lower portion 175B of the gate contact may increase as the lower portion 175B extends away from the gate electrode 120. A width in the second direction Y of the upper portion 175U of the gate contact may decrease as the upper portion 175U extends away from the gate electrode 120.

Figure 3:
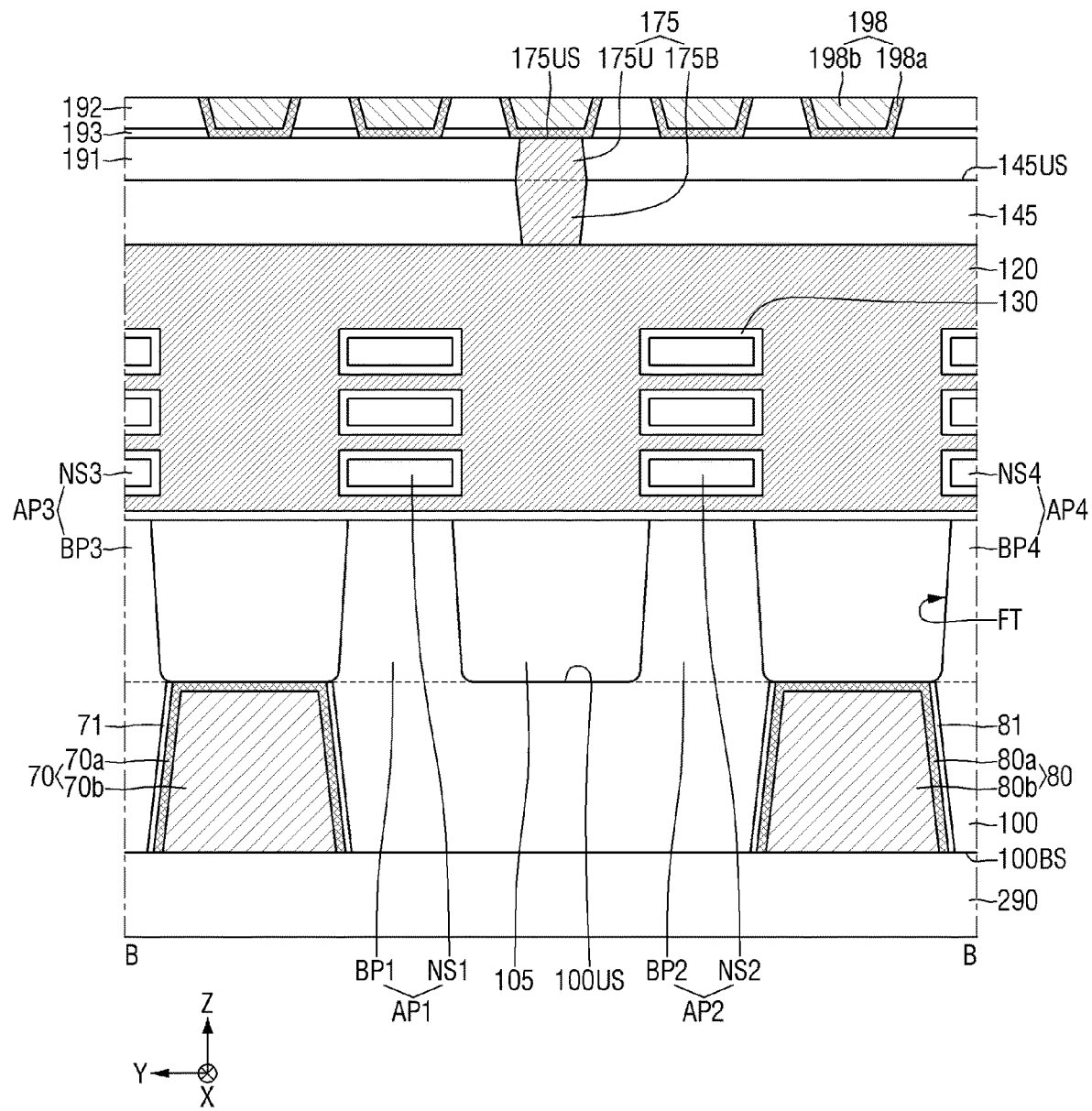

In FIG. 3, it is shown that the upper portion 175U of the gate contact does not cover the upper surface 145US of the gate capping pattern, but is not limited thereto. Unlike the shown example, the upper portion 175U of the gate contact may cover a portion of the upper surface 145US of the gate capping pattern. That is, at a boundary between the lower portion 175B of the gate contact and the upper portion 175U of the gate electrode, the width in the second direction Y of the upper portion 175U of the gate electrode may be greater than the width in the second direction Y of the lower portion 175B of the gate contact.

The front wiring via 196 may be disposed on the source/drain contacts 170, 270, 370, and 470. The front wiring via 196 may be directly connected to source/drain contacts 170, 270, 370, and 470.

The front wiring via 196 may be disposed between the source/drain contacts 170, 270, 370, and 470 and the front wiring line 198. The front wiring via 196 may connect the source/drain contacts 170, 270, 370, and 470 to the front wiring line 198.

The first front connection contact 170_2 and the second front connection contact 270_2 may be connected to the front wiring line 198 via the front wiring via 196. In a semiconductor device according to some embodiments, the first back connection contact 170_1 and the second back connection contact 2701 may not be connected to the front wiring line 198. The front wiring via 196 may not be disposed on the first back connection contact 170_1 and the second back connection contact 270_1.

For example, a width in the second direction Y of the front wiring via 196 may decrease as the front wiring via 196 extends away from the second surface 100BS of the substrate.

In FIG. 2, a height from the upper surface of the first active pattern AP1 to the upper surface of the first source/drain contact 170, may be same as a height from the upper surface of the first active pattern AP1 to the upper surface 145US of the gate capping pattern, but is not limited thereto. For example, the upper surface of the first source/drain contact 170 may be coplanar with the upper surface 145US of the gate capping pattern 145. The upper surface of the first source/drain contact 170 may be disposed at a boundary between the front wiring via 196 and the first source/drain contact 170. In addition, with reference to the second surface 100BS of the substrate, the height of the upper surface of the first source/drain contact 170 in FIG. 2 may correspond to the height of the upper surface of the first source/drain contact 170 in FIGS. 4 and 5. It may be the same as, but is not limited thereto. In FIG. 35 to FIG. 38, the front wiring via 196 may be formed by etching a portion of a first pre-source/drain contact 170P. The height of the upper surface of the first source/drain contact 170 in FIG. 2 may differ from the height of the upper surface of the first source/drain contact 170 in FIG. 4 and FIG. 5 depending on how much the first source/drain contact 170P has been etched. In a semiconductor device according to some embodiments, the source/drain contacts 170, 270, 370, and 470 and the front wiring via 196 may have a single film structure. For example, the source/drain contacts 170, 270, 370, and 470 and the front wiring via 196 may be made of one conductive material. The source/drain contacts 170, 270, 370, and 470 and the front wiring via 196 may have a single conductive film structure. In this regard, each of the source/drain contacts 170, 270, 370, and 470 and the front wiring via 196 may include impurities that are unintentionally introduced thereto in a process of forming the source/drain contacts 170, 270, 370, and 470 and the front wiring via 196. Further, the gate contact 175 may have a single film structure. For example, the lower portion 175B of the gate contact and the upper portion 175U of the gate contact may have a single film structure.

For example, the front wiring via 196 may include or may be formed of the same material as that of the source/drain contacts 170, 270, 370, and 470. The lower portion 175B of the gate contact may include or may be formed of the same material as the upper portion 175U of the gate contact. In the semiconductor device according to some embodiments, the front wiring via 196 and the source/drain contacts 170, 270, 370, and 470 may include or may be formed of the same material as that of the lower portion 175B of the gate contact and the upper portion 175U of the gate contact.

The source/drain contacts 170, 270, 370, and 470, the front wiring via 196, and the gate contact 175 may include or may be formed of, for example, at least one of a metal and a metal alloy. The source/drain contacts 170, 270, 370, and 470, the front wiring via 196, the gate contact 175 may include or may be formed of, for example, at least one of tungsten (W), molybdenum (Mo), ruthenium (Ru), and ruthenium-aluminum (RuAl), but the technical idea of the present disclosure is not limited thereto.

The contact silicide films 155, 255, 355, and 455 may include or may be formed of a metal silicide material.

The first buried conductive pattern 70 may be disposed between the first active pattern AP1 and the third active pattern AP3. The first buried conductive pattern 70 may overlap a portion of the field insulating film 105 disposed between the first lower pattern BP1 and the third lower pattern BP3 in the third direction Z.

The second buried conductive pattern 80 may be disposed between the second active pattern AP2 and the fourth active pattern AP4. The second buried conductive pattern 80 may overlap a portion of the field insulating film 105 disposed between the second lower pattern BP2 and the fourth lower pattern BP4 in the third direction Z.

Each of the first buried conductive pattern 70 and the second buried conductive pattern 80 may extend in the first direction X. In a plan view, at least a portion of the gate electrode 120 may intersect the first buried conductive pattern 70 and the second buried conductive pattern 80. In a semiconductor device according to some embodiments, each of the first buried conductive pattern 70 and the second buried conductive pattern 80 may be formed in a line shape.

The first buried conductive pattern 70 may be connected to the first back connection contact 170_1 via the first contact connection via 180. The first buried conductive pattern 70 may be connected to the first back wiring line 50.

The second buried conductive pattern 80 may be connected to the second back connection contact 270_1 via the second contact connection via 280. Although not shown, the second buried conductive pattern 80 may be connected to the second back wiring line 60.

The first buried conductive pattern 70 and the second buried conductive pattern 80 may extend through the substrate 100. The first buried conductive pattern 70 and the second buried conductive pattern 80 may extend from the second surface 100BS of the substrate to the first surface 100US of the substrate. In one example, The first buried conductive pattern 70 and the second buried conductive pattern 80 may not protrude in the third direction Z beyond the first surface 100US of the substrate. Unlike the shown example, in another example, a portion of the first buried conductive pattern 70 and a portion of the second buried conductive pattern 80 may protrude in the third direction Z beyond the first surface 100US of the substrate and may be disposed or buried in the field insulating film 105.

A first buried insulating liner 71 may extend along a sidewall of the first buried conductive pattern 70. The first buried insulating liner 71 may be disposed between the first buried conductive pattern 70 and the substrate 100. The second buried insulating liner 81 may extend along a sidewall of the second buried conductive pattern 80. The second buried insulating liner 81 may be disposed between the second buried conductive pattern 80 and the substrate 100. Unlike the shown example, the buried insulating liners 71 and 81 may not be formed between the buried conductive patterns 70 and 80 and the substrate 100.

The first buried conductive pattern 70 may include a first buried conductive barrier film 70a and a first buried conductive plug 70b. The second buried conductive pattern 80 may include a second buried conductive barrier film 80a and a second buried conductive plug 80b.

The first buried conductive barrier film 70a and the second buried conductive barrier film 80a may include or may be formed of, for example, at least one of a metal, a conductive metal nitride, a conductive metal carbide, a conductive metal oxide, a conductive metal carbonitride, and a two-dimensional material. Each of the first buried conductive plug 70b and the second buried conductive plug 80b may include or may be formed of at least one of a metal and a metal alloy. The first buried insulating liner 71 and the second buried insulating liner 81 may include or may be formed of an insulating material. Unlike the shown example, the first buried conductive pattern 70 and the second buried conductive pattern 80 may have a single conductive film structure.

The two-dimensional material (2D material) may include a two-dimensional allotrope or a two-dimensional compound. The two-dimensional material (2D material) may include, for example, at least one of graphene, boron nitride (BN), molybdenum sulfide, molybdenum selenide, tungsten sulfide, tungsten selenide, and tantalum sulfide. However, the present disclosure is not limited thereto. That is, the above-mentioned 2D materials are only listed by way of example. The 2D material that may be included in the semiconductor device according to some embodiments of the present disclosure is not limited to the above-mentioned material.

The first contact connection via 180 may be disposed between the first source/drain contact 170 and the first buried conductive pattern 70. For example, the first contact connection via 180 may connect the first back connection contact 170_1 to the first buried conductive pattern 70. The first contact connection via 180 may be directly connected to the first back connection contact 170_1. For example, the first contact connection via 180 may extend through the source/drain etch stop film 185 and the field insulating film 105 and may be connected to the first buried conductive pattern 70.

The first contact connection via 180 may be disposed between the first source/drain contact 170 and the first buried conductive pattern 70. For example, the first contact connection via 180 may connect the first back connection contact 170_1 to the first buried conductive pattern 70. The first contact connection via 180 may be directly connected to the first back connection contact 170_1. For example, the first contact connection via 180 may extend through the source/drain etch stop film 185 and the field insulating film 105 and may be connected to the first buried conductive pattern 70.

The second contact connection via 280 may be disposed between the second source/drain contact 270 and the second buried conductive pattern 80. For example, the second contact connection via 280 may connect the second back connection contact 270_1 to the second buried conductive pattern 80. The second contact connection via 280 may be directly connected to the second back connection contact 270_1. For example, the second contact connection via 280 may extend through the source/drain etch stop film 185 and the field insulating film 105 and may be connected to the second buried conductive pattern 80.

A width in the second direction Y of the first contact connection via 180 may increase as the first contact connection via 180 extends away from the second surface 100BS of the substrate. A width in the second direction Y of the second contact connection via 380 may increase as the second contact connection via 380 extends away from the second surface 100BS of the substrate.

In an embodiment, the first contact connection via 180 may include a third point PS3 and a fourth point PS4. A third height H13 from the second surface 100BS of the substrate to the third point PS3 may be greater than a fourth height H14 from the second surface 100BS of the substrate to the fourth point PS4. A width W21 in the second direction Y of the first contact connection via 180 at the third point PS3 may be greater than a width W22 in the second direction Y of the first contact connection via 180 at the fourth point PS4.

The first contact connection via 180 and the second contact connection via 280 may include multiple films. That is, the first contact connection via 180 and the second contact connection via 280 may have a multiple conductive film structure. The first contact connection via 180 may include a first contact connection barrier film 180*a* and a first contact connection plug 180*b*. The second contact connection via 280 may include a second contact connection barrier film 280*a* and a second contact connection plug 280*b*.

The first contact connection barrier film 180*a* extends along a sidewall of the first contact connection plug 180*b*. The second contact connection barrier film 280*a* extends along a sidewall of the second contact connection plug 280*b*.

The first contact connection plug 180*b* may be directly connected to the first back connection contact 170_1. The first contact connection plug 180*b* may include an upper surface facing the first back connection contact 170_1. The upper surface of the first contact connection plug 180*b* may contact the first back connection contact 170_1. The second contact connection plug 280*b* may be directly connected to the second back connection contact 270_1. The second contact connection plug 280*b* may include an upper surface facing the second back connection contact 270_1. The upper surface of the second contact connection plug 280*b* may contact the second back connection contact 270_1.

Since the contact connection plugs 180*b* and 280*b* are directly connected to the back connection contacts 170_1 and 270_1 without the contact connection barrier films 180*a* and 280*a*, the resistance between the source/drain contacts 170 and 270 and the contact connection via 180 decreases. Thus, the performance and reliability of the semiconductor device may be improved.

The first contact connection barrier film 180*a* and the second contact connection barrier film 280*a* may include or may be formed of, for example, at least one of a metal, a conductive metal nitride, a conductive metal carbide, a conductive metal oxide, a conductive metal carbonitride, and a two-dimensional material. The first contact connection plug 180*b* and the second contact connection plug 280*b* may include or may be formed of at least one of a metal and a metal alloy.

In one example, the first contact connection plug 180*b* may include or may be formed of the same material as that of the first back connection contact 170_1. The second contact connection plug 280*b* may include or may be formed of the same material as that of the second back connection contact 270_1. In this case, a boundary between the contact connection plugs 180*b* and 280*b* and the back connection contacts 170_1 and 270_1 may not be defined.

In another example, the first contact connection plug 180*b* may include or may be formed of a material different from that of the first back connection contact 170_1. The second contact connection plug 280*b* may include or may be formed of a material different from that of the second back connection contact 270_1.

Unlike the shown example, the first contact connection via 180 and the second contact connection via 280 may have a single conductive film structure.

The first back wiring line 50 and the second back wiring line 60 may be disposed on the second surface 100BS of the substrate. For example, the first back wiring line 50 and the second back wiring line 60 may extend in the second direction Y. However, the present disclosure is not limited thereto.

The first back wiring line 50 may be connected to the first buried conductive pattern 70. The first back wiring line 50 may be connected to the first back connection contact 170_1 via the first buried conductive pattern 70. The first back connection contact 170_1 may connect the first back wiring line 50 to the first source/drain pattern 150. The first front connection contact 170_2 may not be connected to the first back wiring line 50.

Although not shown, the second back wiring line 60 may be connected to the second buried conductive pattern 80. The second back wiring line 60 may be connected to the second back connection contact 270_1 via the second buried conductive pattern 80. The second back connection contact 270_1 may connect the second back wiring line 60 to the second source/drain pattern 250. The second front connection contact 2702 may not be connected to the second back wiring line 60.

In one example, the first back wiring line 50 and the second back wiring line 60 may function as a power line that can supply power to the semiconductor device. In another example, each of the first back wiring line 50 and the second back wiring line 60 may function as a signal line supplying an operation signal to the semiconductor device. In still another example, one of the first back wiring line 50 and the second back wiring line 60 may be the power line, and the other thereof may be the signal line.

A first back wiring via 55 may be disposed between the first back wiring line 50 and the first buried conductive pattern 70. The first back wiring via 55 may connect the first back wiring line 50 to the first buried conductive pattern 70. Although not shown, the second back wiring via 65 may be disposed between the second back wiring line 60 and the second buried conductive pattern 80. The second back wiring via 65 may connect the second back wiring line 60 to the second buried conductive pattern 80.

Each of the first back wiring line 50 and the second back wiring line 60 is illustrated as having a single conductive film structure. However, the present disclosure is not limited thereto. Unlike the shown example, the first back wiring line 50 and the second back wiring line 60 may have a multiple conductive film structure including a back wiring barrier film and a back wiring plug film as the front wiring line 198 may have. The first back wiring via 55 is illustrated as having a single conductive film structure. However, the present disclosure is not limited thereto.

The first back wiring line 50, the second back wiring line 60 and the first back wiring via 55 may include or may be formed of, for example, at least one of a metal, a metal alloy, a conductive metal nitride, a conductive metal carbide, a conductive metal oxide, a conductive metal carbonitride and a two-dimensional material. A boundary between the first back wiring line 50 and the first back wiring via 55 is illustrated as being defined. However, the present disclosure is not limited thereto. The first back wiring line 50 and the first back wiring via 55 may have an integral structure with each other and thus the boundary therebetween may not be defined.

A lower interlayer insulating film 290 may be disposed on the second surface 100BS of the substrate. The first back wiring line 50, the first back wiring via 55, and the second back wiring line 60 may be disposed in the lower interlayer insulating film 290. The lower interlayer insulating film 290 may include or may be formed of, for example, at least one of silicon oxide, silicon nitride, silicon carbonitride, silicon oxynitride, and a low dielectric constant material.

A second upper interlayer insulating film 191 may be disposed on the first upper interlayer insulating film 190. The first upper interlayer insulating film 190 and the second upper interlayer insulating film 191 may be distinguished from each other based on the upper surface 145US of the gate capping pattern. The second upper interlayer insulating film 191 may cover a sidewall of the front wiring via 196.

An upper etch stop film 193 and a third upper interlayer insulating film 192 may be sequentially disposed on the second upper interlayer insulating film 191. The upper etch stop film 193 may be disposed between the second upper interlayer insulating film 191 and the third upper interlayer insulating film 192.

The upper etch stop film 193 may include or may be formed of, for example, at least one of silicon nitride (SiN), silicon oxynitride (SiON), silicon oxycarbonitride (SiOCN), silicon boron nitride (SiBN), silicon oxyboronitride (SiOBN), silicon oxycarbide (SiOC), aluminum oxide (AlO), aluminum nitride (AlN), aluminum oxycarbide (AlOC), and a combination thereof. The third upper interlayer insulating film 192 may include or may be formed of, for example, at least one of silicon oxide, silicon nitride, silicon carbonitride, silicon oxynitride, and a low dielectric constant material.

The front wiring line 198 may be disposed in the third upper interlayer insulating film 192. The front wiring line 198 may be disposed on the first surface 100US of the substrate.

The front wiring line 198 may be connected to the source/drain contacts 170, 270, 370, and 470 and the gate contact 175. The front wiring line 198 may be connected to the source/drain contacts 170, 270, 370, and 470 via the front wiring via 196. The front wiring line 198 may extend through the upper etch stop film 193 and may be connected to the front wiring via 196 and the gate contact 175.

The front wiring line 198 may include a front wiring barrier film 198b and a front wiring plug 198b. For example, the front wiring barrier film 198b may include or may be formed of at least one of a metal, a conductive metal nitride, a conductive metal carbide, a conductive metal oxide, a conductive metal carbonitride, and a two-dimensional material. The front wiring plug 198b may include or may be formed of, for example, at least one of a metal and a metal alloy. The front wiring line 198 is illustrated as having a multi-conductive film structure. However, the present disclosure is not limited thereto. Unlike the shown example, the front wiring line 198 and the back wiring lines 50 and 60 may have a single conductive film structure.

Figure 6:
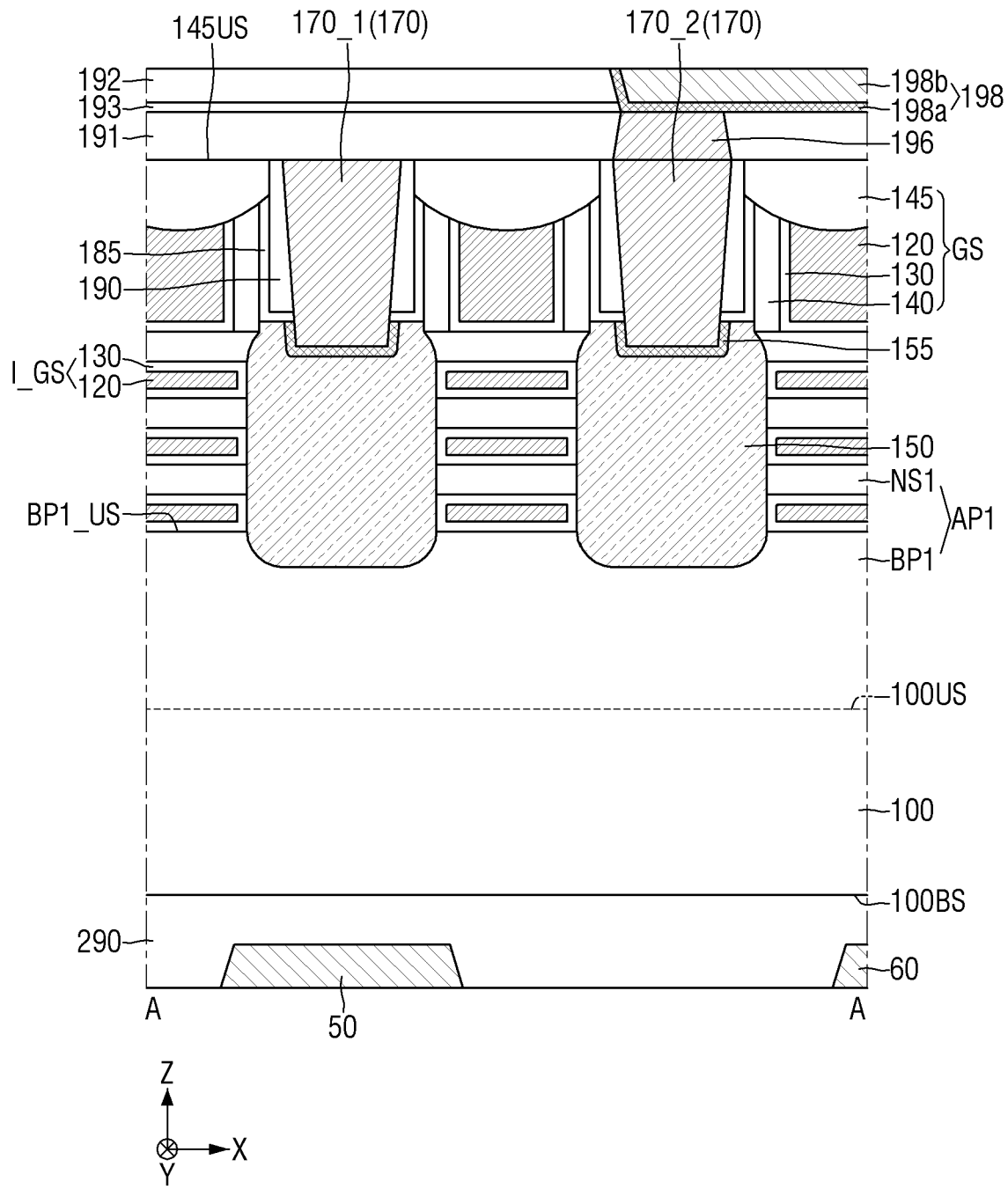
FIG. 6 and FIG. 7 are drawings for illustrating a semiconductor device according to some embodiments.
Figure 7:
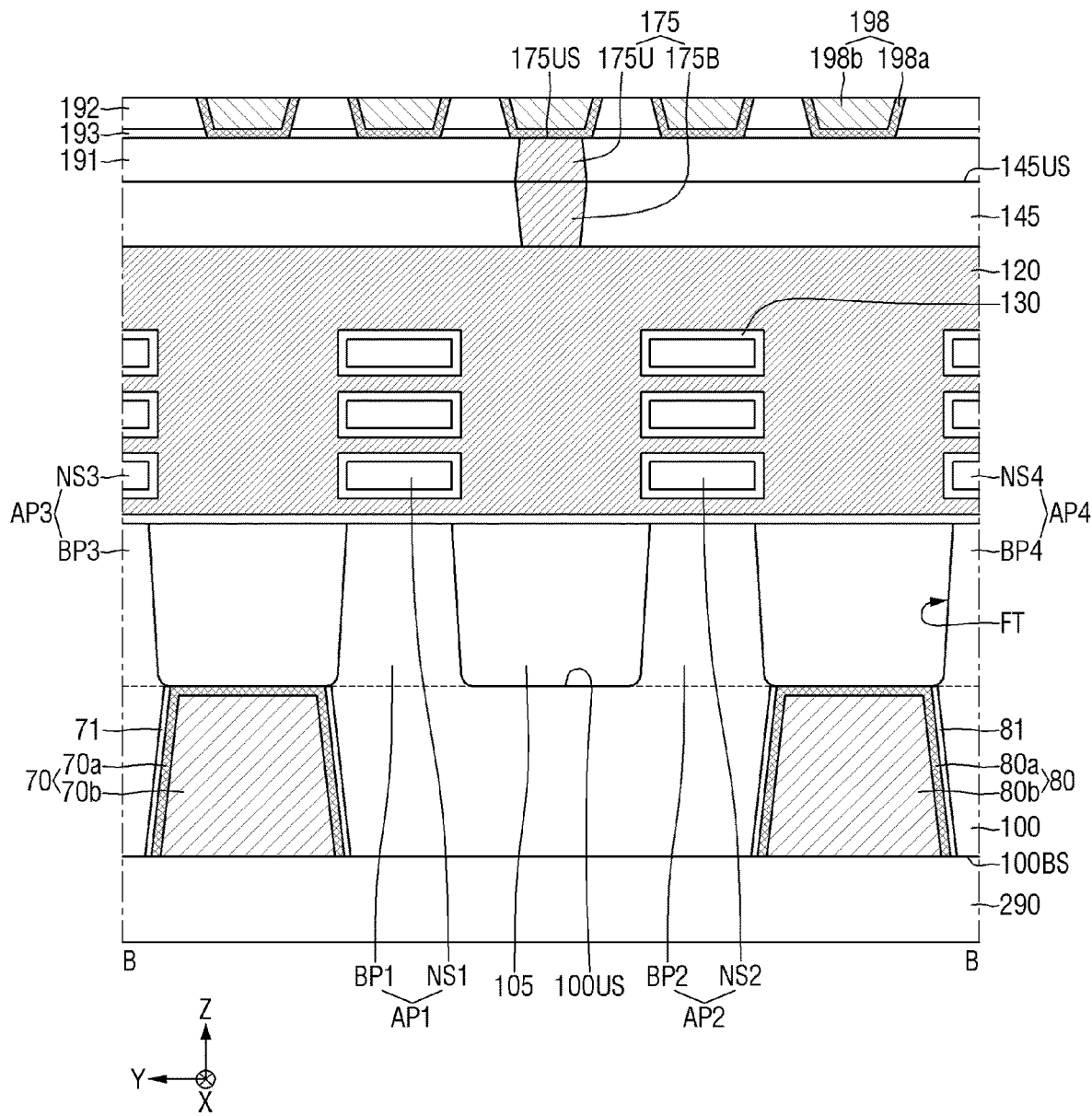
Figure 8:
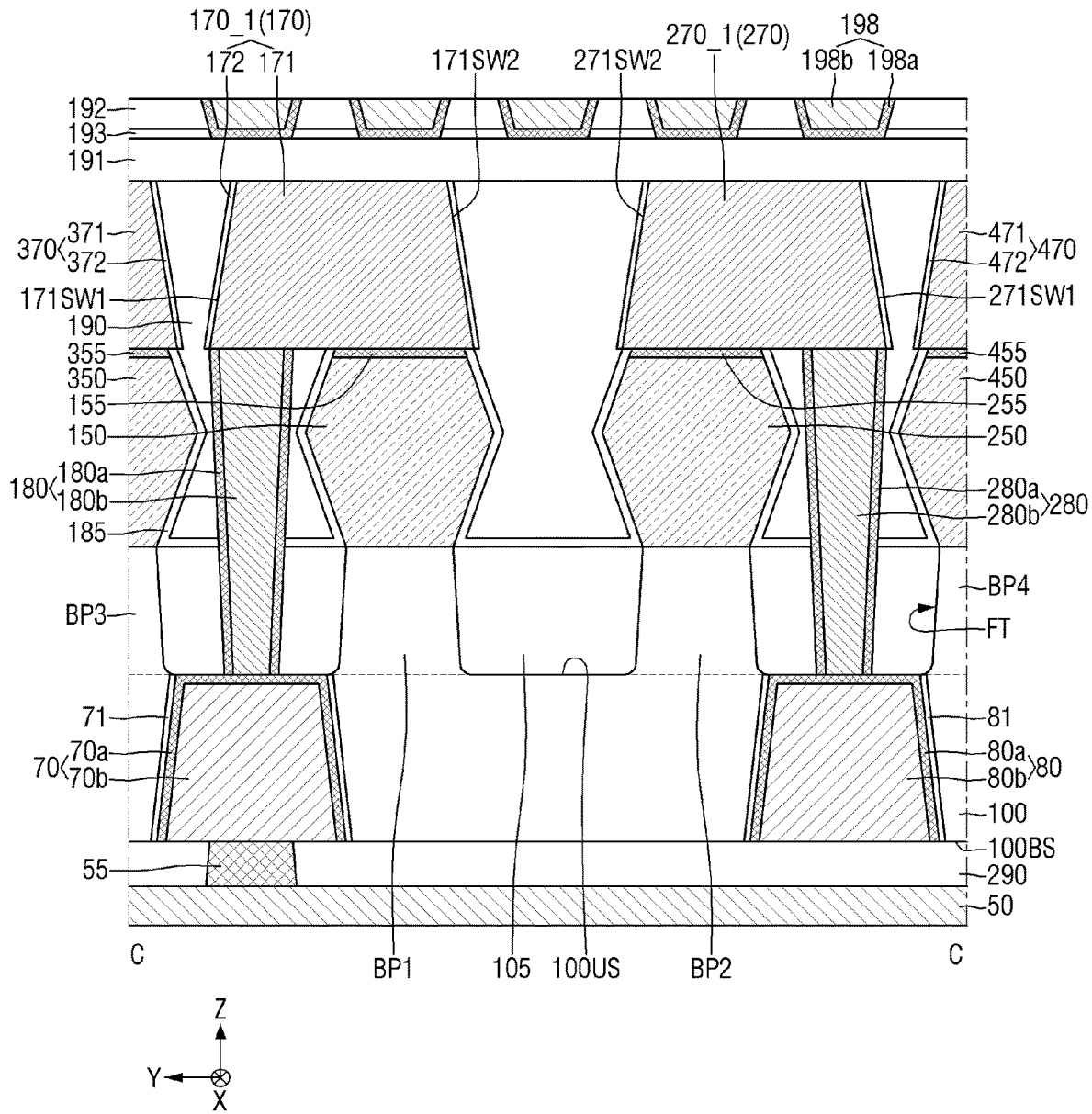
FIG. 8 and FIG. 9 are drawings for illustrating a semiconductor device according to some embodiments.
Figure 9:
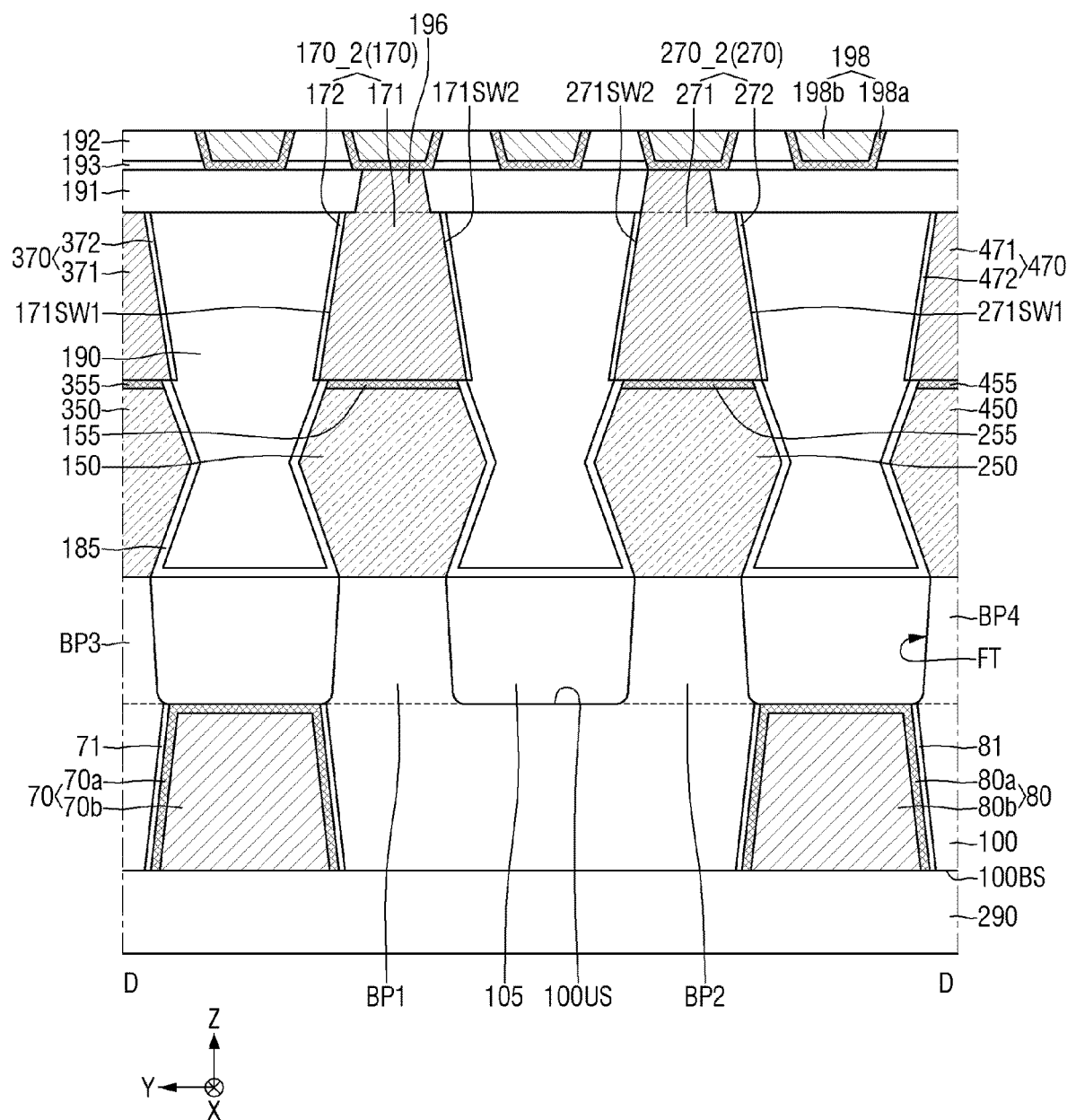
Figure 10:
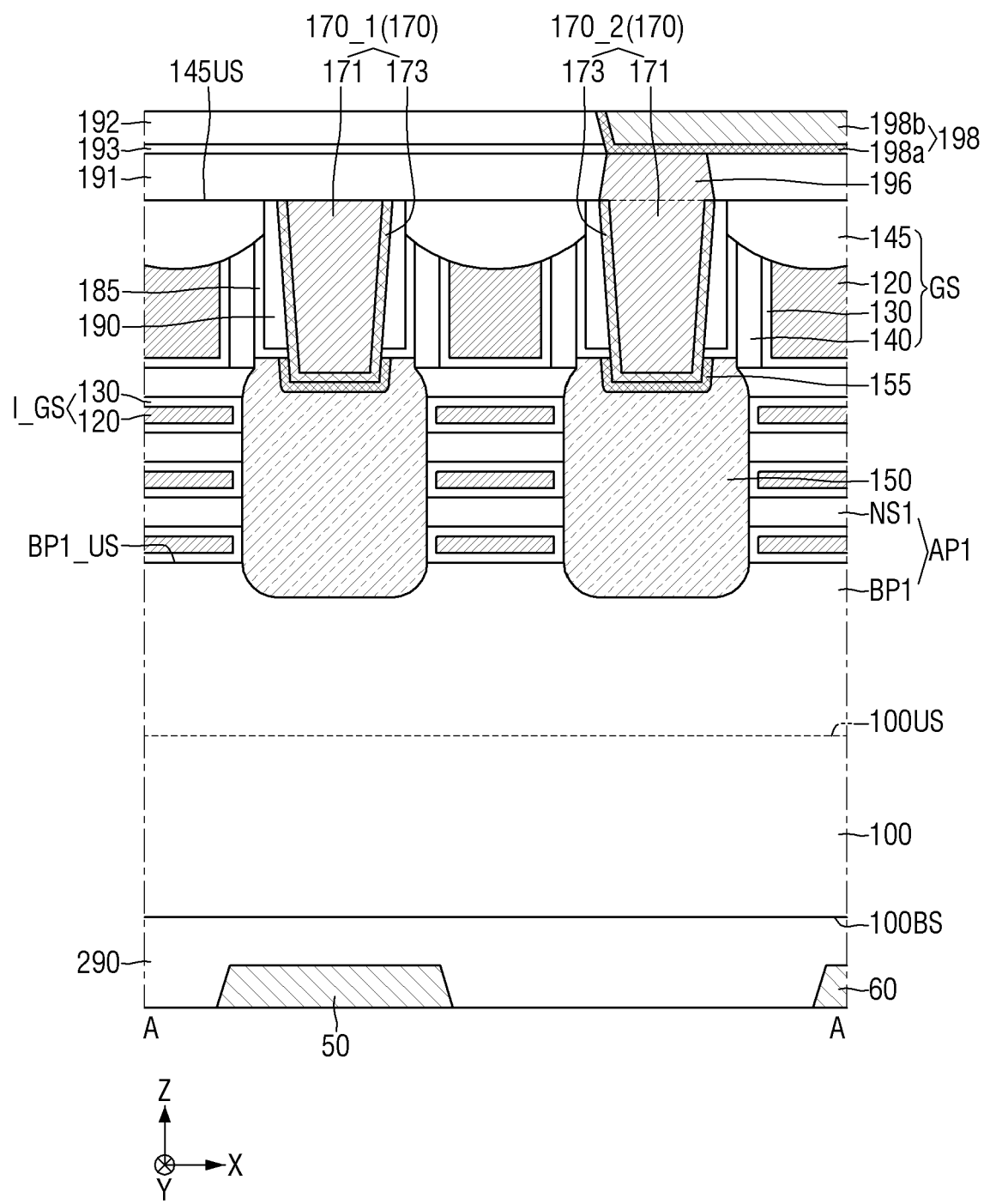
FIG. 10 to FIG. 12 are diagrams for illustrating a semiconductor device according to some embodiments.
Figure 11:
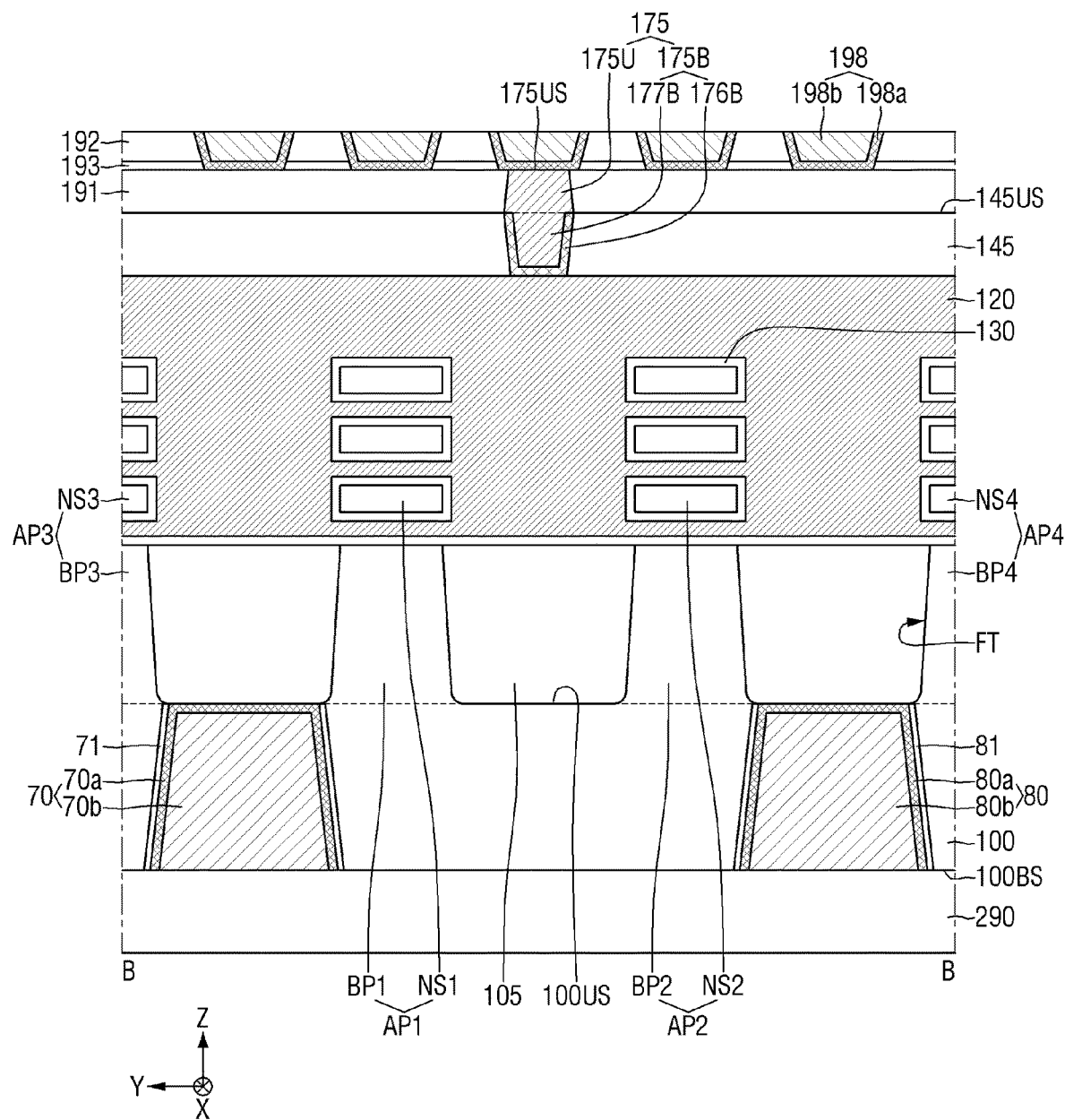
Figure 12:
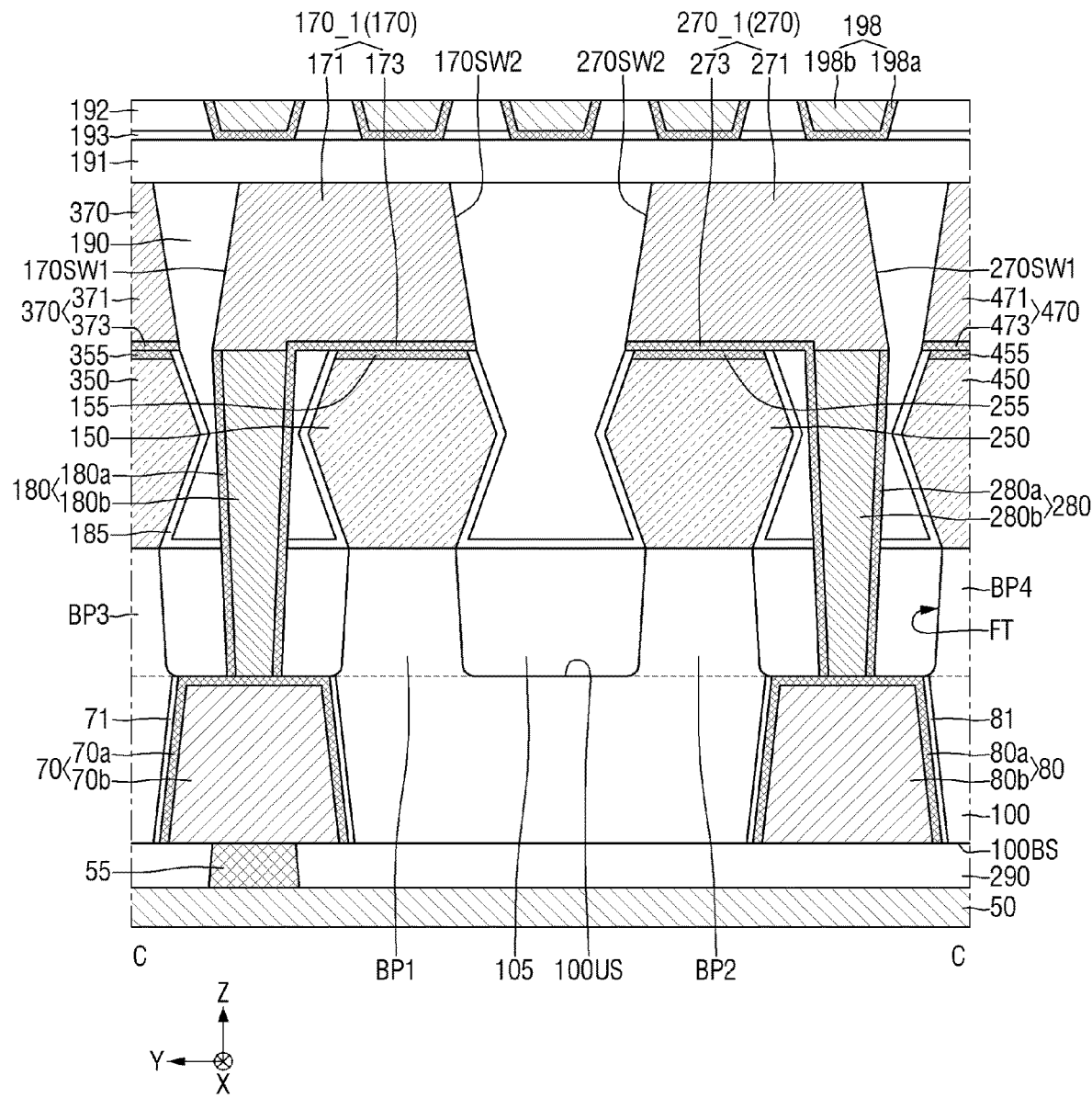

FIG. 6 and FIG. 7 are drawings for illustrating a semiconductor device according to some embodiments. FIG. 8 and FIG. 9 are drawings for illustrating a semiconductor device according to some embodiments. FIG. 10 to FIG. 12 are diagrams for illustrating a semiconductor device according to some embodiments. For convenience of descriptions, differences thereof from those as set forth above with reference to FIG. 1 to FIG. 5 will be set forth below.

Referring to FIGS. 6 and 7, in a semiconductor device according to some embodiments, the first source/drain contact 170 may include or may be formed of a material different from that of the front wiring via 196.

Further, the lower portion 175B of the gate contact may be made of a different material from that of the upper portion 175U of the gate contact.

The first source/drain contact 170 may include or may be formed of the same material as that of the lower portion 175B of the gate contact. The front wiring via 196 may include or may be formed of the same material as that of the upper portion 175U of the gate contact.

Referring to FIG. 8 and FIG. 9, in a semiconductor device according to some embodiments, the first source/drain contact 170 may include a first source/drain contact plug 171 and a first source/drain contact capping film 172.

The second source/drain contact 270 may include a second source/drain contact plug 271 and a second source/drain contact capping film 272. The third source/drain contact 370 may include a third source/drain contact plug 371 and a third source/drain contact capping film 372. The fourth source/drain contact 470 may include a fourth source/drain contact plug 471 and a fourth source/drain contact capping film 472.

The first source/drain contact plug 171 may include a first sidewall 171SW1 and a second sidewall 171SW2 opposite in the second direction Y. The first source/drain contact capping film 172 may extend along the first sidewall 171SW1 of the first source/drain contact plug and the second sidewall 171SW2 of the first source/drain contact plug.

The first source/drain contact capping film 172 may not be disposed in a space between the first source/drain contact plug 171 and the first contact silicide film 155. The first source/drain contact capping film 172 may not be disposed in a space between the first source/drain contact plug 171 and the first contact connection plug 180b. The first source/drain contact plug 171 may be directly connected to the first contact connection plug 180b. The first source/drain contact plug 171 may contact the upper surface of the first contact connection plug 180b.

The second source/drain contact plug 271 may include a first sidewall 271SW1 and a second sidewall 271SW2 opposite in the second direction Y. The second source/drain contact capping film 272 may extend along the first sidewall 271SW1 of the second source/drain contact plug and the second sidewall 271SW2 of the second source/drain contact plug.

The second source/drain contact capping film 272 may not be disposed between the second source/drain contact plug 271 and the second contact silicide film 255. The second source/drain contact capping film 272 may not be disposed between the second source/drain contact plug 271 and the second contact connection plug 280b. The second source/drain contact plug 271 may be directly connected to the second contact connection plug 280b. The second source/drain contact plug 271 may contact the upper surface of the second contact connection plug 280b.

Descriptions of the sidewalls 171SW1 and 171SW2 of the first source/drain contact plug and the sidewalls 271SW1 and 271SW2 of the second source/drain contact plug may be substantially the same as the descriptions of the sidewalls 170SW1 and 170SW2 of the first source/drain contact and the sidewalls 270SW1 and 270SW2 of the second source/drain contact in FIG. 4.

The descriptions of the first source/drain contact 170 and the second source/drain contact 270 may be equally applied to the third source/drain contact 370 and the fourth source/drain contact 470.

The source/drain contacts 170, 270, 370, and 470 may include multiple films. The source/drain contact plugs 171, 271, 371, and 471 may include or may be formed of, for example, at least one of a metal and a metal alloy. The source/drain contact plugs 171, 271, 371, and 471 may include or may be formed of, for example, at least one of tungsten (W), molybdenum (Mo), ruthenium (Ru), and ruthenium-aluminum (RuAl). However, the technical idea of the present disclosure is not limited thereto. The source/drain contact capping films 172, 272, 372, and 472 may include or may be formed of, for example, at least one of titanium, titanium nitride, tantalum, tantalum nitride, aluminum nitride, titanium oxide, and a two-dimensional material.

The source/drain contact plugs 171, 271, 371, and 471 may include or may be formed of the same material as that of the front wiring via 196 and the gate contact 175.

Referring to FIG. 10 to FIG. 12, in a semiconductor device according to some embodiments, the first source/drain contact 170 may include the first source/drain contact plug 171 and a first source/drain barrier film 173.

The second source/drain contact 270 may include the second source/drain contact plug 271 and a second source/drain barrier film 273. The third source/drain contact 370 may include the third source/drain contact plug 371 and a third source/drain barrier film 373. The fourth source/drain contact 470 may include the fourth source/drain contact plug 471 and a fourth source/drain barrier film 473.

With respect to the first source/drain contact 170 and the second source/drain contact 270, the sidewalls of the first source/drain contact plug 171 may be the sidewalls 170SW1 and 170SW2 of the first source/drain contact. The sidewalls of the second source/drain contact plug 271 may be the sidewalls 270SW1 and 270SW2 of the second source/drain contact.

In FIG. 12, the first source/drain barrier film 173 does not extend along the sidewalls 170SW1 and 170SW2 of the first source/drain contact. The first source/drain barrier film 173 does not cover the sidewalls 170SW1 and 170SW2 of the first source/drain contact. The first source/drain barrier film 173 may be disposed between the first source/drain contact plug 171 and the first contact silicide film 155. The first source/drain barrier film 173 may not be disposed in a space between the first source/drain contact plug 171 and the first contact connection plug 180b. The first source/drain contact plug 171 may be directly connected to the first contact connection plug 180b. The first source/drain contact plug 171 may contact the upper surface of the first contact connection plug 180b.

In the cross-sectional view as shown in FIG. 10, the first source/drain barrier film 173 may be disposed between the first source/drain contact plug 171 and the first upper interlayer insulating film 190. That is, the first source/drain barrier film 173 may or may not be visible, depending on a direction in which the first source/drain contact 170 is cut.

In FIG. 12, the second source/drain barrier film 273 does not extend along the sidewalls 270SW1 and 270SW2 of the second source/drain contact. The second source/drain barrier film 273 does not cover the sidewalls 270SW1 and 270SW2 of the second source/drain contact. The second source/drain barrier film 273 may be disposed between the second source/drain contact plug 271 and the second contact silicide film 255. The second source/drain barrier film 273 may not be disposed in a space between the second source/drain contact plug 271 and the second contact connection plug 280b. The second source/drain contact plug 271 may be directly connected to the second contact connection plug 280b. The second source/drain contact plug 271 may contact the upper surface of the second contact connection plug 280b.

In FIG. 11, the lower portion 175B of the gate contact may include a lower gate contact barrier film 176B and a lower gate contact plug 177B. The lower gate contact barrier film 176B may be disposed between the lower gate contact plug 177B and the gate electrode 120 and between the lower gate contact plug 177B and the gate capping pattern 145. For example, the lower gate contact plug 177B may include or may be formed of the same material as that of the upper portion 175U of the gate contact.

The source/drain contacts 170, 270, 370, and 470 may include multiple films. The source/drain contact plugs 171, 271, 371, and 471 may include or may be formed of, for example, at least one of a metal and a metal alloy. The source/drain contact plugs 171, 271, 371, and 471 may include or may be formed of, for example, at least one of tungsten (W), molybdenum (Mo), ruthenium (Ru), and ruthenium-aluminum (RuAl). However, the technical idea of the present disclosure is not limited thereto.

The source/drain barrier films 173, 273, 373, and 473 and the lower gate contact barrier film 176B may include or may be formed of the same material as that of the contact connection barrier films 180a and 280a. The source/drain contact plugs 171, 271, 371, and 471 may include or may be formed of the same material as that of the front wiring via 196, the upper portion of the gate contact 175U, and the lower gate contact plug 177B thereof.

Figure 13:
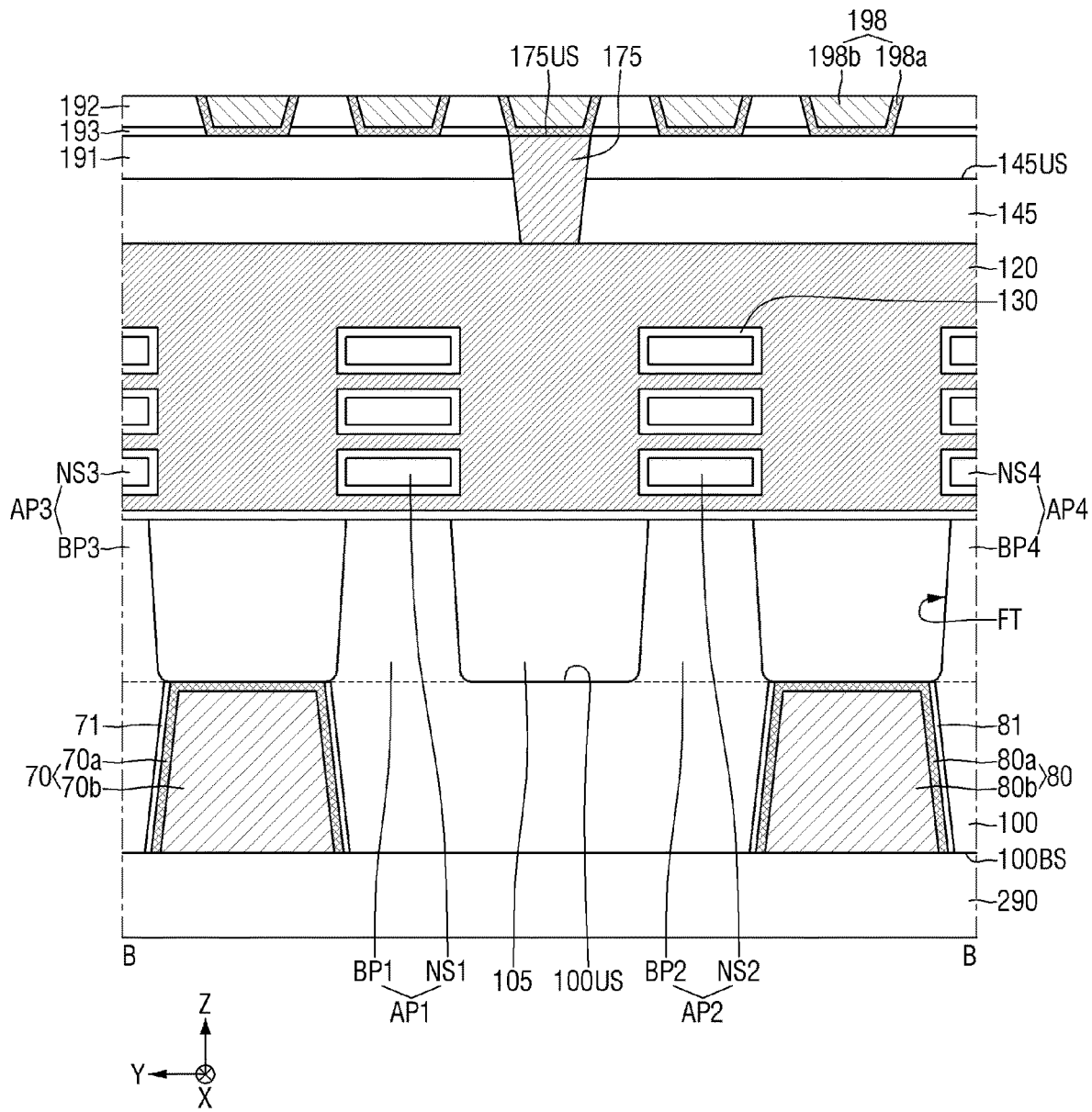
FIG. 13 and FIG. 14 are diagrams for illustrating semiconductor devices according to some embodiments.
Figure 14:
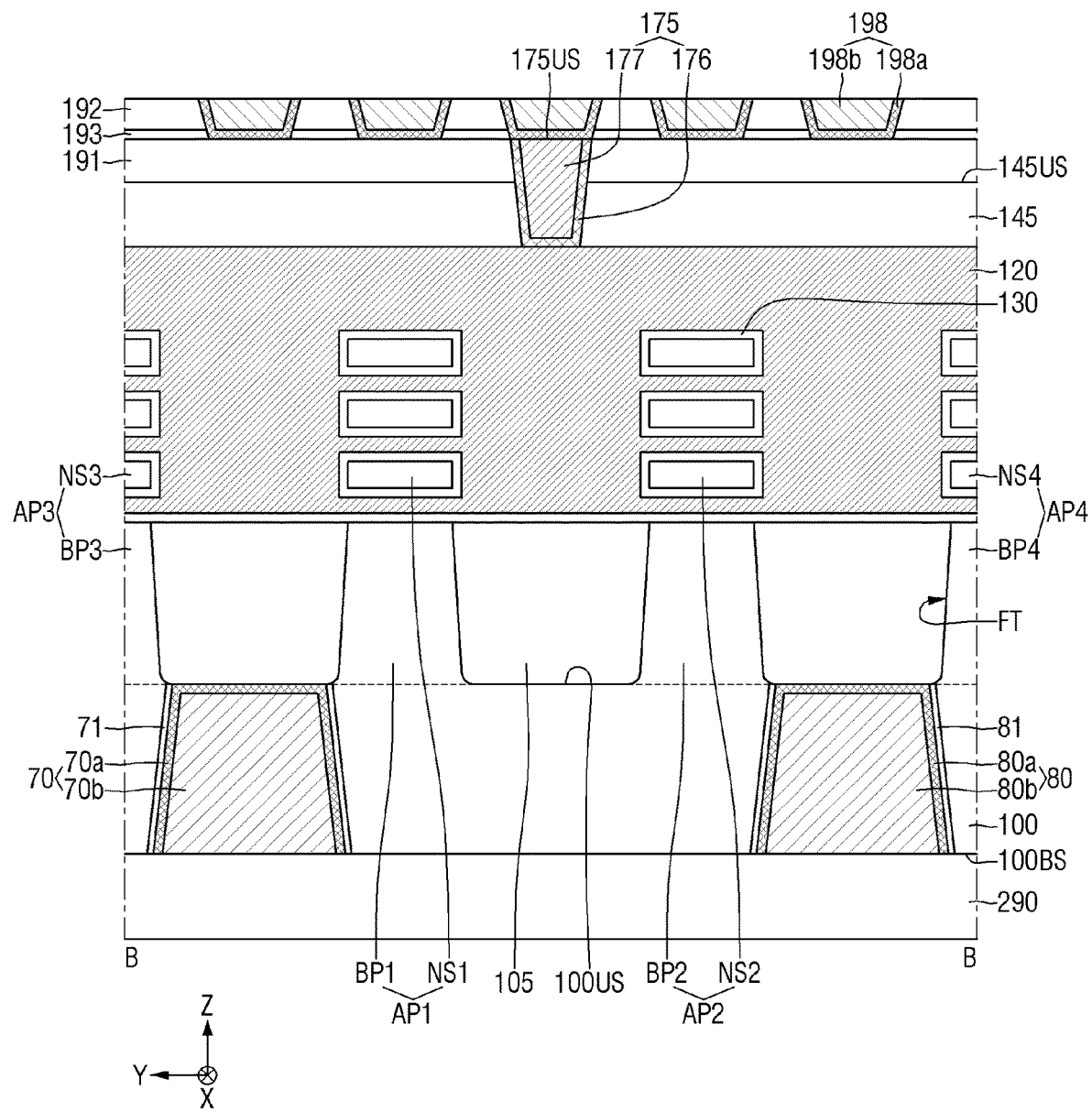
Figure 15:
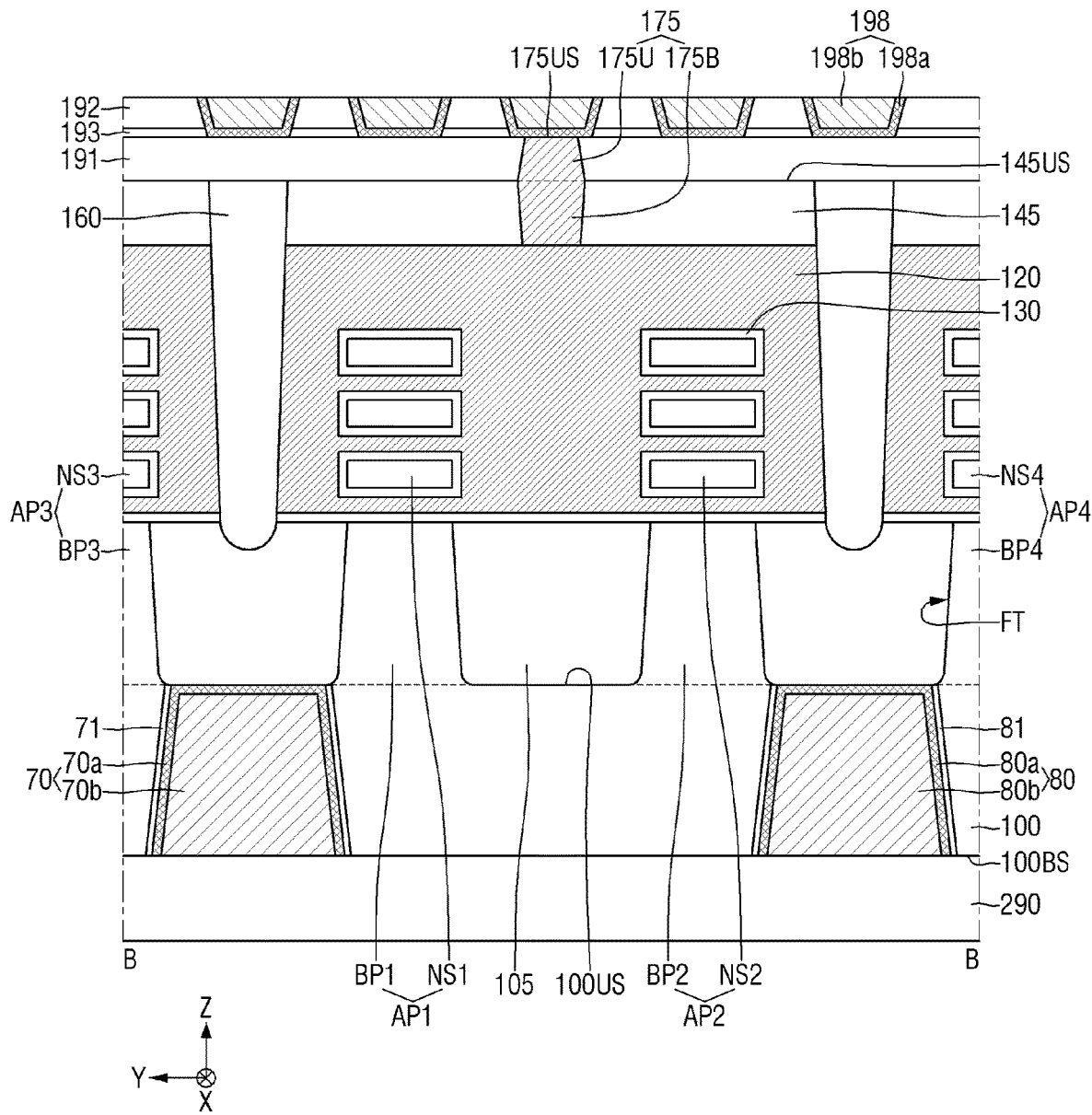
FIG. 15 and FIG. 16 are diagrams for illustrating semiconductor devices according to some embodiments.
Figure 16:
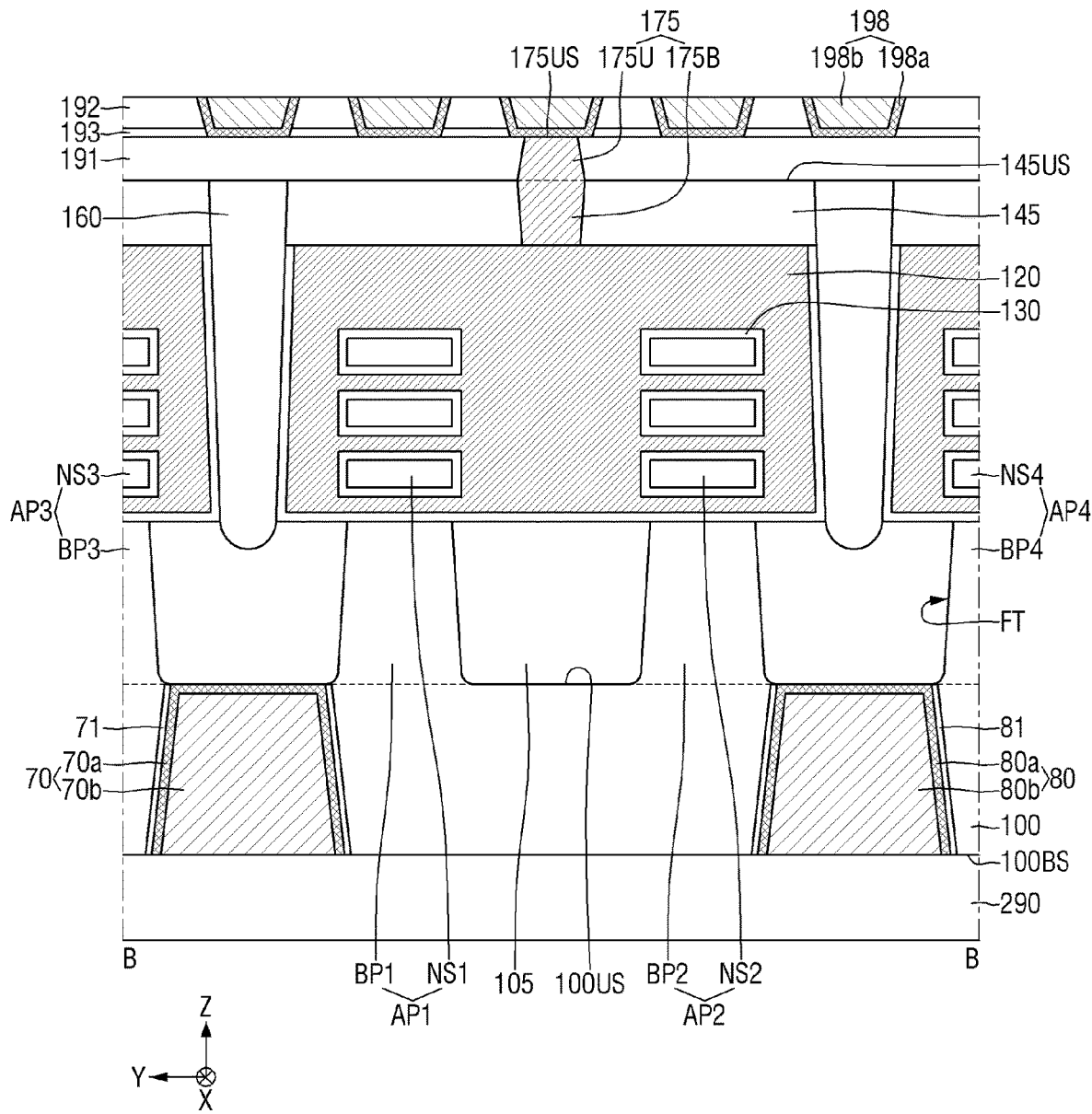

FIG. 13 and FIG. 14 are diagrams for illustrating semiconductor devices according to some embodiments. FIG. 15 and FIG. 16 are diagrams for illustrating semiconductor devices according to some embodiments. For convenience of descriptions, differences thereof from those as set forth above with reference to FIG. 1 to FIG. 5 will be set forth below.

Referring to FIGS. 13 and 14, in a semiconductor device according to some embodiments, the width in the second direction Y of the gate contact 175 may increase as the gate contact 175 extends away from the gate electrode 120.

The gate contact 175 may not include a portion whose a width in the second direction Y increases and then decreases. For example, the width in the second direction Y of the gate contact 175 may continuously increase as the gate contact 175 extends away from the gate electrode 120.

In FIG. 13, the gate contact 175 may have a single film structure. The gate contact 175 may include or may be formed of at least one of a metal and a metal alloy. The gate contact 175 may include or may be formed of the same material as that of each of the source/drain contacts 170, 270, 370, and 470, or may include or may be formed of a material different from that of the source/drain contacts 170, 270, 370, and 470.

In FIG. 14, the gate contact 175 may include a gate contact barrier film 176 and a gate contact plug 177. The gate contact barrier film 176 may extend along a sidewall and a bottom surface of the gate contact plug 177. The gate contact barrier film 176 may include or may be formed of, for example, at least one of a metal, a conductive metal nitride, a conductive metal carbide, a conductive metal oxide, a conductive metal carbonitride, and a two-dimensional material. The gate contact plug 177 may include or may be formed of at least one of a metal and a metal alloy.

Referring to FIG. 15 and FIG. 16, a semiconductor device according to some embodiments may further include a gate cutting pattern 160.

The gate electrode 120 may be disposed between gate cutting patterns 160 adjacent to each other in the second direction Y. The gate cutting pattern 160 may be disposed between the first active pattern AP1 and the third active pattern AP3 and between the second active pattern AP2 and the fourth active pattern AP4. The gate cutting pattern 160 may be made of an insulating material.

In FIG. 15, the gate insulating film 130 does not extend along a sidewall of the gate cutting pattern 160.

In FIG. 16, the gate insulating film 130 may extend along the sidewall of the gate cutting pattern 160.

Figure 17:
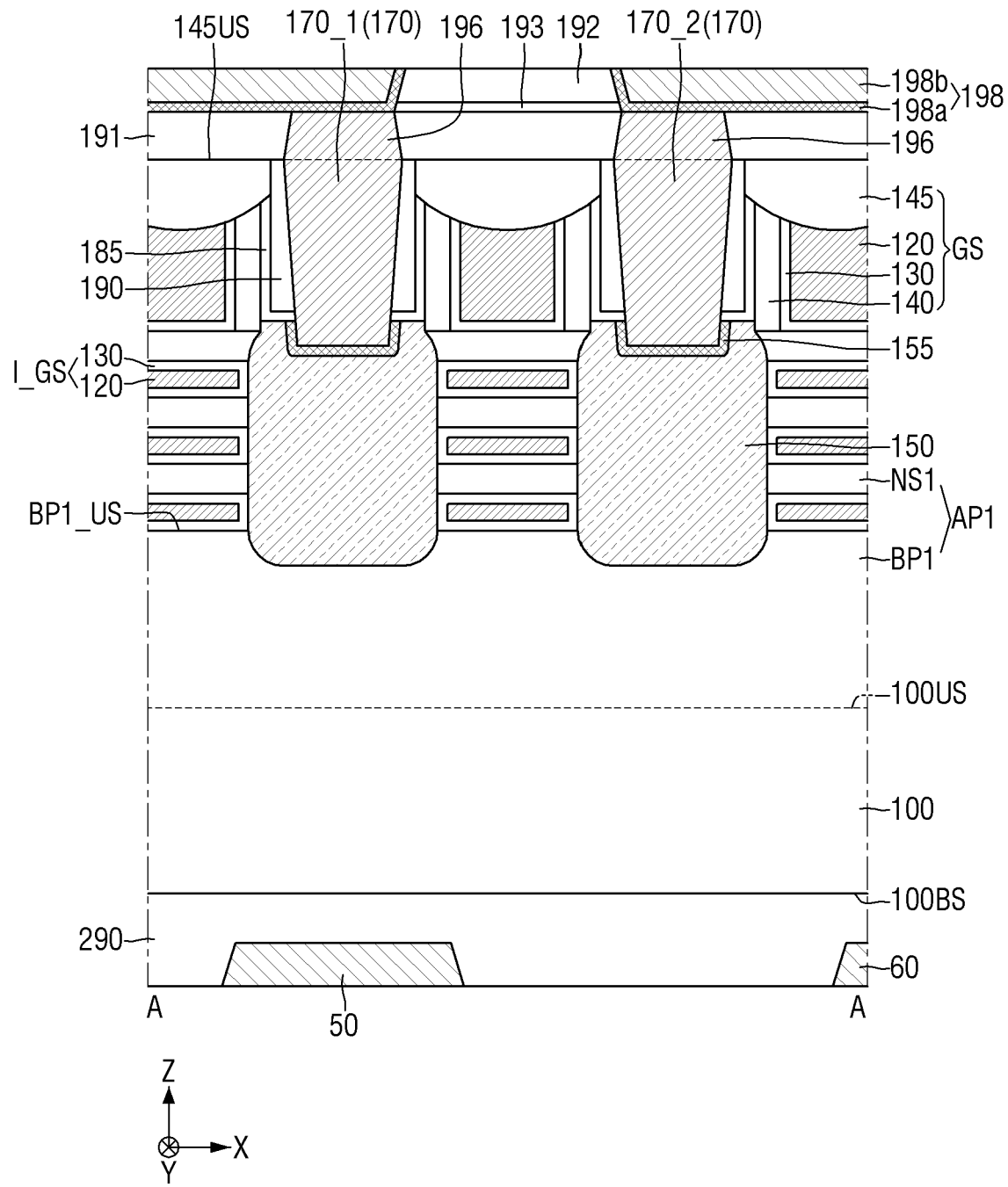
FIG. 17 and FIG. 18 are diagrams for illustrating a semiconductor device according to some embodiments.
Figure 18:
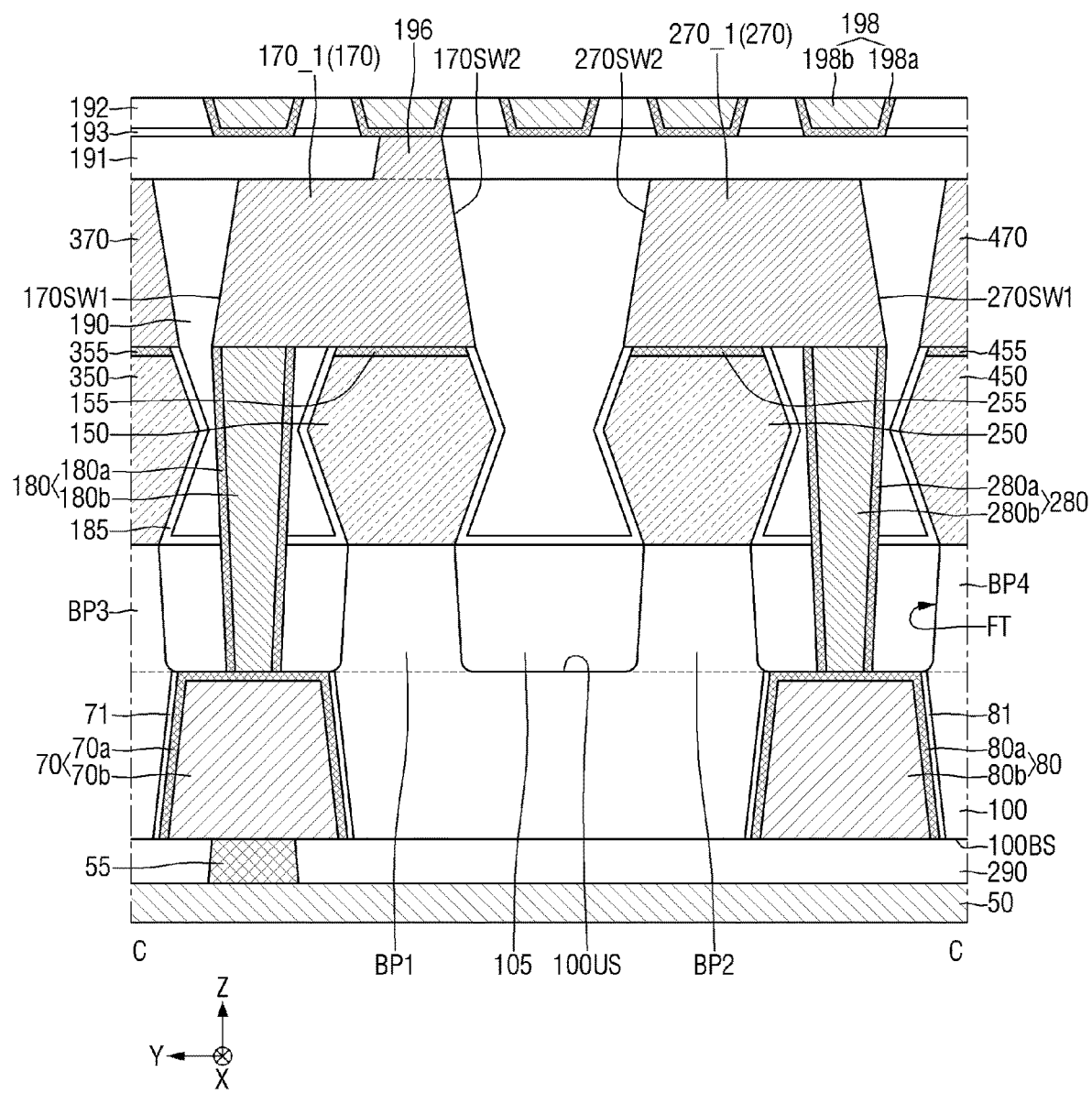
Figure 19:
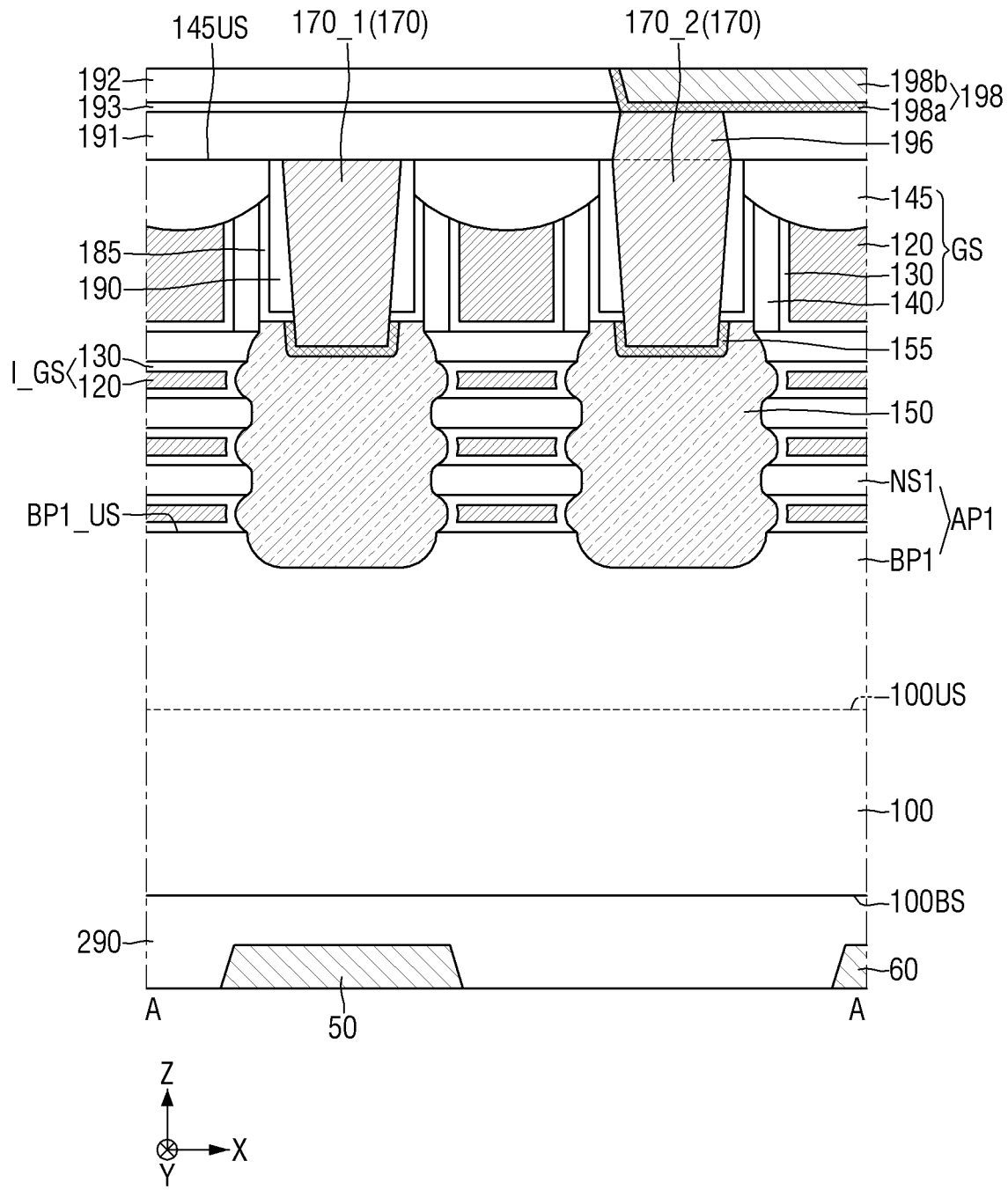
FIG. 19 and FIG. 20 are diagrams for illustrating semiconductor devices according to some embodiments.
Figure 20:
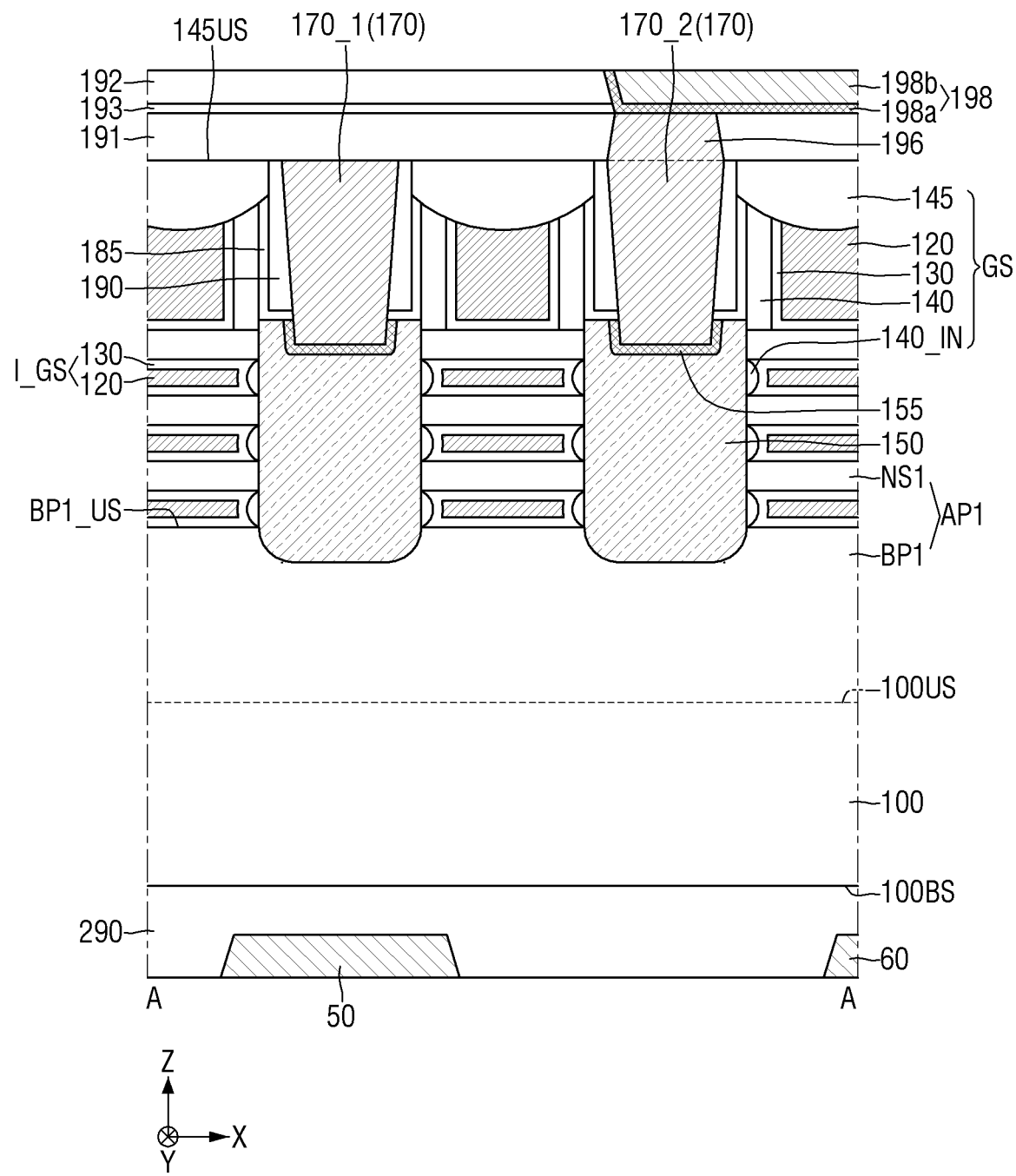
Figure 21:
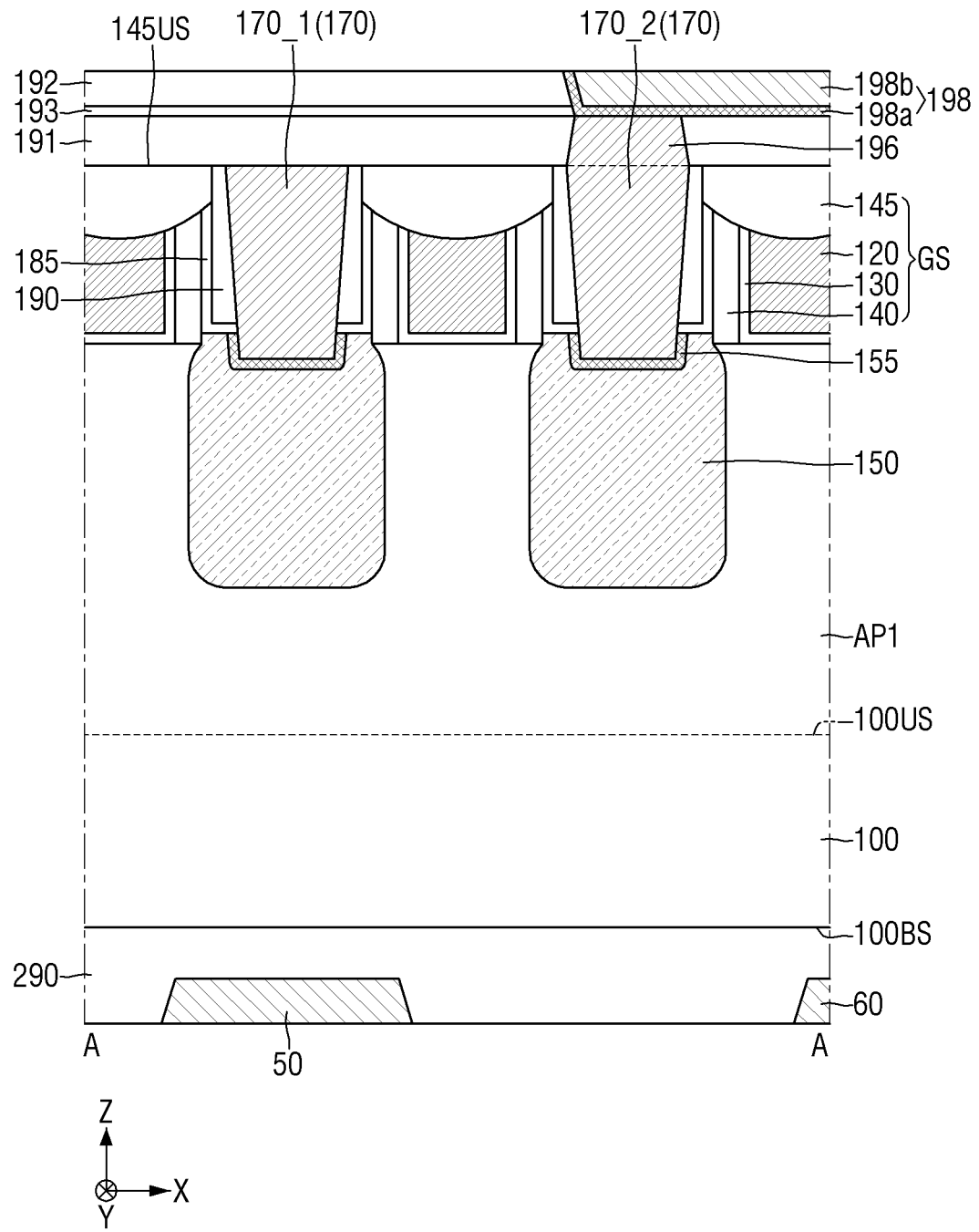
FIG. 21 and FIG. 22 are drawings for illustrating a semiconductor device according to some embodiments.
Figure 22:
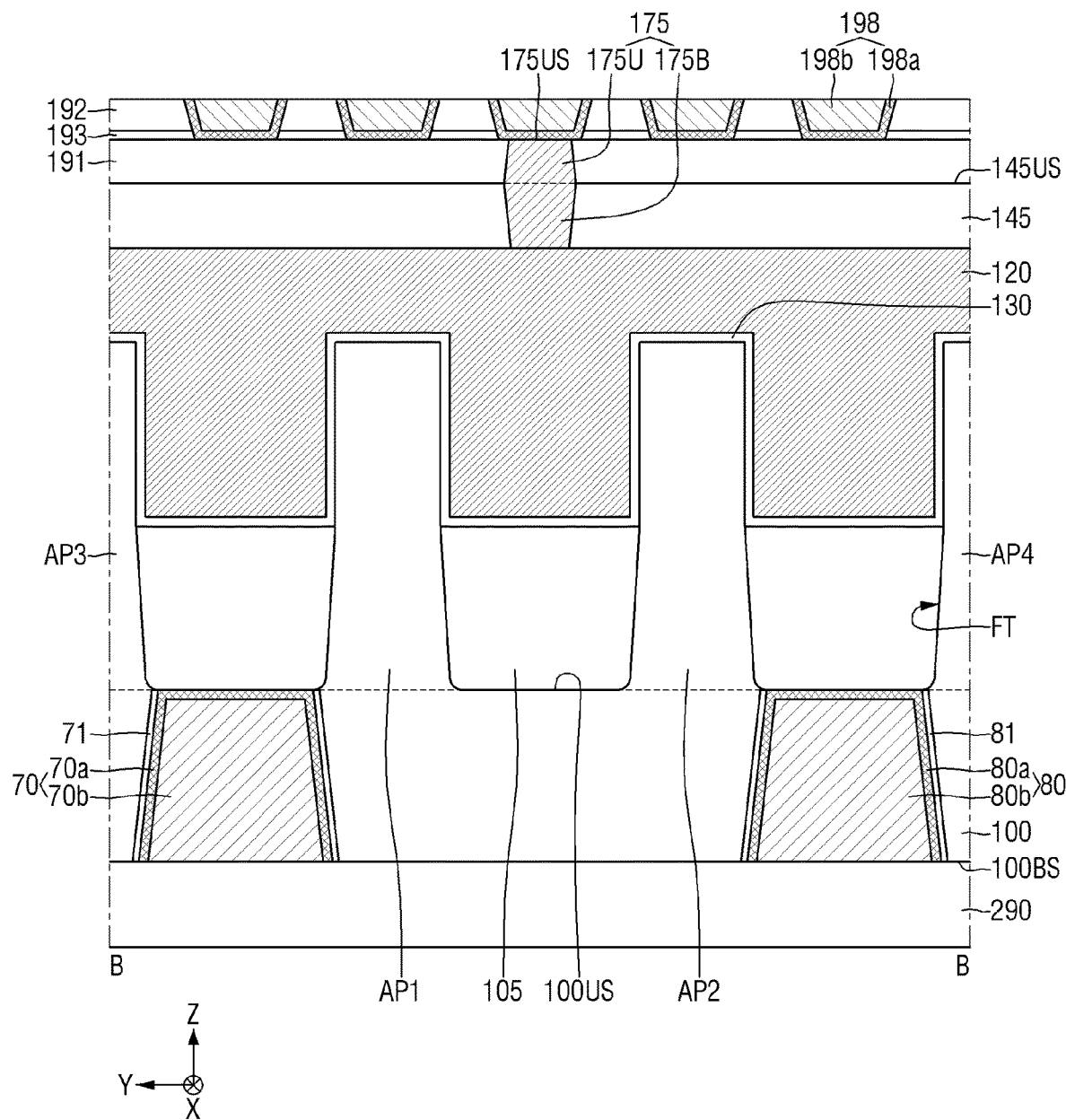

FIG. 17 and FIG. 18 are diagrams for illustrating a semiconductor device according to some embodiments. FIG. 19 and FIG. 20 are diagrams for illustrating semiconductor devices according to some embodiments. FIG. 21 and FIG. 22 are drawings for illustrating a semiconductor device according to some embodiments. For convenience of descriptions, differences thereof from those as set forth above with reference to FIG. 1 to FIG. 5 will be set forth below.

Referring to FIGS. 17 and 18, in a semiconductor device according to some embodiments, the first back connection contact 170_1 may be connected to the front wiring line 198 as well as the first back wiring line 50.

The front wiring via 196 may connect the first back connection contact 170_1 to the front wiring line 198.

Referring to FIG. 19, in a semiconductor device according to some embodiments, the first source/drain pattern 150 may include an outer sidewall contacting the first sheet patterns NS1 and the inner gate structures I_GS.

The outer sidewall of the first source/drain pattern 150 may have a wavy shape.

Referring to FIG. 20, in a semiconductor device according to some embodiments, the gate structure GS may further include a plurality of inner spacers 140_IN.

The inner spacers 140_IN may be disposed between the first sheet patterns NS1 adjacent in the third direction Z and between the first lower pattern BP1 and the lowest first sheet pattern NS1. For example, the lowermost inner spacer of the inner spacers 140_IN may be disposed between the first lower pattern BP1 and the lowermost first sheet pattern of the first sheet patterns NS1 in the third direction Z, and other inner spacers may be disposed in spaces between two adjacent first sheet patterns among the first sheet patterns NS1 in the third direction Z. Each inner spacer 140_IN may be disposed between the first source/drain pattern 150 and a corresponding inner gate structure of inner gate structures I_GS. The inner gate structures I_GS may not contact the first source/drain pattern 150.

Referring to FIG. 21 and FIG. 22, in a semiconductor device according to some embodiments, the first active pattern AP1 and the second active pattern AP2 does not include a sheet pattern.

The first active pattern AP1 and the second active pattern AP2 may be a fin-shaped pattern protruding upwardly beyond the upper surface of the field insulating film 105. In FIG. 22, the field insulating film 105 may cover a portion of a sidewall of each of the active patterns AP1, AP2, AP3, and AP4. In an embodiment, the fin-shaped pattern may be epitaxially grown from the first surface 100US of the substrate. In an embodiment, the fin-shaped pattern may be formed by partially etching the substrate 100.

The gate structure GS does not include the inner gate structures I_GS.

Figure 23:
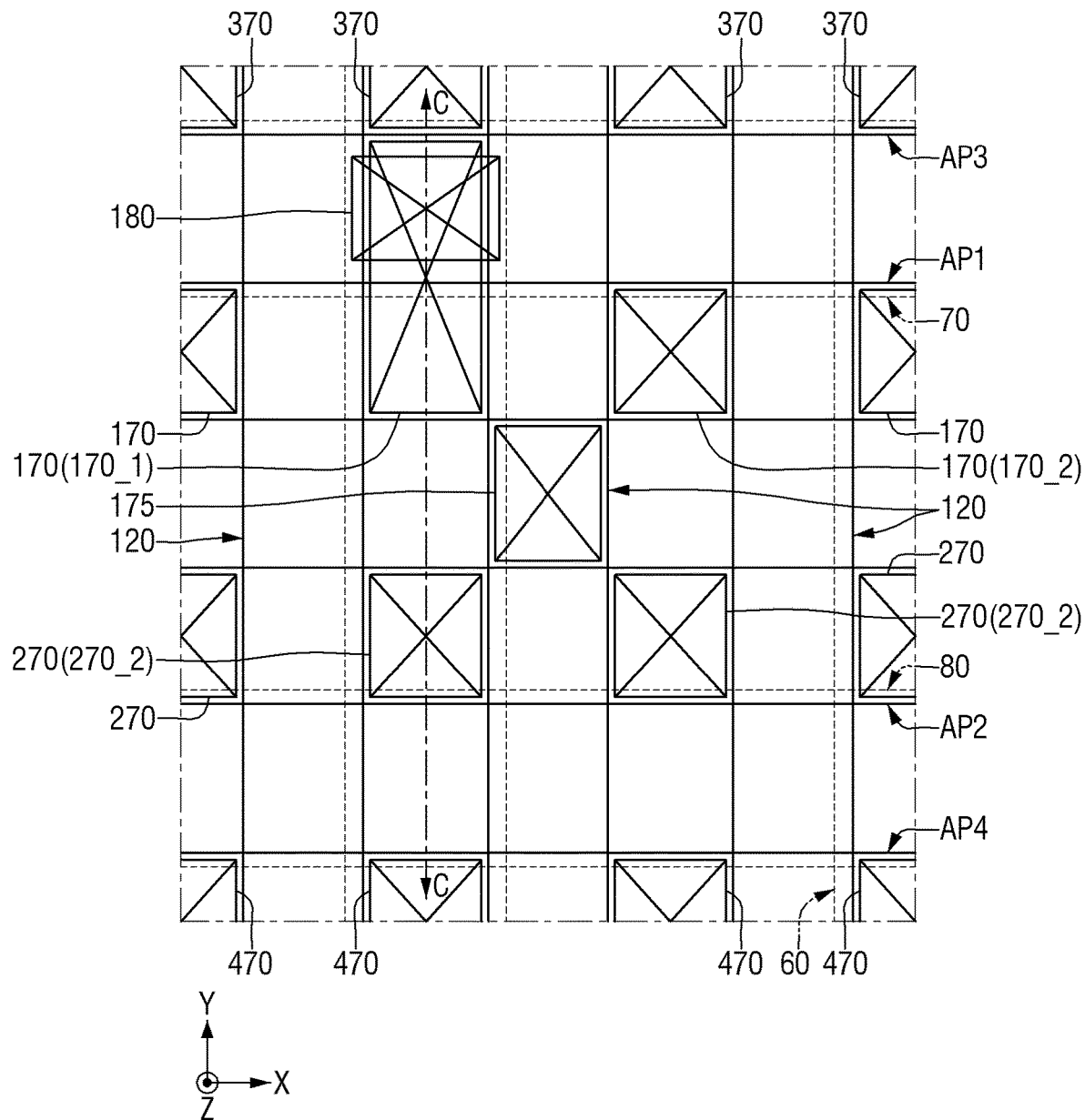
FIG. 23 and FIG. 24 are drawings for illustrating a semiconductor device according to some embodiments.
Figure 24:
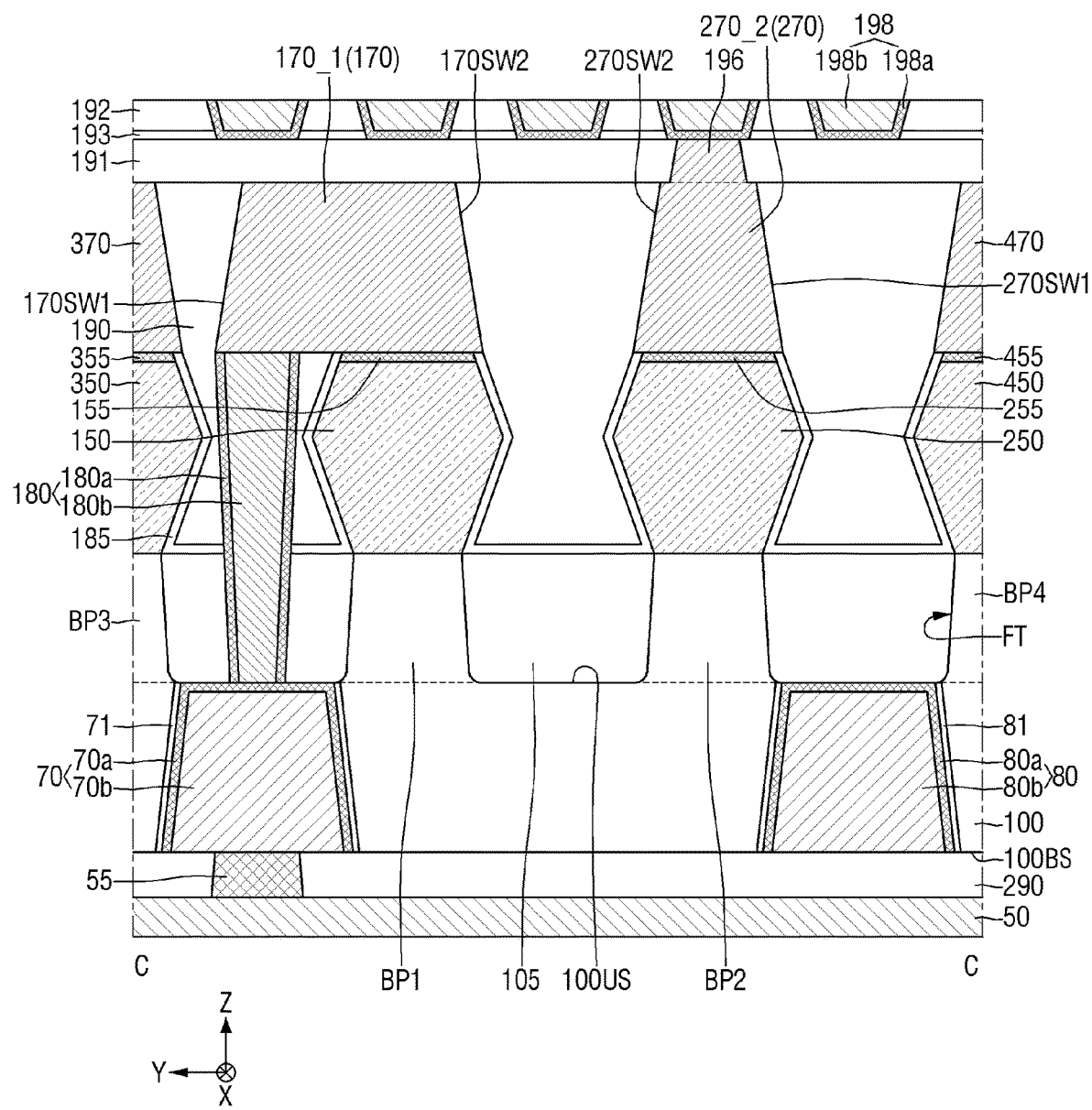
Figure 25:
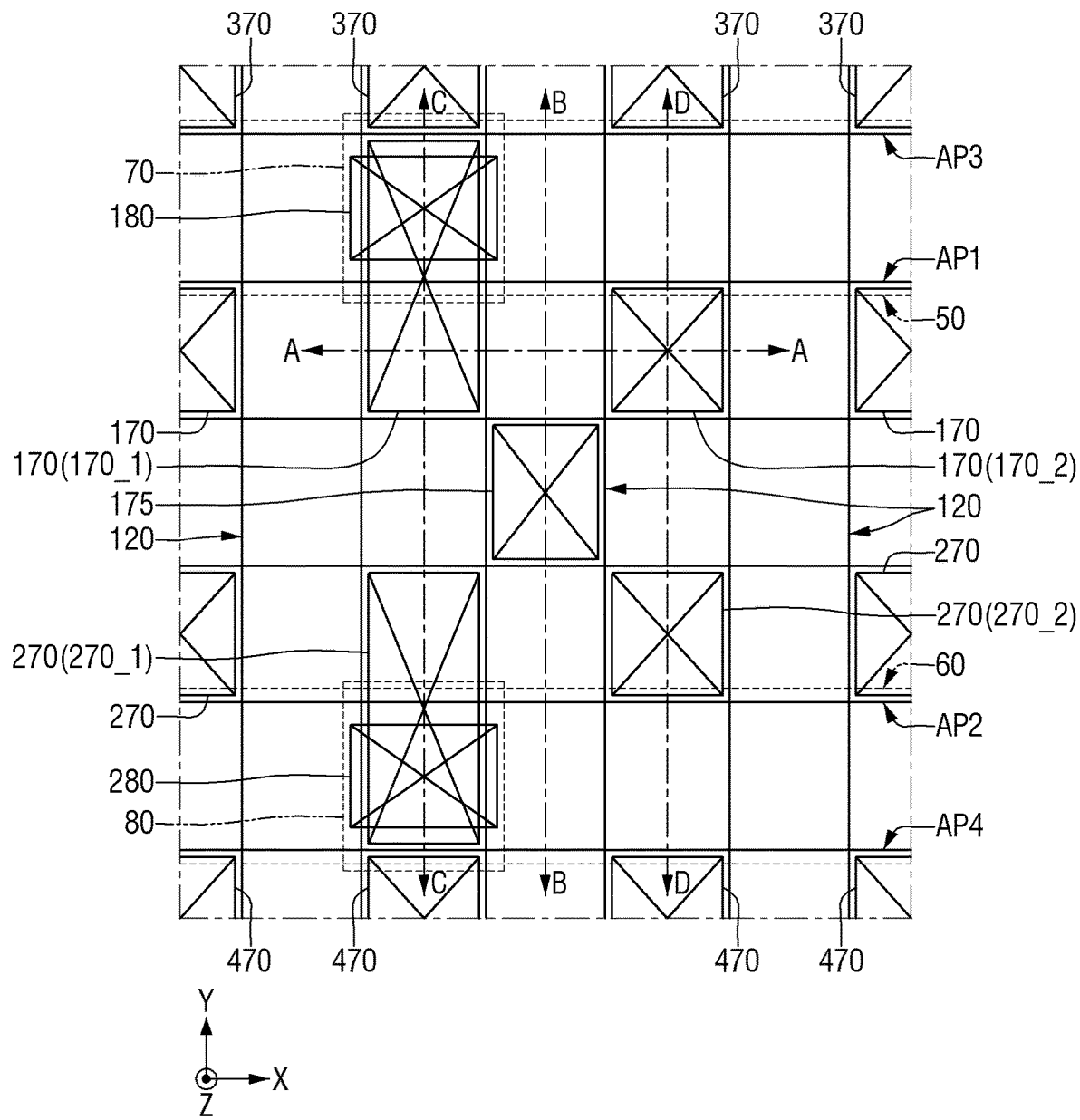
FIG. 25 to FIG. 28 are diagrams for illustrating a semiconductor device according to some embodiments.
Figure 26:
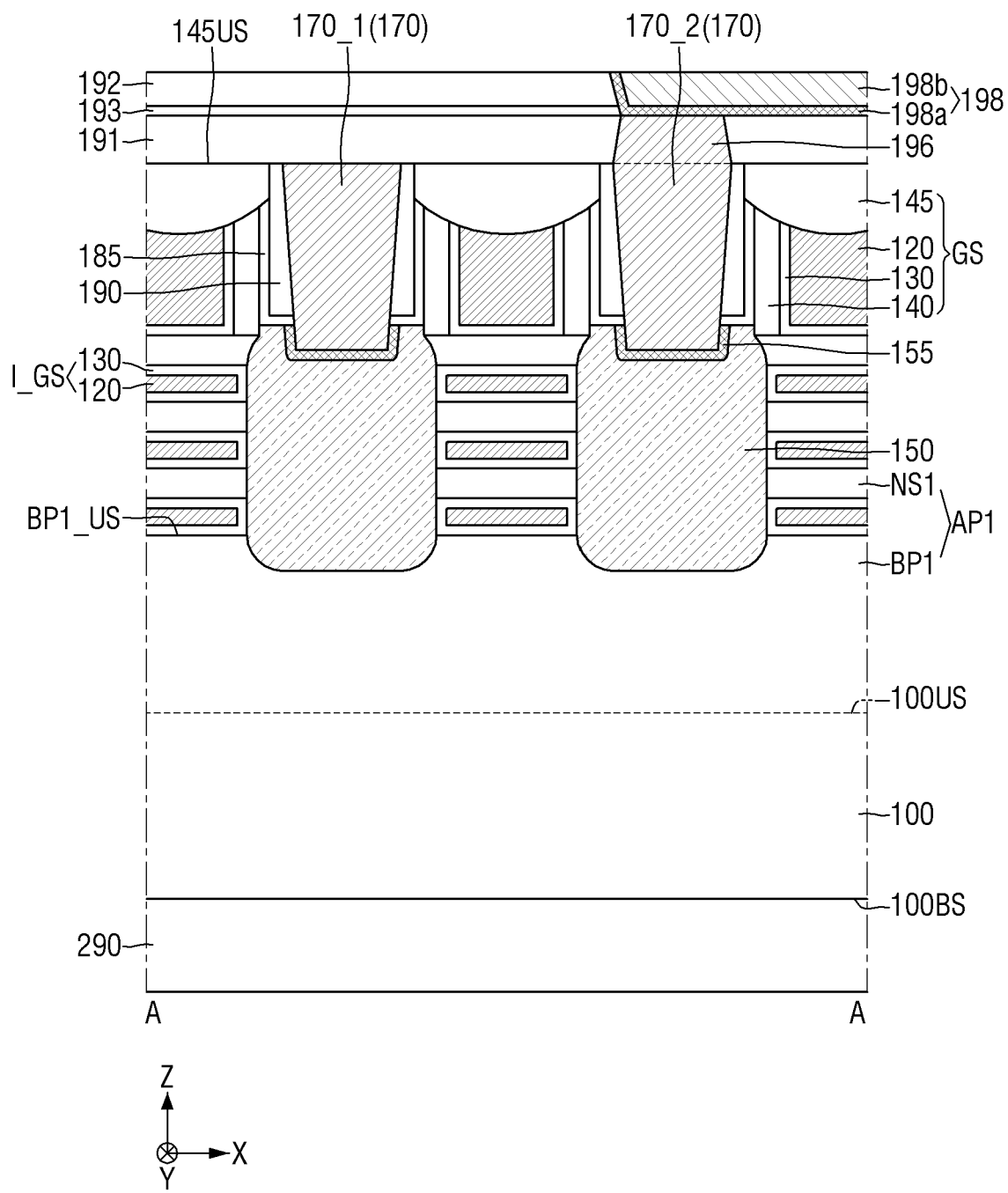

FIG. 23 and FIG. 24 are drawings for illustrating a semiconductor device according to some embodiments. For convenience of descriptions, differences thereof from those as set forth above with reference to FIG. 1 to FIG. 5 will be set forth below.

Referring to FIG. 23 and FIG. 24, in a semiconductor device according to some embodiments, the first back connection contact 170_1 may be adjacent to the second front connection contact 270_2 in the second direction Y.

In FIG. 24, the first source/drain contact 170 among the first source/drain contact 170 and the second source/drain contact 270 that are adjacent to each other in the second direction Y may be connected to the first buried conductive pattern 70 via the first contact connection via 180. However, the second source/drain contact 270 among the first source/drain contact 170 and the second source/drain contact 270 that are adjacent to each other in the second direction Y may not be connected to the second buried conductive pattern 80. The second source/drain contact 270 may be connected to front wiring line 198 via the front wiring via 196.

FIG. 25 to FIG. 28 are diagrams for illustrating a semiconductor device according to some embodiments. For convenience of descriptions, differences thereof from those as set forth above with reference to FIG. 1 to FIG. 5 will be set forth below.

Referring to FIG. 25 to FIG. 28, in the semiconductor device according to some embodiments, the first buried conductive pattern 70 and the second buried conductive pattern 80 may be formed in a contact form.

Figure 27:
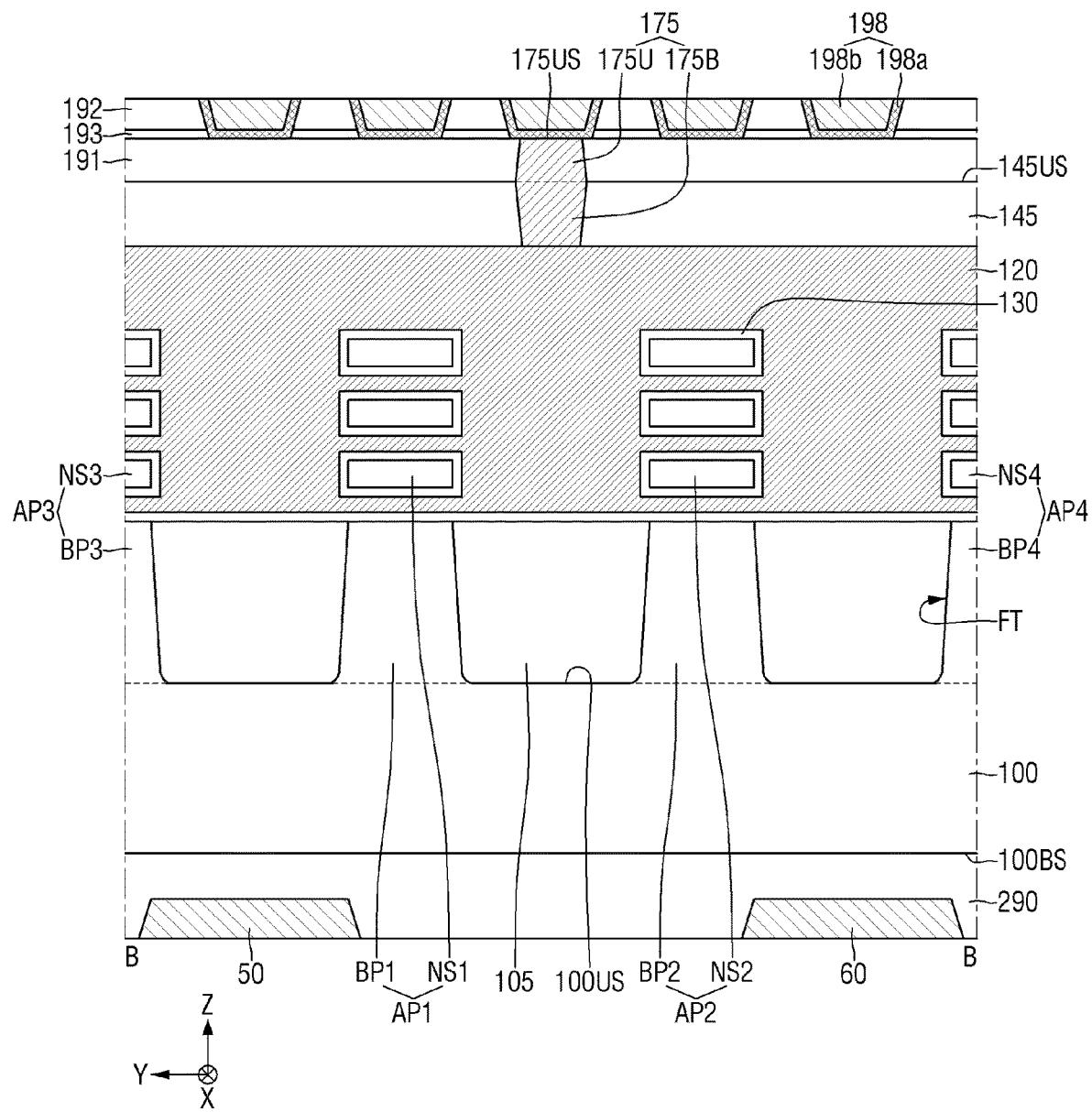
Figure 28:
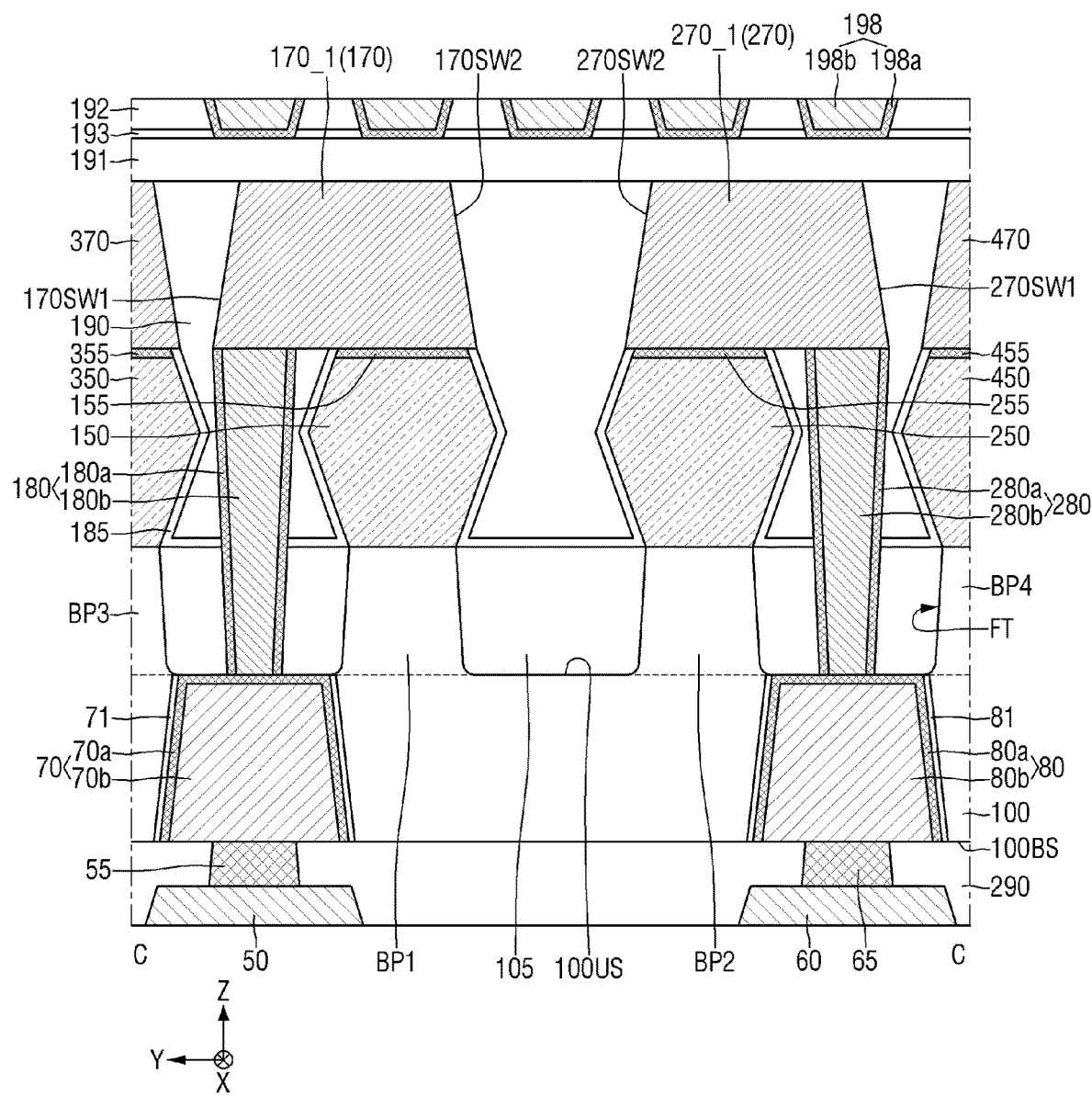

The first buried conductive pattern 70 may be disposed in a space between the first lower pattern BP1 and the third lower pattern BP3 that are adjacent to each other in the second direction Y. The first buried conductive pattern 70 may be disposed between gate electrodes 120 adjacent to each other in the first direction X. In a plan view, the first buried conductive pattern 70 may not intersect with the gate electrode 120. In FIG. 27, the first buried conductive pattern 70 may not be disposed between a portion of the first lower pattern BP1 and a portion of the third lower pattern BP3 disposed under the gate electrode 120.

The second buried conductive pattern 80 may be disposed between the second lower pattern BP2 and the fourth lower pattern BP4 that are adjacent to each other in the second direction Y. The second buried conductive pattern 80 may be disposed between gate electrodes 120 adjacent in the first direction X. In a plan view, the second buried conductive pattern 80 may not intersect with the gate electrode 120. In FIG. 27, the second buried conductive pattern 80 may not be disposed between a portion of the second lower pattern BP2 and a portion of the fourth lower pattern BP4 disposed under the gate electrode 120.

Each of the first back wiring line 50 and the second back wiring line 60 may extend in the first direction X. However, the present disclosure is not limited thereto. The first back wiring line 50 may be connected to the first buried conductive pattern 70 via the first back wiring via 55. The second back wiring line 60 may be connected to the second buried conductive pattern 80 via a second back wiring via 65.

FIG. 29 to FIG. 40 are diagrams of intermediate structures corresponding to intermediate steps for illustrating a method for manufacturing a semiconductor device according to some embodiments.

Figure 29:
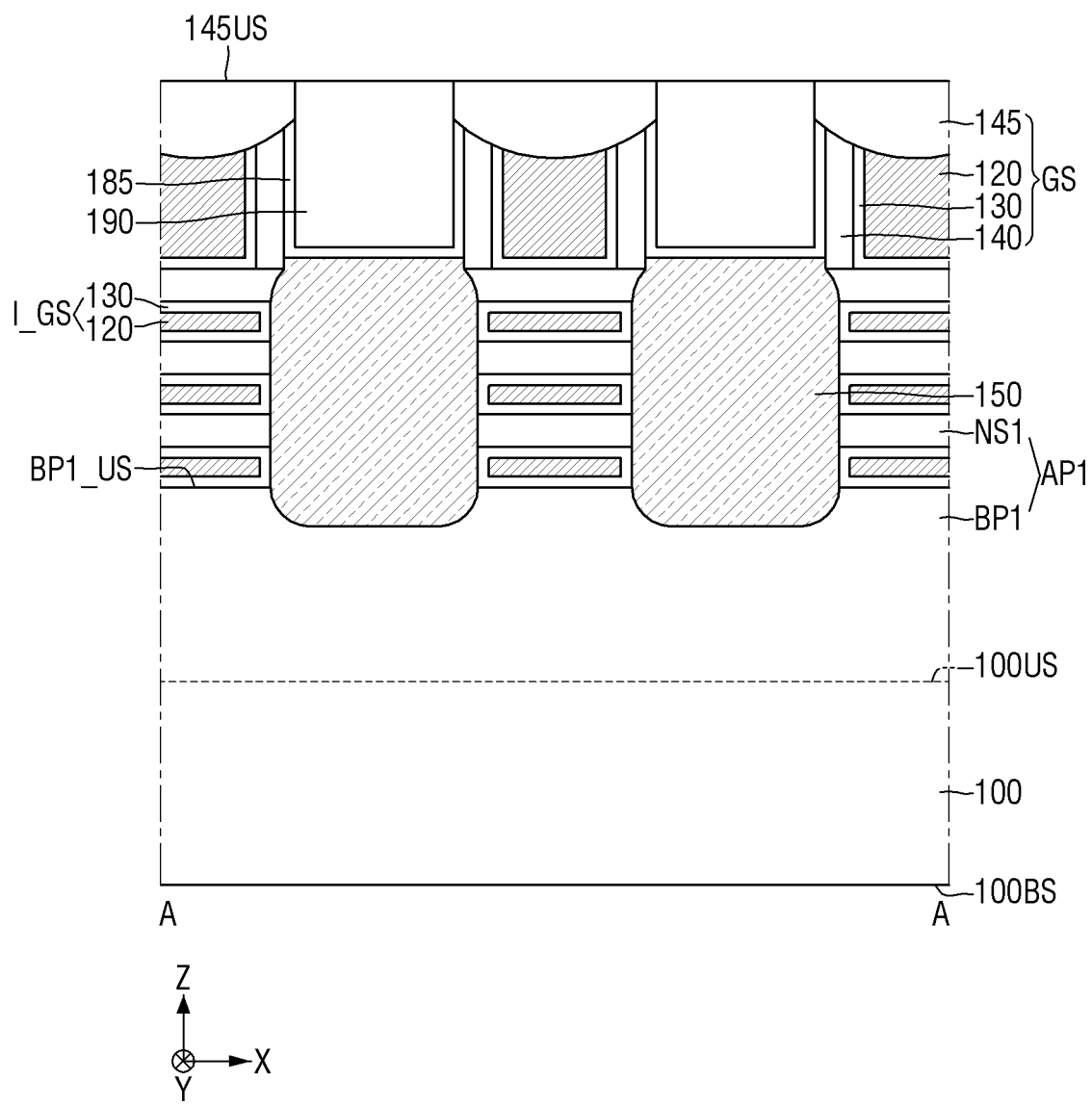
FIG. 29 to FIG. 40 are diagrams of intermediate structures corresponding to intermediate steps for illustrating a method for manufacturing a semiconductor device according to some embodiments.
Figure 30:
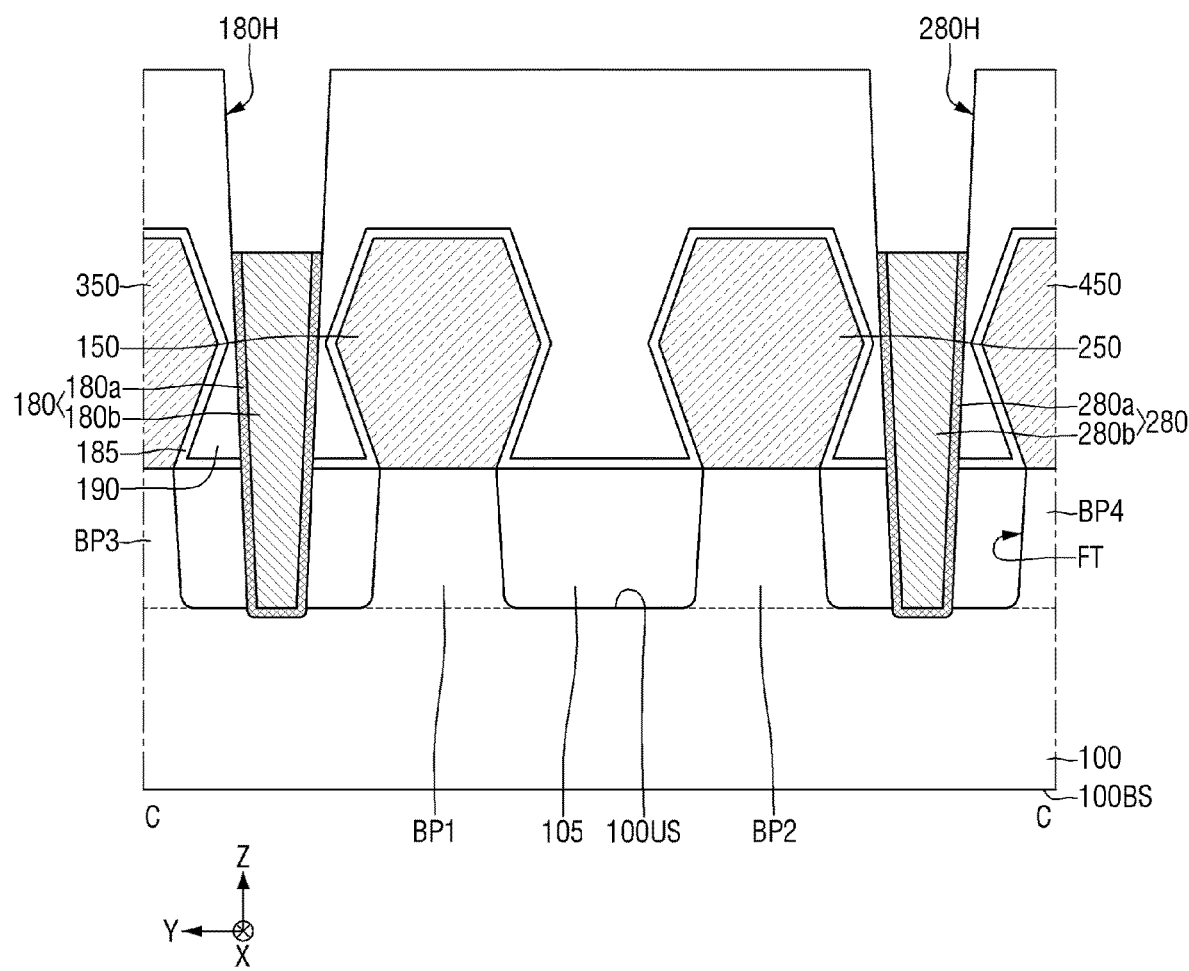

Referring to FIG. 29 and FIG. 30, the source/drain patterns 150, 250, 350, and 450 are respectively formed on the lower patterns BP1, BP2, BP3, and BP4.

Before the source/drain patterns 150, 250, 350, and 450 are formed, the gate spacer 140 may be formed on the first lower pattern BP1. The field insulating film 105 may be formed in a space between adjacent ones of the lower patterns BP1, BP2, BP3, and BP4 that are spaced apart from each other in the second direction Y.

The source/drain etch stop film 185 and the first upper interlayer insulating film 191 are formed on the source/drain patterns 150, 250, 350, and 450. Subsequently, the first sheet patterns NS1 are formed on the first lower pattern BP1. Thus, the first active pattern AP1 is formed on the first surface 100US of the substrate. The substrate 100 includes the first surface 100US and the second surface 100BS opposite in the third direction Z. Although not shown, the second to fourth sheet patterns NS2, NS3, and NS4 may be formed on the second to fourth lower patterns BP2, BP3, and BP4, respectively.

Subsequently, the gate insulating film 130 and the gate electrode 120 surrounding the first sheet patterns NS1 may be formed on the first lower pattern BP1. The gate capping pattern 145 may be formed on the gate electrode 120. Thus, the gate structure GS may be formed on the first active pattern AP1. The height from the upper surface of the first active pattern AP1 to the upper surface 145US of the gate capping pattern may be equal to the height from the upper surface of the first active pattern AP1 to the upper surface of the first upper interlayer insulating film 190.

Subsequently, a first contact connection via hole 180H and a second contact connection via hole 280H may be formed so as extend through the first upper interlayer insulating film 190 and the field insulating film 105. The first contact connection via 180 may be formed in the first contact connection via hole 180H. The first contact connection via 180 may fill a portion of the first contact connection via hole 180H. The second contact connection via 280 may be formed in the second contact connection via hole 280H. The second contact connection via 280 may fill a portion of the second contact connection via hole 280H.

Figure 31:
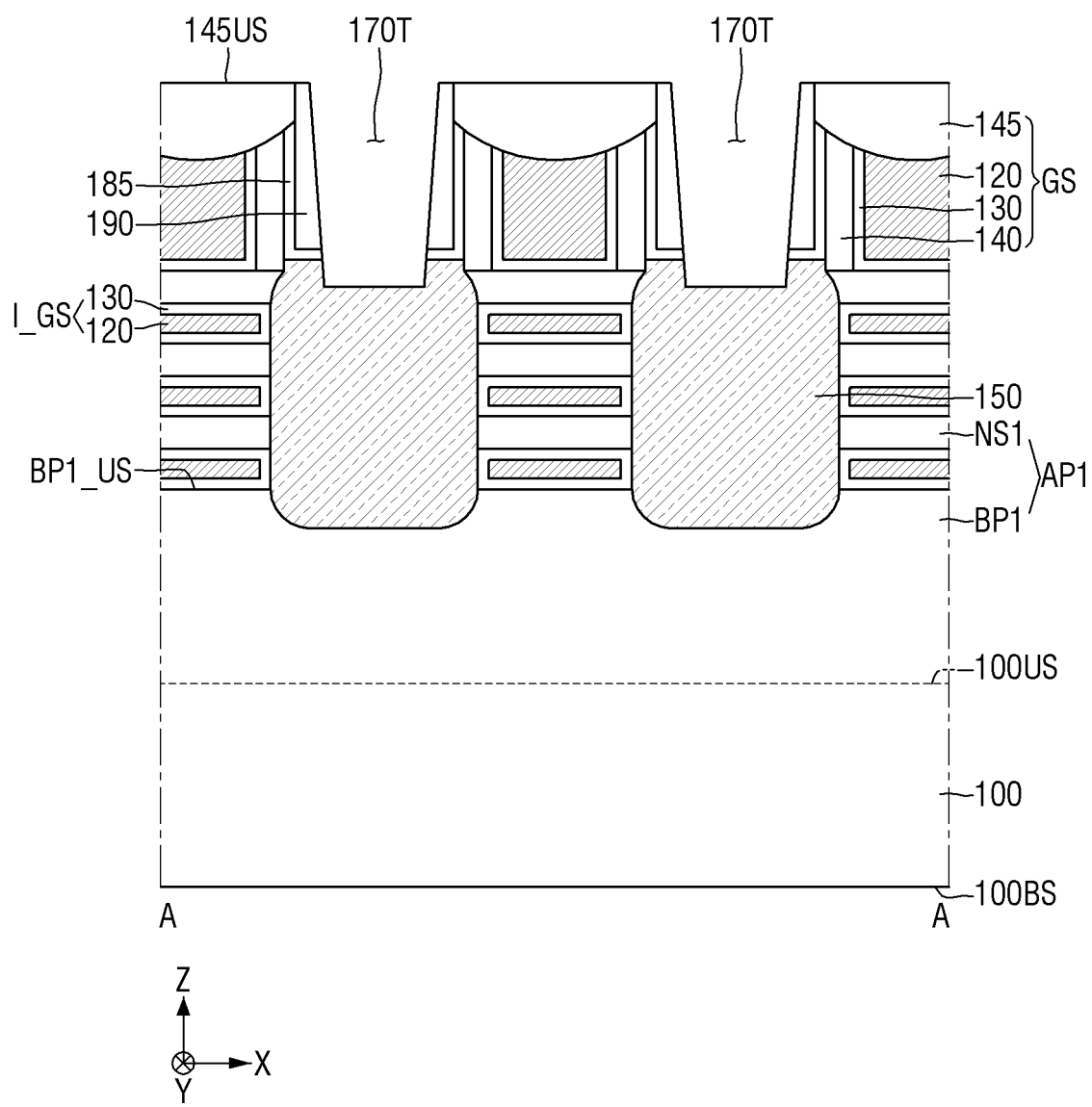
Figure 32:
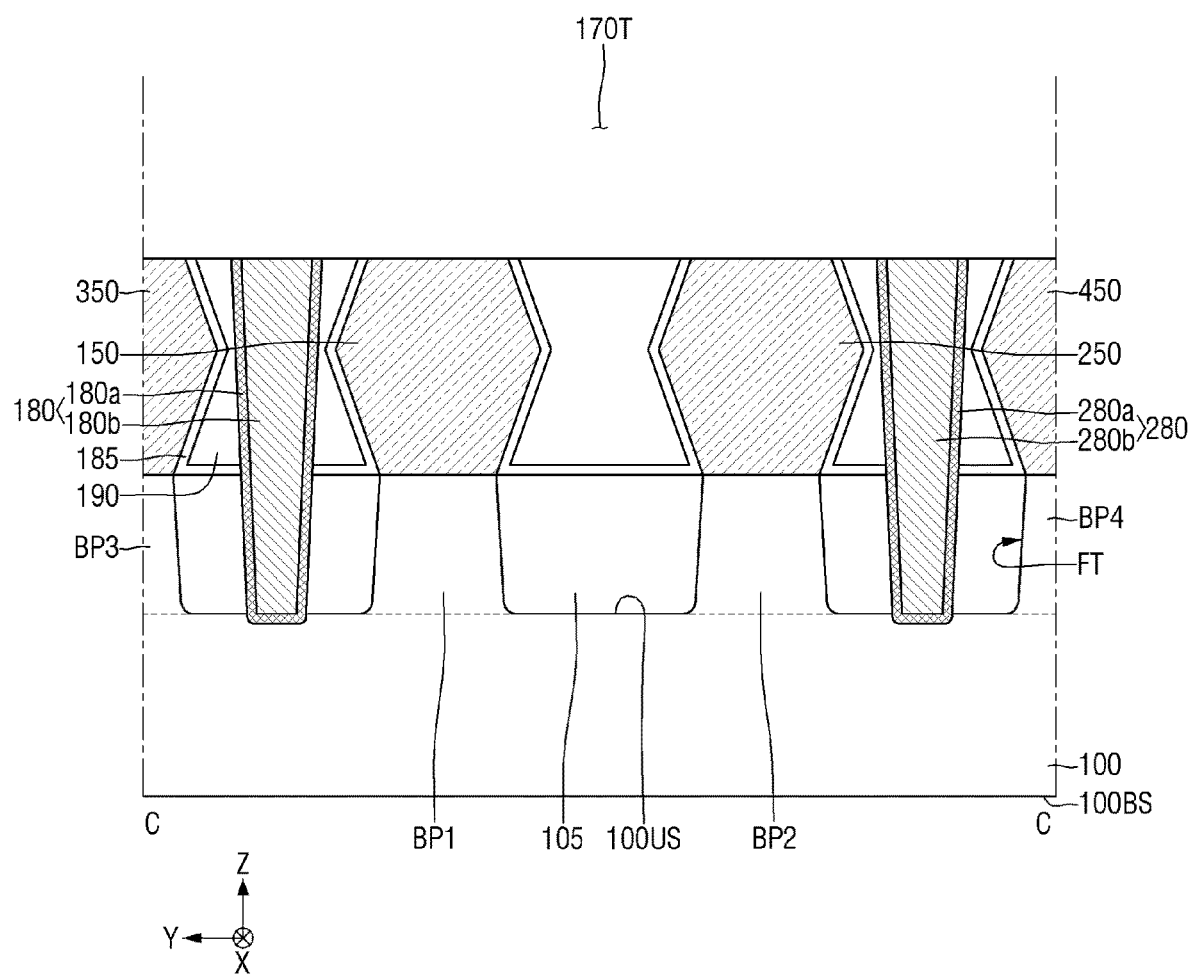

Referring to FIG. 31 and FIG. 32, a contact trench 170T may be formed in the first upper interlayer insulating film 190.

The contact trench 170T may extend in an elongated manner in the second direction Y or may extend lengthwise in the second direction Y. The contact trench 170T may expose the first contact connection via 180 and the second contact connection via 280. The contact trench 170T may expose the source/drain patterns 150, 250, 350, and 450.

Figure 33:
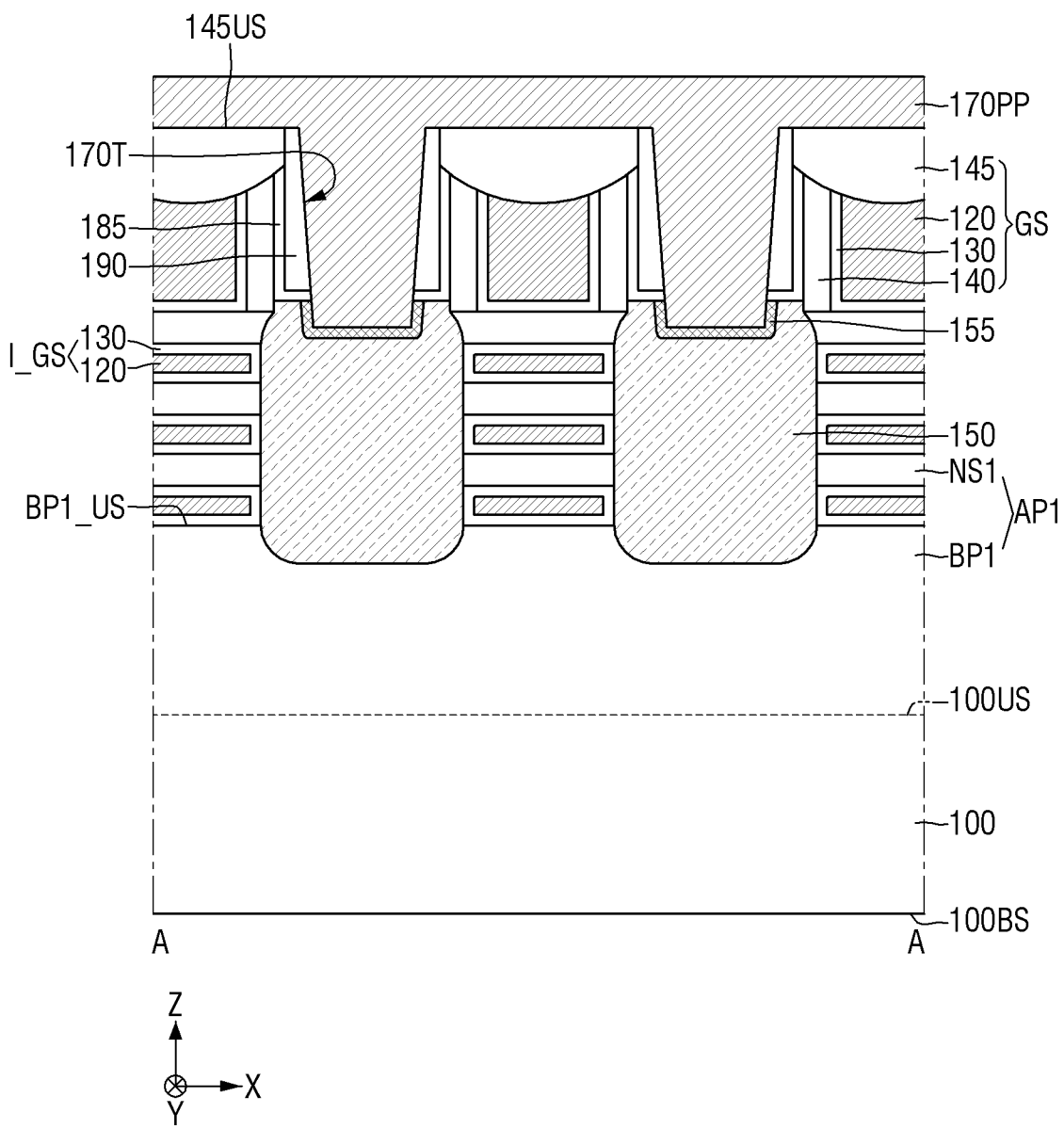
Figure 34:
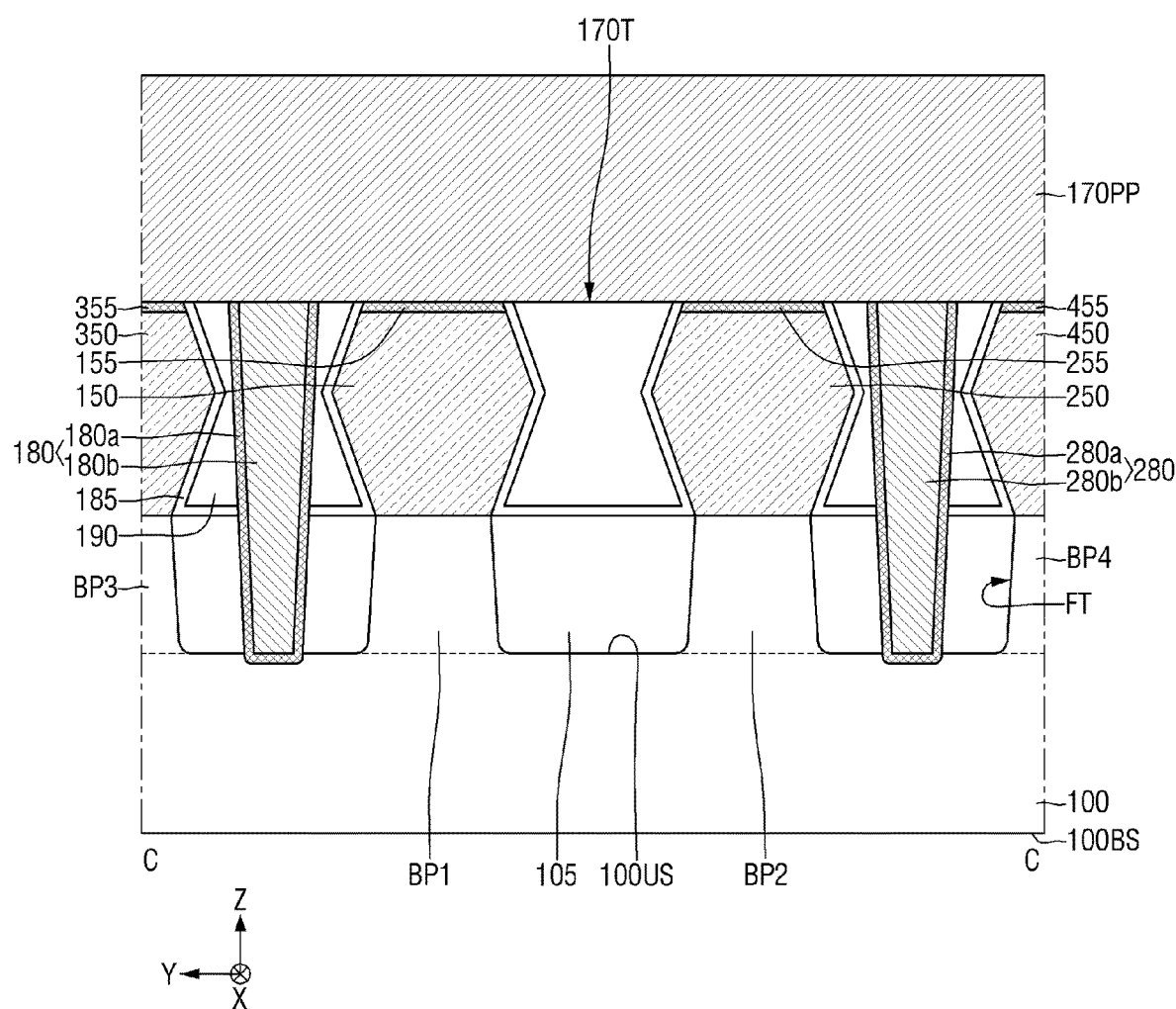
Figure 35:
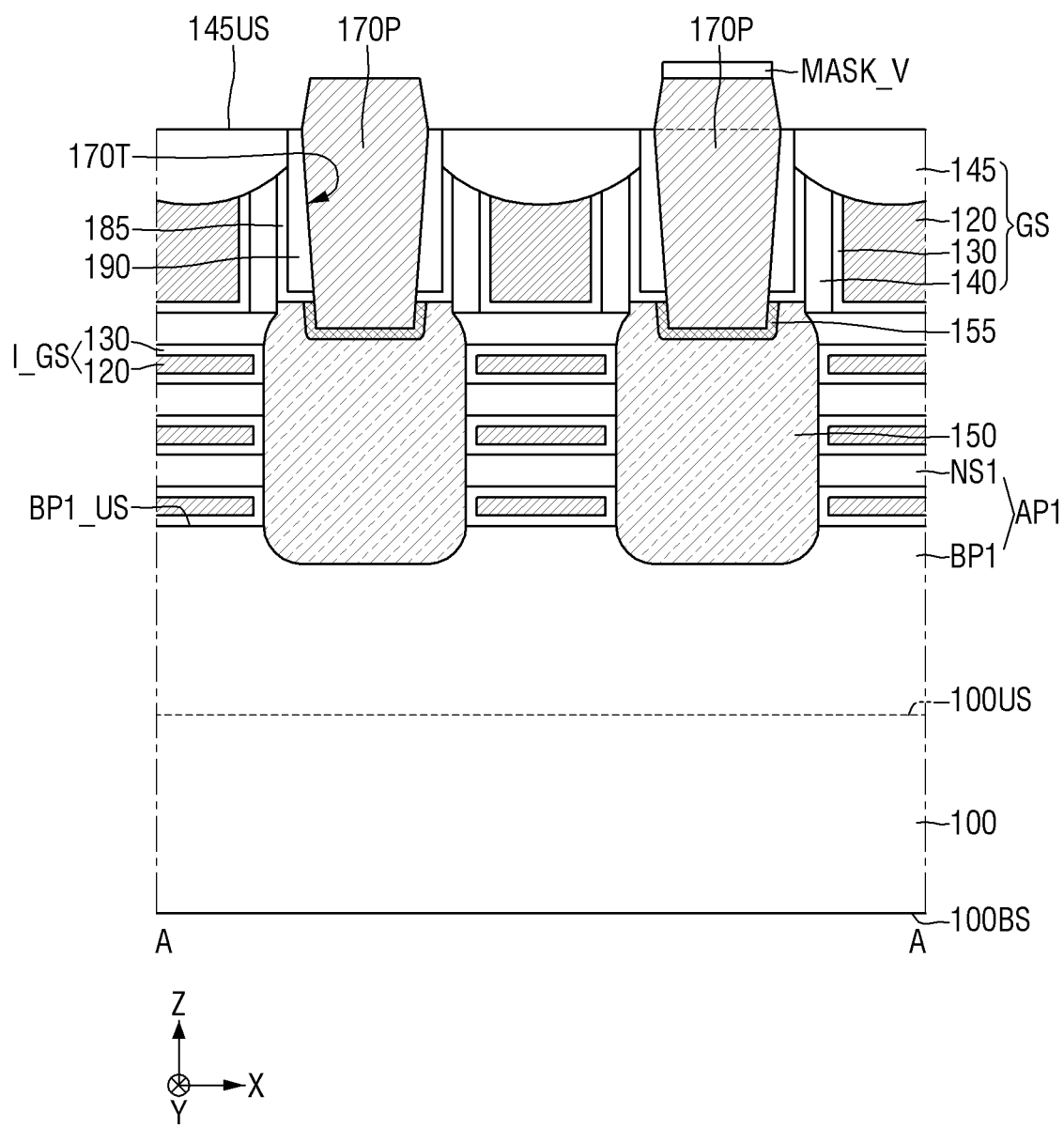
Figure 36:
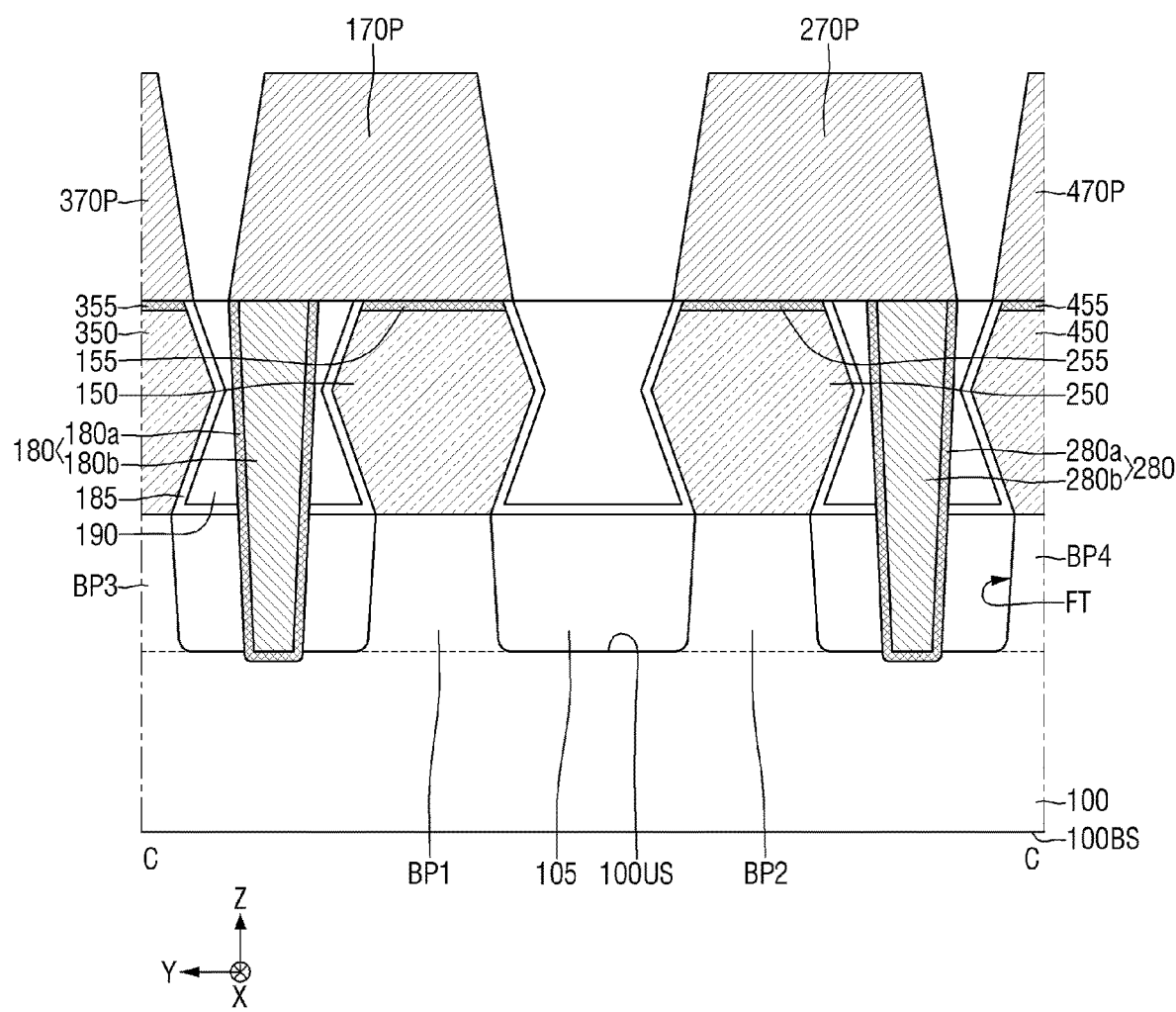
Figure 37:
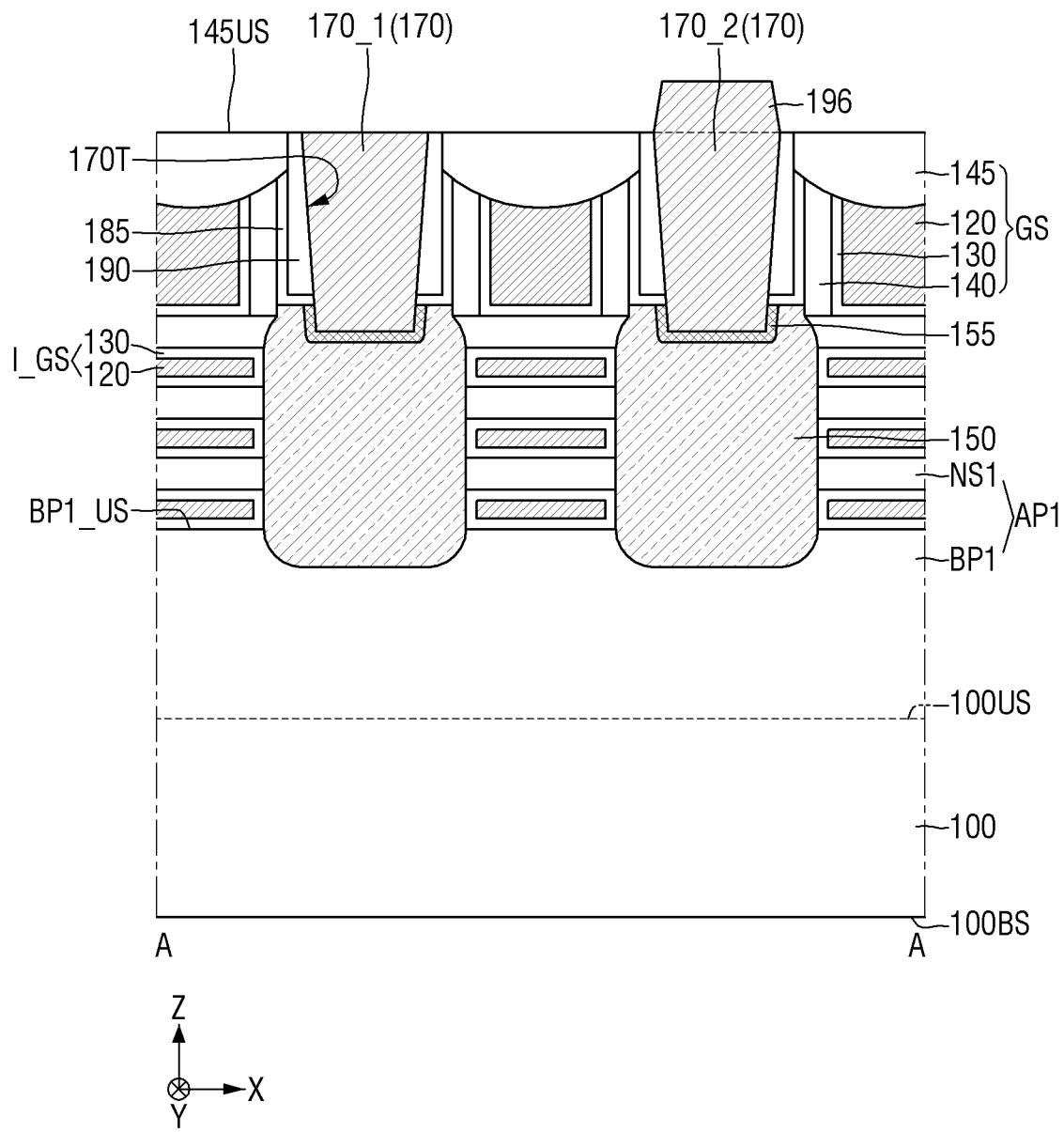
Figure 38:
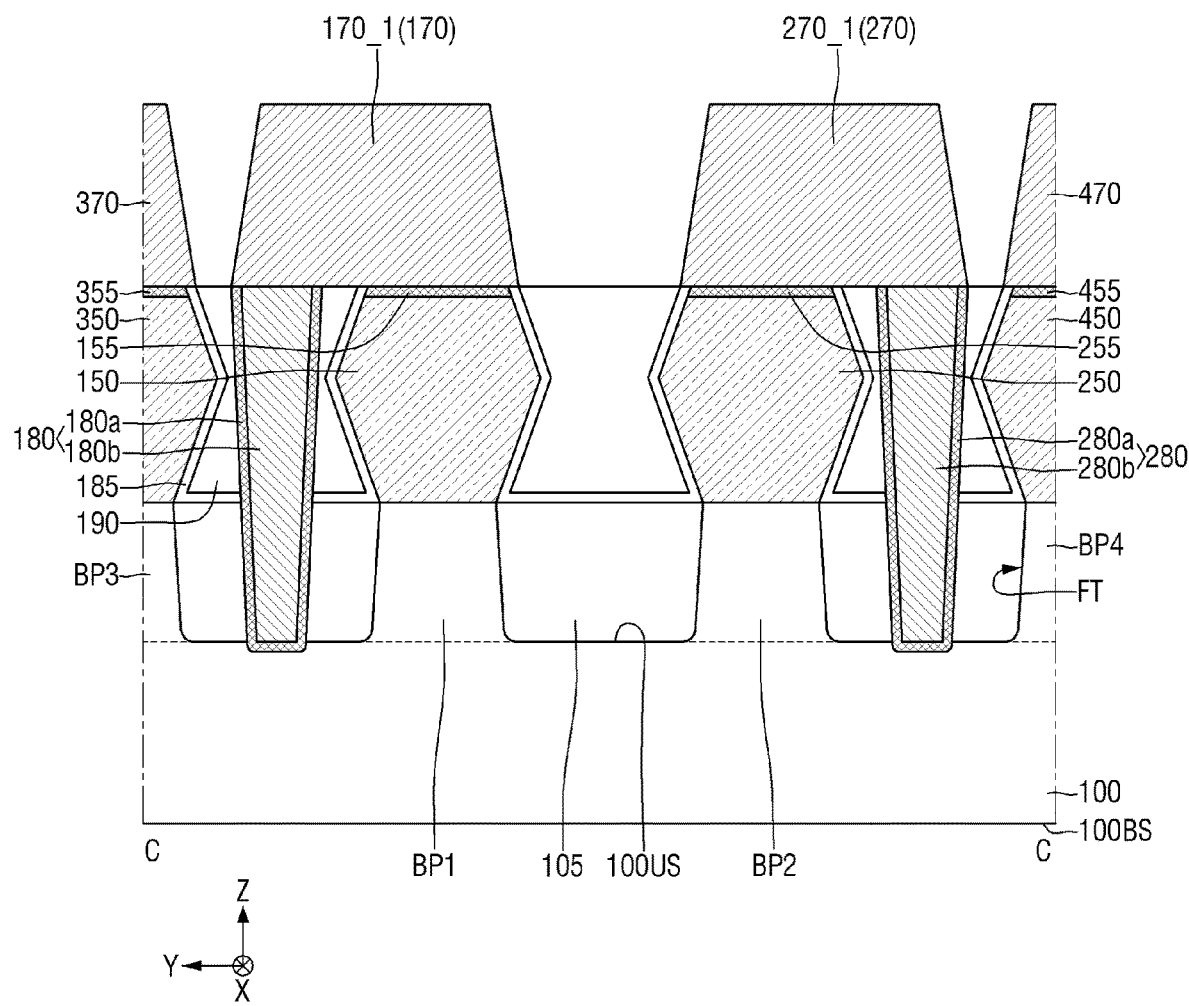

Referring to FIG. 33 and FIG. 34, a contact conductive film 170PP may fill the contact trench 170T.

The contact conductive film 170PP may be formed on the upper surface of the first upper interlayer insulating film 190 and the upper surface 145US of the gate capping pattern.

The contact silicide films 155, 255, 355, and 455 may be formed between the contact conductive film 170PP and each of the source/drain patterns 150, 250, 350, and 450.

Referring to FIG. 33 to FIG. 36, the first pre-source/drain contact 170P may be formed on the first source/drain pattern 150.

A second pre-source/drain contact 270P may be formed on the second source/drain pattern 250. A third pre-source/drain contact 370P may be formed on the third source/drain pattern 350. A fourth pre-source/drain contact 470P may be formed on the fourth source/drain pattern 450.

The pre-source/drain contacts 170P, 270P, 370P, and 470P may be formed by patterning the contact conductive film 170PP. A portion of each of the pre-source/drain contacts 170P, 270P, 370P, and 470P may protrude in the third direction Z beyond the upper surface 145US of the gate capping pattern.

For example, a via mask pattern MASK_V may be formed on the first pre-source/drain contact 170P.

More specifically, although not shown, a contact mask pattern may be formed on the contact conductive film 170PP. Using the contact mask pattern as an etching mask, the contact conductive film 170PP may be patterned. Thus, the pre-source/drain contacts 170P, 270P, 370P, and 470P may be formed.

In one example, before the contact mask pattern is formed, the via mask pattern MASK_V may be formed on the contact conductive film 170PP. In this case, the contact mask pattern may be formed on the via mask pattern MASK_V.

In another example, after the pre-source/drain contacts 170P, 270P, 370P, and 470P are formed, the via mask pattern MASK_V may be formed. After the pre-source/drain contacts 170P, 270P, 370P, and 470P are formed, the contact mask pattern may be removed. Subsequently, the via mask pattern MASK_V may be formed on the pre-source/drain contacts 170P, 270P, 370P, and 470P.

Referring to FIG. 35 to FIG. 38, the front wiring via 196 may be formed by performing an etching process using the via mask pattern MASK_V as an etching mask.

The front wiring via 196 may be formed at a position corresponding to a position of the via mask pattern MASK_V.

During a time when the front wiring via 196 is being formed, a portion of each of the pre-source/drain contacts 170P, 270P, 370P, and 470P in an area which the via mask pattern MASK_V is not formed may be removed. During a time when the front wiring via 196 is being formed, the source/drain contacts 170, 270, 370, and 470 may be formed.

Referring to FIG. 37 to FIG. 40, the first upper interlayer insulating film 190 covering the sidewall of the source/drain contact 170, 270, 370, and 470 may be formed.

The second upper interlayer insulating film 191 covering the sidewall of the front wiring via 196 may be formed on the first upper interlayer insulating film 190. In one example, the first upper interlayer insulating film 190 and the second upper interlayer insulating film 191 may be formed at the same time.

Figure 39:
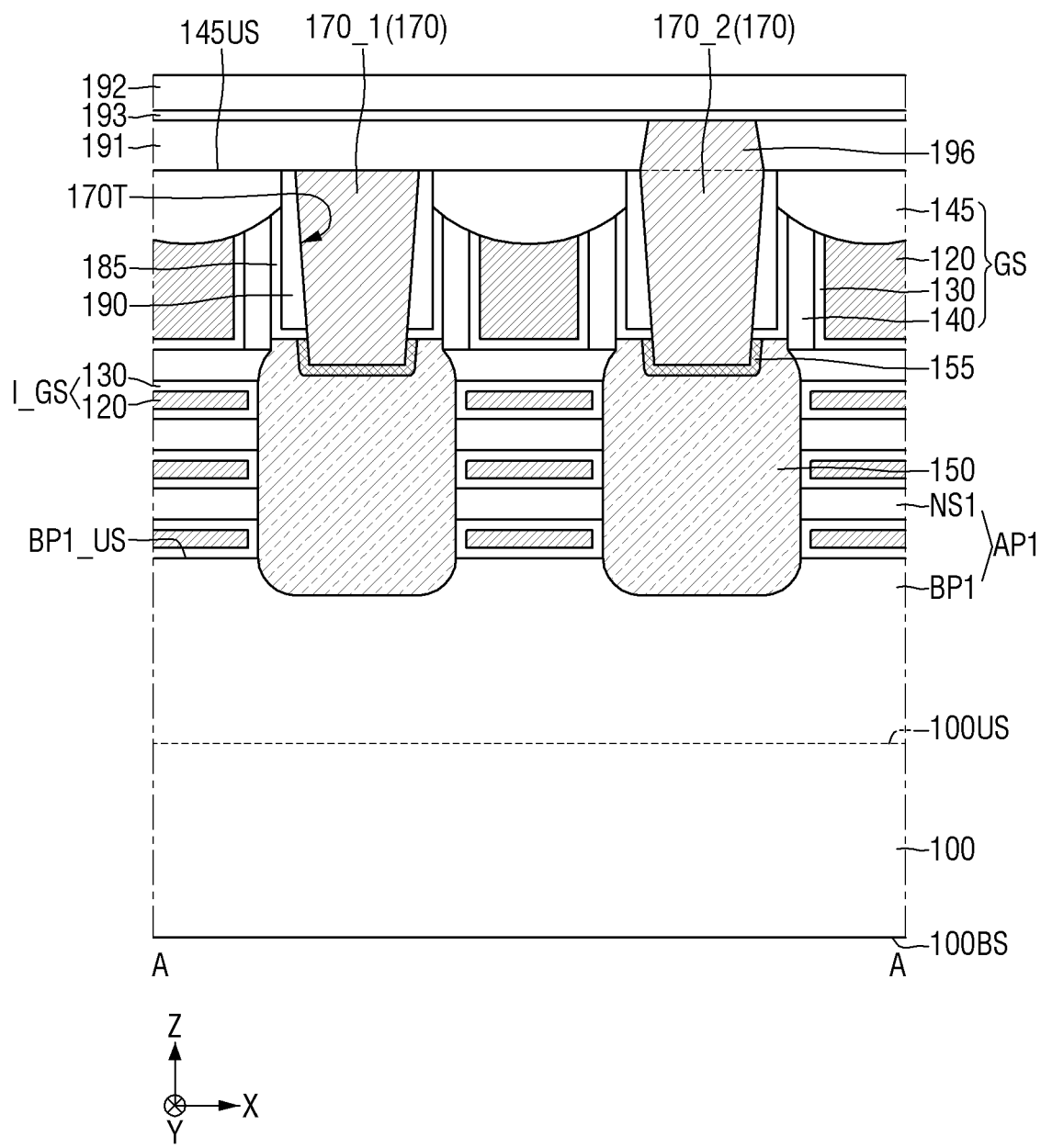
Figure 40:
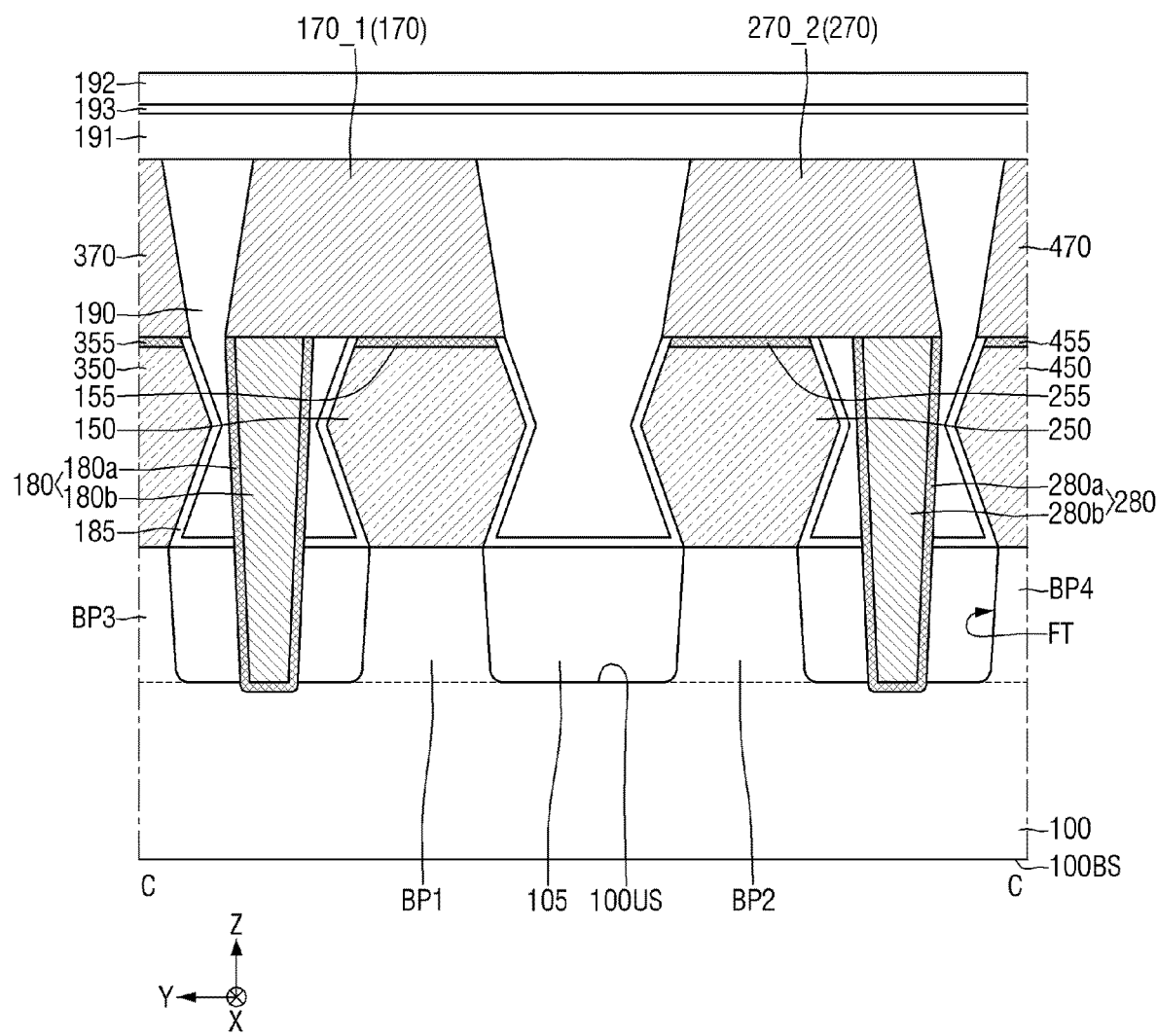

The first upper interlayer insulating film 190 in FIG. 4 and FIG. 5 may include a portion of the first upper interlayer insulating film 190 formed in FIG. 29 to FIG. 30, and a portion of the first upper interlayer insulating film 190 formed in FIG. 39 to FIG. 40.

The upper etch stop film 193 and the third upper interlayer insulating film 192 may be sequentially formed on the second upper interlayer insulating film 191 and the front wiring via 196.

In FIG. 2 and FIG. 4, the front wiring line 198 may be formed in the upper etch stop film 193 and the third upper interlayer insulating film 192.

After the front wiring line 198 has been formed, the first buried conductive pattern 70 and the second buried conductive pattern 80 extending through the substrate 100 may be formed. During a time when the first buried conductive pattern 70 and the second buried conductive pattern 80 are being formed, a portion of the first contact connection barrier film 180a formed on the bottom surface of the first contact connection plug 180b may be removed.

Subsequently, the first back wiring line 50 and the second back wiring line 60 that are respectively connected to the first buried conductive pattern 70 and the second buried conductive pattern 80 may be formed.

In concluding the detailed description, those skilled in the art will appreciate that many variations and modifications may be made to the preferred embodiments without substantially departing from the principles of the present inventive concept. Therefore, the disclosed preferred embodiments of the invention are used in a generic and descriptive sense only and not for purposes of limitation.

What is claimed is:

1. A semiconductor device comprising:
   a substrate including a first surface and a second surface opposite to each other in a vertical direction that is perpendicular to the first surface;
   a first fin-shaped pattern provided at the first surface of the substrate and extending in a first horizontal direction that is parallel to the first surface;
   a first source/drain pattern disposed on the first fin-shaped pattern and connected to the first fin-shaped pattern;
   a first source/drain contact disposed on the first source/drain pattern and connected to the first source/drain pattern;
   a buried conductive pattern extending through the substrate and connected to the first source/drain contact;
   a contact connection via disposed between the first source/drain contact and the buried conductive pattern, wherein the contact connection via is directly connected to the first source/drain contact; and
   a back wiring line disposed on the second surface of the substrate and connected to the buried conductive pattern,
   wherein a width in a second horizontal direction of the contact connection via increases as the contact connection via extends away from the second surface of the substrate,
   wherein the second horizontal direction is parallel to the first surface and different from the first horizontal direction, and
   wherein a width in the second horizontal direction of the first source/drain contact decreases as the first source/drain contact extends away from the second surface of the substrate.

2. The semiconductor device of claim 1,
   wherein the first source/drain contact has a single film structure, and
   wherein the contact connection via includes multiple films.

3. The semiconductor device of claim 2,
   wherein the contact connection via includes a contact connection plug and a contact connection barrier film extending along a sidewall of the contact connection plug,
   wherein the first source/drain contact is directly connected to the contact connection plug, and
   wherein the contact connection plug includes the same material as a material of the first source/drain contact.

4. The semiconductor device of claim 2,
   wherein the contact connection via includes a contact connection plug and a contact connection barrier film extending along a sidewall of the contact connection plug,
   wherein the first source/drain contact is directly connected to the contact connection plug, and
   wherein the contact connection plug includes a material different from a material of the first source/drain contact.

5. The semiconductor device of claim 1,
   wherein each of the first source/drain contact and the contact connection via includes multiple films.

6. The semiconductor device of claim 5,
   wherein the contact connection via includes a contact connection plug and a contact connection barrier film extending along a sidewall of the contact connection plug,
   wherein the first source/drain contact includes a source/drain contact plug and a source/drain contact capping film extending along a sidewall of the source/drain contact plug, and
   wherein the source/drain contact plug is directly connected to the contact connection plug.

7. The semiconductor device of claim 1, further comprising:
   a front wiring line disposed on the first surface of the substrate; and
   a front wiring via connecting the front wiring line and the first source/drain contact with each other,
   wherein the front wiring via is directly connected to the first source/drain contact, and
   wherein a width in the second horizontal direction of the front wiring via decreases as the front wiring via extends away from the second surface of the substrate.

8. The semiconductor device of claim 7,
   wherein each of the first source/drain pattern and the front wiring via has a single film structure.

9. The semiconductor device of claim 1, further comprising:
   a second fin-shaped pattern provided at the first surface of the substrate in the vertical direction and adjacent to the first fin-shaped pattern in the second horizontal direction;
   a second source/drain pattern disposed on the second fin-shaped pattern and connected to the second fin-shaped pattern;
   a second source/drain contact disposed on the second source/drain pattern and connected to the second source/drain pattern;
   a front wiring line disposed on the first surface of the substrate; and
   a front wiring via connecting the front wiring line and the second source/drain contact to each other,
   wherein each of a width in the second horizontal direction of the second source/drain contact and a width in the second horizontal direction of the front wiring via decreases as each of the second source/drain contact and the front wiring via extends away from the second surface of the substrate.

10. The semiconductor device of claim 9,
    wherein the first source/drain contact is not connected to the front wiring line.

11. A semiconductor device comprising:
    a substrate including a first surface and a second surface opposite to each other in a vertical direction that is perpendicular to the first surface;
    a first fin-shaped pattern provided at the first surface of the substrate and extending in a first horizontal direction that is parallel to the first surface;
    a second fin-shaped pattern provided at the first surface of the substrate and adjacent to the first fin-shaped pattern in a second horizontal direction that is parallel to the first surface and different from the first horizontal direction;

a first source/drain pattern disposed on the first fin-shaped pattern and connected to the first fin-shaped pattern;

a second source/drain pattern disposed on the second fin-shaped pattern and connected to the second fin-shaped pattern;

a first source/drain contact disposed on the first source/drain pattern and connected to the first source/drain pattern;

a second source/drain contact disposed on the second source/drain pattern and connected to the second source/drain pattern, wherein the first source/drain contact and the second source/drain contact are spaced apart from each other in the second horizontal direction;

a buried conductive pattern extending through the substrate and connected to the first source/drain contact;

a contact connection via disposed between the first source/drain contact and the buried conductive pattern and directly connected to the first source/drain contact; and a back wiring line disposed on the second surface of the substrate and connected to the buried conductive pattern, wherein each of the first source/drain contact and the second source/drain contact includes a first sidewall and a second sidewall opposite to each other in the second horizontal direction, wherein the first sidewall of the second source/drain contact faces the first sidewall of the first source/drain contact, and wherein a distance between the first sidewall of the first source/drain contact and the first sidewall of the second source/drain contact increases as each of the first source/drain contact and the second source/drain contact extends away from the second surface of the substrate.

12. The semiconductor device of claim 11,
wherein each of a width in the second horizontal direction of the first source/drain contact and a width in the second horizontal direction of the second source/drain contact decreases as each of the first source/drain contact and the second source/drain contact extends away from the second surface of the substrate.

13. The semiconductor device of claim 11,
wherein a width in the second horizontal direction of the contact connection via increases as the contact connection via extends away from the second surface of the substrate.

14. The semiconductor device of claim 11, further comprising:
a front wiring line disposed on the first surface of the substrate; and
a front wiring via connecting the front wiring line and the second source/drain contact with each other,
wherein a width in the second horizontal direction of the front wiring via decreases as the front wiring via extends away from the second surface of the substrate.

15. The semiconductor device of claim 11,
wherein each of the first source/drain contact and the second source/drain contact has a single film structure,
wherein the contact connection via includes multiple films.

16. The semiconductor device of claim 11,
wherein the contact connection via includes a contact connection plug and a contact connection barrier film extending along a sidewall of the contact connection plug,
wherein the first source/drain contact includes a source/drain contact plug and a source/drain contact capping film extending along a sidewall of the source/drain contact plug, and
wherein the source/drain contact plug is directly connected to the contact connection plug.

17. The semiconductor device of claim 11,
wherein the contact connection via includes a contact connection plug and a contact connection barrier film extending along a sidewall of the contact connection plug,
wherein the first source/drain contact includes a source/drain contact plug, and a source/drain barrier film disposed between the source/drain contact plug and the first source/drain pattern, and
wherein the source/drain contact plug is directly connected to the contact connection plug.

18. A semiconductor device comprising:
a substrate including a first surface and a second surface opposite to each other in a vertical direction that is perpendicular to the first surface;
a fin-shaped pattern provided at the first surface of the substrate and extending in a first horizontal direction that is parallel to the first surface;
a plurality of sheet active patterns disposed on the fin-shaped pattern;
a gate structure disposed on the fin-shaped pattern, and extending in a second horizontal direction that is parallel to the first surface and different from the first horizontal direction, wherein the gate structure includes a gate electrode and a gate capping pattern, and wherein the gate electrode surrounds each of the plurality of sheet active patterns;
a source/drain pattern disposed on the fin-shaped pattern, and connected to the fin-shaped pattern and the plurality of sheet active patterns;
a source/drain contact disposed on the source/drain pattern and connected to the source/drain pattern;
a front wiring line disposed on the first surface of the substrate;
a gate contact disposed on the gate electrode and connecting the front wiring line and the gate electrode with each other;
a buried conductive pattern extending through the substrate and connected to the source/drain contact;
a contact connection via disposed between the source/drain contact and the buried conductive pattern and directly connected to the source/drain contact; and
a back wiring line disposed on the second surface of the substrate and connected to the buried conductive pattern,
wherein a width in the second horizontal direction of the contact connection via increases as the contact connection via extends away from the second surface of the substrate,
wherein a width in the second horizontal direction of the source/drain contact decreases as the source/drain contact extends away from the second surface of the substrate, and
wherein a height from the second surface of the substrate to an upper surface of the gate contact is larger than a height from the second surface of the substrate to an upper surface of the gate capping pattern.

19. The semiconductor device of claim 18,
wherein a width in the second horizontal direction of the gate contact increases as the gate contact extends away from the gate electrode.

20. The semiconductor device of claim 18,
wherein the gate contact includes a lower portion disposed in the gate capping pattern, and an upper portion protruding in the vertical direction from the upper surface of the gate capping pattern,
wherein a width in the second horizontal direction of the lower portion of the gate contact increases as the lower portion extends away from the gate electrode, and
wherein a width in the second horizontal direction of the upper portion of the gate contact decreases as the upper portion extends away from the gate electrode.

* * * * *